US008952721B2

(12) United States Patent
Ishiguro et al.

(10) Patent No.: US 8,952,721 B2
(45) Date of Patent: Feb. 10, 2015

(54) SEMICONDUCTOR DEVICE

(75) Inventors: Takashi Ishiguro, Tokyo (JP);
Masayuki Sato, Tokyo (JP); Tetsuo Hironaka, Hiroshima (JP); Hitoshi Shimazaki, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 212 days.

(21) Appl. No.: 13/805,287

(22) PCT Filed: Jun. 13, 2011

(86) PCT No.: PCT/JP2011/063461
§ 371 (c)(1),
(2), (4) Date: Dec. 18, 2012

(87) PCT Pub. No.: WO2011/162116
PCT Pub. Date: Dec. 29, 2011

(65) Prior Publication Data
US 2013/0100750 A1    Apr. 25, 2013

(30) Foreign Application Priority Data

Jun. 24, 2010 (JP) ................... 2010-144237
Jun. 24, 2010 (JP) ................... 2010-144238
Jun. 24, 2010 (JP) ................... 2010-144240
Jan. 24, 2011 (JP) ................... 2011-012427

(51) Int. Cl.
 *H03K 19/173* (2006.01)
 *G11C 8/10* (2006.01)
 (Continued)

(52) U.S. Cl.
 CPC .............. *G11C 8/10* (2013.01); *H03K 19/1776* (2013.01); *H03K 19/17796* (2013.01); *G11C 7/00* (2013.01)
 USPC .................................. 326/38; 326/40; 326/46

(58) Field of Classification Search
 USPC ............. 326/38, 40, 41, 46, 47; 365/189.011, 365/230.06
 See application file for complete search history.

(56) References Cited

U.S. PATENT DOCUMENTS 5,868,666 A    2/1999  Okada et al.
6,417,691 B1 *  7/2002  Goodman et al. ............. 326/41
(Continued)

FOREIGN PATENT DOCUMENTS

JP    H7-154241 A    6/1995
JP    H11-8547 A     1/1999
(Continued)

OTHER PUBLICATIONS

Japanese Office Action dated Aug. 26, 2013, in a counterpart Japanese patent application No. 2012-189334.
(Continued)

*Primary Examiner* — Daniel D Chang
(74) *Attorney, Agent, or Firm* — Chen Yoshimura LLP

(57) ABSTRACT

Disclosed is a semiconductor device which is intended to reduce the total number of storage element blocks that constitute a desired logic circuit. The semiconductor device includes N address lines (N is an integer equal to two or more), N data lines, and a plurality of storage sections. Each of the storage sections includes an address decoder for decoding an address supplied via the N address lines to output a word select signal to word lines; and a plurality of storage elements which are connected to the word lines and the data lines, each store data that constitute a truth table, and input or output the data via the data lines in accordance with the word select signal supplied via the word lines. The semiconductor device is adapted such that the N address lines for the storage sections are connected to the respective data lines of other N ones of the storage sections, while the N data lines for the storage sections are connected to the respective address lines of other N ones of the storage sections.

14 Claims, 75 Drawing Sheets

(51) Int. Cl.
*G11C 7/00* (2006.01)
*H03K 19/177* (2006.01)

(56) References Cited

U.S. PATENT DOCUMENTS

| | | |
|---|---|---|
| 7,170,315 B2 * | 1/2007 | Bakker et al. .................. 326/38 |
| 2005/0134308 A1 | 6/2005 | Okada et al. |
| 2006/0017459 A1 | 1/2006 | Kanno et al. |
| 2009/0119491 A1 | 5/2009 | Nishino et al. |
| 2009/0154282 A1 | 6/2009 | Satoh |
| 2009/0290444 A1 | 11/2009 | Satoh |
| 2010/0188923 A1 | 7/2010 | Satoh |
| 2010/0257335 A1 | 10/2010 | Hanai et al. |

FOREIGN PATENT DOCUMENTS

| | | | |
|---|---|---|---|
| JP | 2003-149300 A | 5/2003 |
| JP | 2003-224468 A | 8/2003 |
| JP | 2005-182654 A | 7/2005 |
| JP | 2006-33579 A | 2/2006 |
| JP | 2009-194676 A | 8/2009 |
| JP | 2010-244238 A | 10/2010 |
| WO | 2007/060738 A1 | 5/2007 |
| WO | 2007/060763 A1 | 5/2007 |
| WO | 2007/114059 A1 | 10/2007 |
| WO | 2009/001426 A1 | 12/2008 |

OTHER PUBLICATIONS

Hironaka et al., "Consideration of MPLD Architecture for High Performance Computing", IEICE Technical Report, CPSY2008-31, Oct. 24, 2008, vol. 108, No. 273, pp. 13-18, the Institute of Electronics Information and Communication Engineers (IEICE), Tokyo Japan.

Taomoto et al., "Design and Implementation of a GUI Tool for Circuit Design on MPLDs", IEICE Technical Report, RECONF2010-27, Sep. 24, 2010, vol. 110, No. 204, pp. 55-60, the Institute of Electronics Information and Communication Engineers (IEICE), Tokyo Japan.

International Search Report (ISR) issued in PCT/JP2011/063461 mailed in Sep. 2011.

Written Opinion (PCT/ISA/237) issued in PCT/JP2011/063461 mailed in Sep. 2011. (Concise Explanation of Relevance: This Written Opinion considers that some of the claims are described by or obvious over the Foreign Patent document Nos. 3 and 6, and Non-Patent Literature document No. 1 cited in ISR above.).

English translation of Written Opinion (PCT/ISA/237) issued in PCT/JP2011/063461 mailed in Sep. 2011. (Japanese Written Opinion and cited references have been submitted in a previous IDS.).

* cited by examiner

FIG.8

| A0 | A1 | A2 | A3 | D0 | D1 | D2 | D3 |
|----|----|----|----|----|----|----|----|
| 0 | 0 | 0 | 0 | 0 | ▯ | ▯ | ▯ |
| 1 | 0 | 0 | 0 | 1 | ▯ | ▯ | ▯ |
| 0 | 1 | 0 | 0 | 1 | ▯ | ▯ | ▯ |
| 1 | 1 | 0 | 0 | 1 | ▯ | ▯ | ▯ |
| 0 | 0 | 1 | 0 | 0 | ▯ | ▯ | ▯ |
| 1 | 0 | 1 | 0 | 1 | ▯ | ▯ | ▯ |
| 0 | 1 | 1 | 0 | 1 | ▯ | ▯ | ▯ |
| 1 | 1 | 1 | 0 | 1 | ▯ | ▯ | ▯ |
| 0 | 0 | 0 | 1 | 0 | ▯ | ▯ | ▯ |
| 1 | 0 | 0 | 1 | 1 | ▯ | ▯ | ▯ |
| 0 | 1 | 0 | 1 | 1 | ▯ | ▯ | ▯ |
| 1 | 1 | 0 | 1 | 1 | ▯ | ▯ | ▯ |
| 0 | 0 | 1 | 1 | 1 | ▯ | ▯ | ▯ |
| 1 | 0 | 1 | 1 | 1 | ▯ | ▯ | ▯ |
| 0 | 1 | 1 | 1 | 1 | ▯ | ▯ | ▯ |
| 1 | 1 | 1 | 1 | 1 | ▯ | ▯ | ▯ |

FIG.10

| A0 | A1 | A2 | A3 | D0 | D1 | D2 | D3 |
|---|---|---|---|---|---|---|---|
| 0 | 0 | 0 | 0 | 0 | 0 | 0 | 0 |
| 1 | 0 | 0 | 0 | 0 | 1 | 0 | 0 |
| 0 | 1 | 0 | 0 | 0 | 0 | 1 | 0 |
| 1 | 1 | 0 | 0 | 0 | 1 | 1 | 0 |
| 0 | 0 | 1 | 0 | 0 | 0 | 0 | 1 |
| 1 | 0 | 1 | 0 | 0 | 1 | 0 | 1 |
| 0 | 1 | 1 | 0 | 0 | 0 | 1 | 1 |
| 1 | 1 | 1 | 0 | 0 | 1 | 1 | 1 |
| 0 | 0 | 0 | 1 | 1 | 0 | 0 | 0 |
| 1 | 0 | 0 | 1 | 1 | 1 | 0 | 0 |
| 0 | 1 | 0 | 1 | 1 | 0 | 1 | 0 |
| 1 | 1 | 0 | 1 | 1 | 1 | 1 | 0 |
| 0 | 0 | 1 | 1 | 1 | 0 | 0 | 1 |
| 1 | 0 | 1 | 1 | 1 | 1 | 0 | 1 |
| 0 | 1 | 1 | 1 | 1 | 0 | 1 | 1 |
| 1 | 1 | 1 | 1 | 1 | 1 | 1 | 1 |

FIG.13

| A0 | A1 | A2 | A3 | D0 | D1 | D2 | D3 |
|---|---|---|---|---|---|---|---|
| 0 | 0 | 0 | 0 | 0 |  | 0 |  |
| 1 | 0 | 0 | 0 | 0 |  | 0 |  |
| 0 | 1 | 0 | 0 | 0 |  | 0 |  |
| 1 | 1 | 0 | 0 | 1 |  | 0 |  |
| 0 | 0 | 1 | 0 | 0 |  | 0 |  |
| 1 | 0 | 1 | 0 | 0 |  | 0 |  |
| 0 | 1 | 1 | 0 | 0 |  | 0 |  |
| 1 | 1 | 1 | 0 | 0 |  | 0 |  |
| 0 | 0 | 0 | 1 | 0 |  | 1 |  |
| 1 | 0 | 0 | 1 | 0 |  | 1 |  |
| 0 | 1 | 0 | 1 | 0 |  | 1 |  |
| 1 | 1 | 0 | 1 | 1 |  | 1 |  |
| 0 | 0 | 1 | 1 | 0 |  | 1 |  |
| 1 | 0 | 1 | 1 | 0 |  | 1 |  |
| 0 | 1 | 1 | 1 | 0 |  | 1 |  |
| 1 | 1 | 1 | 1 | 0 |  | 1 |  |

FIG.16

| A0 | B0 | A1 | B1 | Cin | S0 | S1 | Cout |
|----|----|----|----|-----|----|----|------|
| 0 | 0 | 0 | 0 | 0 | 0 | 0 | 0 |
| 1 | 0 | 0 | 0 | 0 | 1 | 0 | 0 |
| 0 | 1 | 0 | 0 | 0 | 1 | 0 | 0 |
| 1 | 1 | 0 | 0 | 0 | 0 | 1 | 0 |
| 0 | 0 | 1 | 0 | 0 | 0 | 1 | 0 |
| 1 | 0 | 1 | 0 | 0 | 1 | 1 | 0 |
| 0 | 1 | 1 | 0 | 0 | 1 | 1 | 0 |
| 1 | 1 | 1 | 0 | 0 | 0 | 0 | 1 |
| 0 | 0 | 0 | 1 | 0 | 0 | 1 | 0 |
| 1 | 0 | 0 | 1 | 0 | 1 | 1 | 0 |
| 0 | 1 | 0 | 1 | 0 | 1 | 1 | 0 |
| 1 | 1 | 0 | 1 | 0 | 0 | 0 | 1 |
| 0 | 0 | 1 | 1 | 0 | 0 | 0 | 1 |
| 1 | 0 | 1 | 1 | 0 | 1 | 0 | 1 |
| 0 | 1 | 1 | 1 | 0 | 1 | 0 | 1 |
| 1 | 1 | 1 | 1 | 0 | 0 | 1 | 1 |
| 0 | 0 | 0 | 0 | 1 | 1 | 0 | 0 |
| 1 | 0 | 0 | 0 | 1 | 0 | 1 | 0 |
| 0 | 1 | 0 | 0 | 1 | 0 | 1 | 0 |
| 1 | 1 | 0 | 0 | 1 | 1 | 1 | 0 |
| 0 | 0 | 1 | 0 | 1 | 1 | 1 | 0 |
| 1 | 0 | 1 | 0 | 1 | 0 | 0 | 1 |
| 0 | 1 | 1 | 0 | 1 | 0 | 0 | 1 |
| 1 | 1 | 1 | 0 | 1 | 1 | 0 | 1 |
| 0 | 0 | 0 | 1 | 1 | 1 | 1 | 0 |
| 1 | 0 | 0 | 1 | 1 | 0 | 0 | 1 |
| 0 | 1 | 0 | 1 | 1 | 0 | 0 | 1 |
| 1 | 1 | 0 | 1 | 1 | 1 | 0 | 1 |
| 0 | 0 | 1 | 1 | 1 | 1 | 0 | 1 |
| 1 | 0 | 1 | 1 | 1 | 0 | 1 | 1 |
| 0 | 1 | 1 | 1 | 1 | 0 | 1 | 1 |
| 1 | 1 | 1 | 1 | 1 | 1 | 1 | 1 |

SEMICONDUCTOR DEVICE

FIELD

The present invention relates to a semiconductor device.

BACKGROUND

There has been known a programmable logic device (PLD). The PLD is a semiconductor device which is capable of changing a constituent logic circuit thereof, and includes a plurality of logic elements and a plurality of connection elements.

The logic element operates as a combination circuit or a sequential circuit. The logic element is, for example, a storage element block which is configured by a plurality of storage elements that configures a truth table. The plurality of storage elements are, for example, a static random access memory (SRAM).

The connection element switches the connection between the logic elements. The connection element is, for example, a transistor switching element. Accordingly, the PLD may for example rewrite the SRAM, and turn on/off the switching element to rewrite the constituent logic circuit.

Semiconductor devices which operate the storage element blocks as the connection element have been disclosed.

PRIOR ART DOCUMENTS

Patent Documents

Patent Document 1: Japanese Unexamined Patent Application Publication No. 2003-224468
Patent Document 2: Japanese Unexamined Patent Application Publication No. 2003-149300
Patent Document 3: WO 07/060,763
Patent Document 4: WO 09/001,426
Patent Document 5: WO 07/060,738
Patent Document 6: Japanese Unexamined Patent Application Publication No. 2009-194676

SUMMARY

The semiconductor device which operates the storage element blocks as the connection element can reduce the total number of storage element blocks which configure a desired logic circuit, by increasing the proportion of the storage elements which operate as the logic element.

In one aspect, the object of the present invention is to reduce the total number of storage element blocks which configure a desired logic circuit.

An embodiment which intends to solve the above mentioned problem is the first set of description according to the following (1)-(15).

(1) A semiconductor device, including:
N (N is an integer equal to two or more) number of address lines;
N number of data lines; and
a plurality of storage sections, each of the storage sections including:
  an address decoder which decodes an address inputted from the N number of address lines, and outputs a word selection signal to a word line; and
  a plurality of storage elements, each of which being connected to the word line and the data lines, storing data configuring a truth table, and inputting and outputting the data to and from the data lines based on the word selection signal inputted from the word line,
wherein the N number of address lines of one storage section are respectively connected to the data lines of the N number of other storage sections, and the N number of data lines of one storage section are respectively connected to the address lines of the N number of other storage sections.

(2) The semiconductor device according to (1), wherein the N number of address lines and the N number of data lines respectively form a pair by one address line and one data line.

(3) The semiconductor device according to (1) or (2), further including a storage section decoder which selects the plurality of storage sections.

(4) The semiconductor device according to any one of (1)-(3), further including a sequential circuit,
wherein the plurality of storage sections connect at least one data line among the N number of data lines to a signal input line of the sequential circuit, and connect at least one address line among the N number of address lines to a signal output line of the sequential circuit.

(5) The semiconductor device according to any one of (1)-(4), wherein the N is an integer of 6-8.

(6) The semiconductor device according to any one of (1)-(5), wherein the plurality of storage sections respectively connect six data lines among the N number of data lines to each data line of the other six adjacent storage sections, and connect six address data lines among the N number of address lines to each data line of the other six adjacent storage sections.

(7) The semiconductor device according to any one of (1)-(6), wherein the address decoder includes a row decoder and a column decoder,
wherein the row decoder decodes an address inputted from the M (N is an integer equal to five or less) number of address lines, and outputs the word selection signal to the word line,
and wherein the column decoder decodes an address inputted from the L (L is an integer of N−5) number of address lines and outputs a data selection signal which selects the N number of data lines outputted from the plurality of storage elements.

(8) The semiconductor device according to any one of (1)-(7), wherein two storage sections among the N number of the other storage sections adjacent to at least one storage section among the plurality of storage sections are arranged in a first direction apart from the at least one storage section by a first distance,
wherein the two storage sections among the N number of the other storage sections are arranged in a second direction which intersects with the first direction apart from the at least one storage section by a second distance,
wherein the two storage sections among the N number of the other storage sections are arranged in a third direction which intersects with the first and the second directions apart from the at least one storage section by a third distance,
and wherein each length of the first to the third distances becomes longer in an order of the first distance, the second distance and the third distance.

(9) The semiconductor device according to any one of (1)-(8), wherein the first direction and the second direction are perpendicular to each other.

(10) The semiconductor device according to any one of (1)-(9), wherein at least one storage section among the plurality of storage sections connects one address lines to the data line of a storage section other than the other adjacent storage sections.

(11) The semiconductor device according to any one of (6)-(10), wherein some of the plurality of storage sections are arranged in either one of the first to the third directions with respect to the at least one storage section among the plurality of storage sections, and wherein the at least one storage section among the plurality of storage sections connects one address line to the data line of a storage section arranged at a position apart by a length which is five times of either one of the first to the third distances.

(12) The semiconductor device according to any one of (1)-(11), wherein the plurality of storage sections are used as a reconfigurable logic element and/or a connection element.

(13) The semiconductor device according to any one of (1)-(12), further including an input/output section which is connected to a storage device storing data that configures the truth table.

(14) The semiconductor device according to (13), further including the storage device storing the data that configures the truth table.

(15) The semiconductor device according to any one of (1)-(14), wherein a physical number of wiring layers is four or less.

Further, the semiconductor device which operates the storage element blocks as the connection element is capable of inputting and outputting data to and from other devices. However, the semiconductor device cannot perform inputting and outputting of data to and from other devices, unless the input/output method of data therewith is determined.

In another aspect, the object of the present invention is to perform data input and output between a semiconductor device and an arithmetic processor.

An embodiment which intends to solve the above mentioned problem is the second set of description according to the following (1)-(11).

(1) A semiconductor device, including:

a first logic section and a second logic section each including a plurality of storage sections, each storage section including (i) an address decoder which decodes a memory operation address inputted from a first address line or a logic operation address inputted from a second address line and outputs a word selection signal to a word line, and (ii) a plurality of storage elements being connected to the word line and a data line, which store data configuring a truth table defining a logic operation or connection relation, and are connected to the data line inputting and outputting the data by the word selection signal inputted from the word line; and an arithmetic processing section which includes (i) a first input/output section connecting the first address line of the storage sections included in the first logic section and the data line, (ii) a second input/output section connecting the second address line of the storage sections included in the second logic section, and (iii) a control section which performs control to output the memory operation address and data to the first input/output section and performs control to output the logic operation address and receive the data to and from the second input/output section.

(2) The semiconductor device according to (1), wherein the logic operation address line of the storage sections included in the first logic section and the second logic section is respectively connected to the data line of the other storage sections, and the data line of the storage sections is respectively connected to the logic operation address line of the other storage sections.

(3) The semiconductor device according to (1) or (2), wherein the plurality of storage sections included in the first logic section and the second logic section are reconfigurable.

(4) The semiconductor device according to any one of (1)-(3), wherein the first logic section and the second logic section respectively include a storage section decoder which selects the plurality of storage sections.

(5) The semiconductor device according to any one of (1)-(4), further including an input/output section which is connected to a storage device storing data that configures the truth table.

(6) The semiconductor device according to any one of (1)-(5), further including the storage device storing the data that configures the truth table.

(7) The semiconductor device according to any one of (1)-(6), wherein a physical number of wiring layers is four or less.

(8) The semiconductor device according to any one of (1)-(7), wherein the number of the storage sections included in the first logic section and the number of the storage sections included in the second logic section are the same.

(9) The semiconductor device according to any one of (1)-(8), wherein the address decoder includes a row decoder and a column decoder, wherein the row decoder decodes an address inputted from the M (N is an integer equal to five or less) number of address lines, and outputs the word selection signal to the word line, and wherein the column decoder decodes an address inputted from the L (L is an integer of N−5) number of address lines and outputs a data selection signal which selects the N number of data lines outputted from the plurality of storage elements.

(10) A control method of a semiconductor device using an arithmetic processing section, the control method including the steps of:

outputting truth table data defining a logic operation or connection relation to a first logic section by the arithmetic processing section, the first logic section including a plurality of storage sections, and each storage section including a plurality of storage elements;

storing the truth table data defining the logic operation or connection relation in the storage section of the first logic section;

outputting a logic operation address to a second logic section by the arithmetic processing section by the arithmetic processing section, the second logic section including a plurality of storage sections, and each storage section including a plurality of storage elements;

outputting data from the storage element specified by the logic operation address by the storage section of the second logic section; and receiving data from the second logic section by the arithmetic processing section.

(11) The control method according to (10), wherein the arithmetic processing section is included in the semiconductor device.

An embodiment which intends to solve the above mentioned problem is the third set of description according to the following (1)-(11).

(1) A semiconductor device, including an arithmetic processing section which performs an arithmetic operation processing for data; and a logic section including a plurality of storage sections and an input/output section, wherein each storage section includes (i) an address decoder which decodes an address inputted from an address line and outputs a word selection signal to a word line, and (ii) a plurality of storage elements being connected to a data line and the word line, which store data configuring a truth table defining a logic operation or connection relation, and are connected to the data line inputting and outputting the data by the word selection signal inputted from the word line, and wherein the input/output section connects at least one output signal line of the arithmetic processing section and at least one address line, and connects at least one input signal line of the arithmetic processing section and at least one data line.

(2) The semiconductor device according to (1), wherein the address line of the storage sections is respectively connected to the data line of the other storage sections, and the data line of the storage sections is respectively connected to the address line of the other storage sections.

(3) The semiconductor device according to (1) or (2), wherein the plurality of storage sections are reconfigurable.

(4) The semiconductor device according to any one of (1)-(3), wherein the logic section includes a storage section decoder which selects the plurality of storage sections.

(5) The semiconductor device according to any one of (1)-(4), further including an input/output section which is connected to a storage device storing data that configures the truth table.

(6) The semiconductor device according to any one of (1)-(5), further including the storage device storing the data that configures the truth table.

(7) The semiconductor device according to any one of (1)-(6), wherein a physical number of wiring layers is four or less.

(8) The semiconductor device according to any one of (1)-(7), wherein the address decoder includes a row decoder and a column decoder, wherein the row decoder decodes an address inputted from the M (N is an integer equal to five or less) number of address lines, and outputs the word selection signal to the word line, and wherein the column decoder decodes an address inputted from the L (L is an integer of N−5) number of address lines and outputs a data selection signal which selects the N number of data lines outputted from the plurality of storage elements.

(9) A control method of a semiconductor device using an arithmetic processing section, the control method including the steps of:

outputting an address to a logic section included in the arithmetic processing section by the arithmetic processing section, the logic section including a plurality of storage elements, and each storage element storing data configuring a truth table defining a logic operation or connection relation;

receiving the address from at least one address line connected to at least one output signal line of the arithmetic processing section by the logic section;

outputting data from the storage element specified by the address by the logic section; and outputting the data to the arithmetic processing section via at least one data line connected to at least one input signal line of the arithmetic processing section by the logic section.

(10) The control method according to (9), wherein the logic section outputs the read out data to at least one input signal line of the arithmetic processing section via at least one data line connected to the storage element in the logic section.

(11) The control method according to (9) or (10), wherein the arithmetic processing section is included in the semiconductor device.

Further, as one of the PLD, there is mentioned a memory-based programmable logic device (MPLD). The MPLD realizes the circuit configuration by a memory cell unit in the same manner as the PLD of a LUT base. The MPLD shares the same feature as the PLD of the LUT base in that the memory cell unit into which the truth table data is written functions as the logic element. On the other hand, the MPLD is different from the PLD of the LUT base in that the MPLD also functions as the connection element between the LUTs, whereas the PLD of the LUT base includes a switching circuit dedicated for the connection between the memory cell units. However, since the memory cell unit is used for the logic elements and/or the connection element to switch connections between the logic elements in the MPLD, the truth table data retained in the memory cell needs to be rewritten in order to change the data path, in the same manner as the PLD of the LUT base. Accordingly, when a dynamic reconfiguration is executed in the MPLD, writing processing of data into the memory cell unit occurs, which results in a delay of processing.

In still another aspect, the object of the present invention is to reduce time for reconfiguration of a semiconductor device including MPLD.

An embodiment which intends to solve the above mentioned problem is the fourth set of description according to the following (1)-(5).

(1) A semiconductor device, including:

a plurality of programmable logic sections, each including a plurality of memory cell units, and operating as a logic element or a connection element when truth table data is written into the memory cell unit;

a cache section which retains plurality of pieces of configuration information, each piece being the pieces of the truth table data; and a configuration control section which reconfigures a second programmable logic section among the plurality of programmable sections by second configuration information configuring a branch destination circuit of a branch logic, when a first programmable logic section among the plurality of programmable sections is reconfigured by first configuration information configuring the branch logic.

(2) The semiconductor device according to (1), wherein the cache section separately retains arithmetic operator data which is the truth table data showing an arithmetic operator and control data which is the truth table data showing a state change, wherein the configuration control section reads out the control data and the arithmetic operator data including the arithmetic operator shown by the state change of the control data respectively from the cache section, and reconfigures the programmable logic section.

(3) The semiconductor device according to (1) or (2), further including a storage section which stores the control data retained by the cache section, wherein the configuration control section reads out the control data to reconfigure the programmable logic section from the storage section and stores the read out control data in the cache section, after the control data retained by the cache section is read out.

(4) The semiconductor device according to any one of (1)-(3), wherein the truth table data of the control data stored in the storage section is compressed, wherein the cache section retains the compressed truth table data, and wherein the configuration control section decompresses the compressed truth table data, and reconfigures the programmable logic section by the decompressed truth table data.

(5) The semiconductor device according to any one of (1)-(4), wherein when a first programmable logic section among the plurality of programmable logic sections is reconfigured by third configuration information configuring a branch logic, and when fourth configuration information does not configure a branch destination circuit of the branch logic of the third configuration information based on an arithmetic operation result of a second programmable logic section configured by the fourth configuration information which is estimated as the branch destination circuit of the branch logic of the third configuration information, the configuration control section reconfigures the programmable logic sections other than the second programmable logic section by fifth configuration information including a branch destination of the branch logic.

In the first aspect, the present invention enables reducing the total number of storage element blocks which configure a desired logic circuit.

In the second aspect, the present invention enables performing data input and output between a semiconductor device and an arithmetic processor.

In the third aspect, the present invention enables reducing time for reconfiguration of a semiconductor device including MPLD.

BRIEF DESCRIPTION OF DRAWINGS

These and other objects and features of the present invention will become clearer from the following description of the preferred embodiments given with reference to the attached drawings, wherein:

FIG. 8 is a view showing a truth table of the logic circuit of FIG. 7;

FIG. 10 is a view showing a truth table of the connection element of FIG. 9;

FIG. 13 is a view showing a truth table of the logic element and the connection element of FIG. 12;

FIG. 16 is a view showing a truth table of the 2-bit adder operation;

DESCRIPTION OF EMBODIMENTS

Hereinbelow, examples will be described in the order of [1] an MPLD, [2] an MLUT, [3] a configuration of the MLUT, [4] a semiconductor device in which one MPLD is mounted, [5] a semiconductor device in which one MPLD and an arithmetic processing section are mounted, [6] a semiconductor device in which two MPLDs and an arithmetic processing section are mounted, and [7] a semiconductor device suitable for dynamic reconfiguration. The MPLD [1] described below includes a plurality of MLUTs [2], and the MPLD [1] may be combined with the arithmetic processing section to configure the semiconductor device [4], [5], [6], or [7].

[1] MPLD

Figure 1:
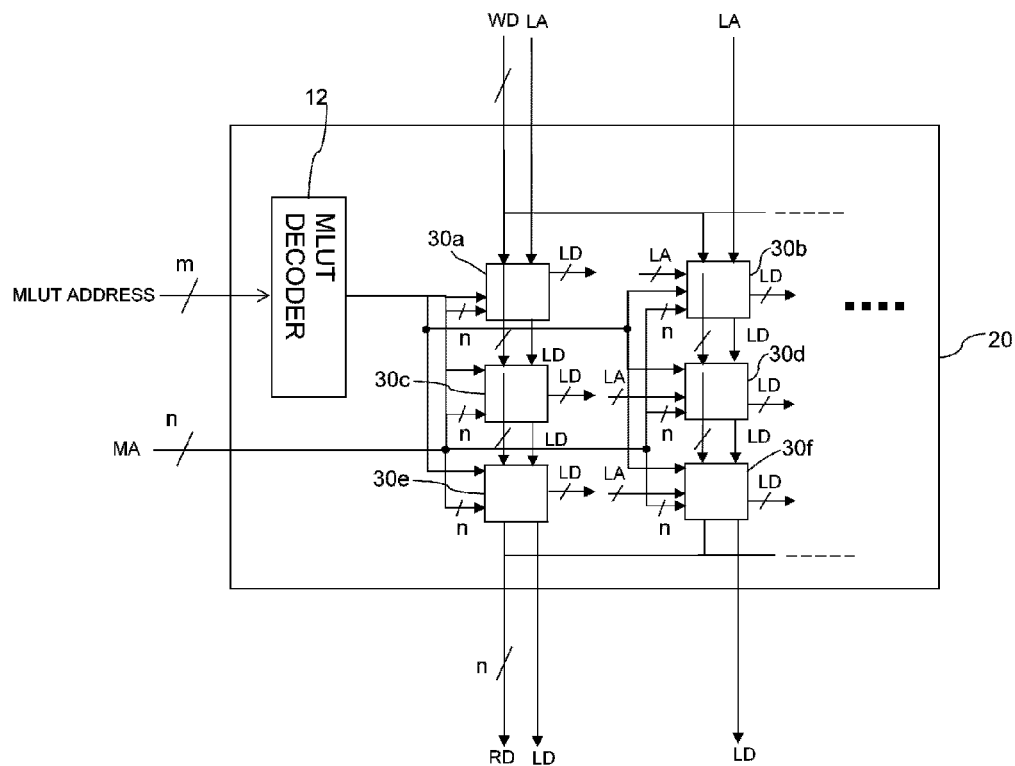
FIG. 1 is a view showing one example of MPLD.

FIG. 1 is a view showing one example of a semiconductor device. An element 20 shown in FIG. 1 is a memory-based programmable logic device (MPLD) as the semiconductor device. The MPLD 20 includes a plurality of multi look-up-tables (MLUTs) 30 as storage element blocks and a MLUT decoder 12. Further, the MPLD 20 operates as a logic section to be connected to an arithmetic processor, which will be described later.

The MPLD 20 includes a plurality of storage elements. Pieces of data which configure truth tables are respectively stored in the storage elements, which allows the MPLD 20 to perform a logic operation as a logic element, a connection element, or both of the logic element and the connection element.

The MPLD 20 further performs a memory operation. The memory operation is referred to as writing data into the storage elements included in the MLUT 30 and reading out the data. Accordingly, the MPLD 20 may operate as a main storage device or a cache memory.

When data is written into the MLUT 30, truth table data is rewritten. Accordingly, the memory operation causes reconfiguration of the truth table data. Note that among the reconfiguration, rewriting the truth table data stored in a specific single MLUT or a plurality of MLUTs in the MPLD, or a specific single storage element or a plurality of storage elements configuring the MLUT is referred to as "a partial reconfiguration".

FIG. 1 shows that any signal of an MLUT address, a memory operation address MA, write-in data WD, and read-out data RD is used in the memory operation, and depicts such signals and connections connected thereto. Further, FIG. 1 also shows that signals of a logic operation address LA and logic operation data LD are used in the logic operation, and depicts such signals and connections connected thereto. Note that the memory operation address MA is an address for memory operation to be supplied to each MLUT included in the MPLD 20. The MPLD address is an address which specifies a single MLUT included in the MPLD 20, to specify the MLUT to which the memory operation address MA is supplied.

[1.1] Memory Operation of MPLD

Figure 2:
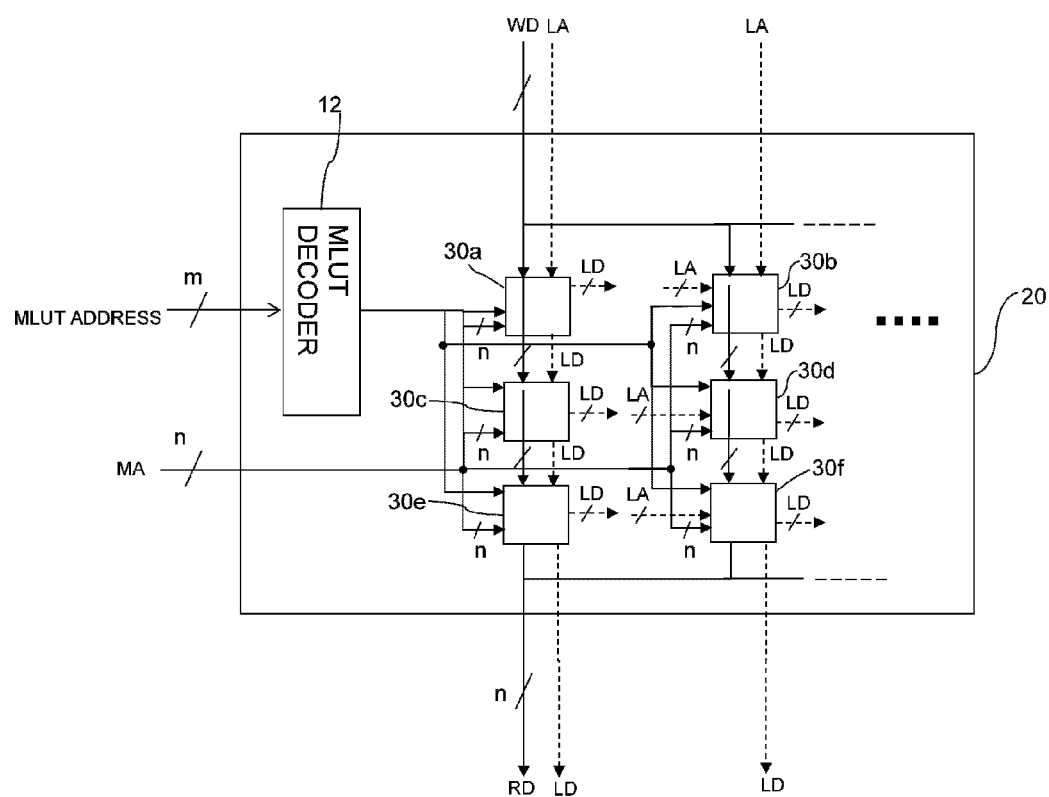
FIG. 2 is a view showing one example of a memory operation of the MPLD.

FIG. 2 is a view showing one example of the memory operation of the MPLD. In the memory operation, the MPLD 20 uses any signal of the memory operation address, the MLUT address, the write-in data WD and the read-out data RD, which are depicted in solid lines, and does not use the logic operation address LA and the logic operation data LD, which are depicted in dashed lines. Note that, for example, the memory operation address, the MLUT address and the write-in data WD are outputted by an arithmetic processor provided externally of the MPLD 20, and the read-out data RD is outputted to the arithmetic processor.

In the memory operation, the MPLD 20 receives the memory operation address and the MLUT address as addresses which specify the storage elements. The MPLD 20 receives the write-in data WD when writing in data, and outputs the read-out data RD when reading out data.

The MLUT address is an address which specifies a single MLUT included in the MPLD 20. The MLUT address is outputted to the MPLD 20 via m number of signal lines. Note that m is the number of selection address signal lines which specify the MLUT. The m number of signal lines may specify m-th power of 2 number of MLUT(s). The MLUT decoder 12 receives the MLUT address via the m number of signal lines, decodes the MLUT address, selects and specifies the MLUT 30 to be the target of the memory operation. The memory operation address is decoded by an address decoder which will be described later using FIG. 10, via the n number of signal lines, and selects a memory cell which is to be the target of the memory operation.

Note that the MPLD 20, for example, receives the MLUT address, the write-in data WD and the read-out data RD all via n number of signal lines. Here, n is the number of selection address lines for the memory operation or the logic operation of the MLUT, which will be described later with reference to FIG. 4. MPLD 20 supplies the MLUT address, the write-in data and the read-out data to each MLUT via the n number of signal lines. Note that the detailed description of the memory operation address MA, the write-in data WD and the read-out data RD will be given later with examples of MLUT with reference to FIGS. 4, 19 and 21.

[1.2] Logic Operation of MPLD

Figure 3:
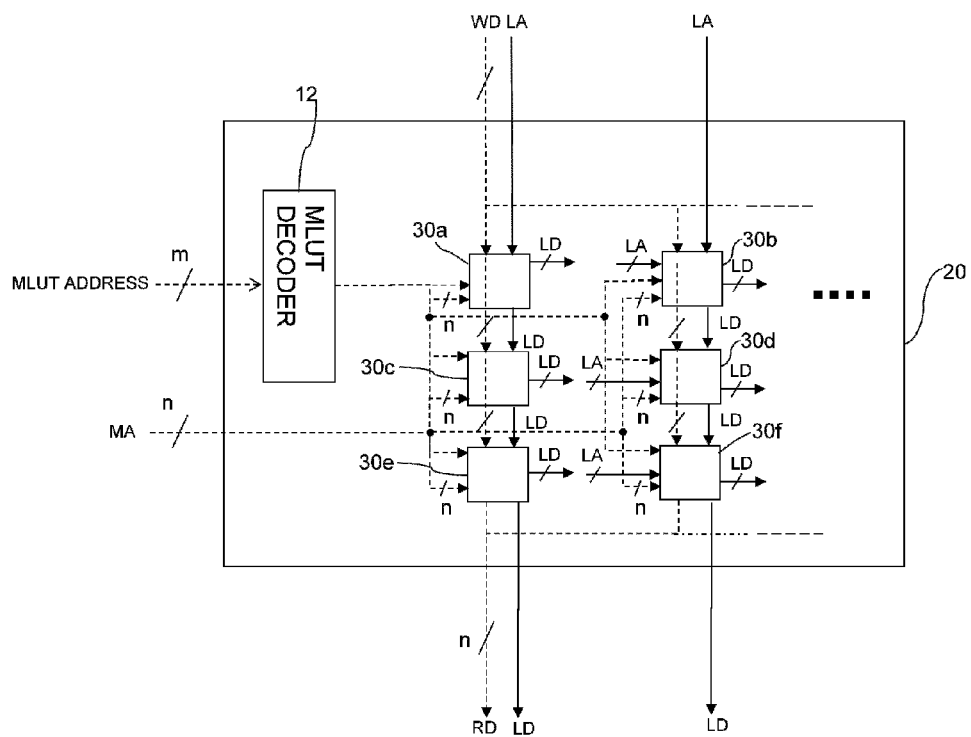
FIG. 3 is a view showing one example of a logic operation of the MLUT.

FIG. 3 is a view showing one example of a logic operation of the MPLD 20. In the logic operation of MPLD 20, the logic operation address LA and the logic operation data LD which are shown in solid lines in FIG. 3 are used.

In the logic operation of MPLD 20, the logic operation address LA is outputted from an external device, and is used as an input signal of a logic circuit configured by a truth table of the MLUT 30. Further, the logic operation data LD is an output signal of the logic circuit, and is outputted to an external device as the output signal of the logic circuit.

Among the plurality of MLUTs, an MLUT arranged in the periphery of the MPLD 20 operates as the MLUT which receives the logic operation address LA which is the logic operation data, and outputs the logic operation data LD to and from a device externally arranged of the MPLD 20. For example, the MLUTs 30a, 30b shown in FIG. 1 receive the logic operation address LA from outside of the semiconductor device 100, and outputs the logic operation data LD to the surrounding another MLUT 30d. Further, the MLUTs 30e, 30f receive the logic operation address LA from other MLUTs 30c, 30d, and output the logic operation data LD to outside of the MPLD 20.

The address line of the logic operation address LA of the MLUT is connected to a data line of the logic operation data LD of an adjacent MLUT. For example, the MLUT 30c receives the logic operation data outputted from the MLUT 30a as the logic operation address. Therefore, the logic operation address and the logic operation data of the MLUT is different from an MLUT address in which each MLUT is individually connected to each other, in that they may be obtained by an input or an output of the surrounding MLUTs.

The logic of the logic operation of the MPLD 20 may be realized by the truth table data stored in the MLUT 30. Some of the MLUTs 30 operate as a logic element of a combination circuit of AND circuit, an adder, and the like. The other MLUTs operate as a connection element which connects the MLUTs 30 therebetween realizing the combination circuit. Rewriting of the truth table data to realize the logic element and the connection element is performed by the reconfiguration of the above described memory operation.

[2] MLUT

Hereinbelow, the MLUT is described.

[2.1] First example of MLUT

Figure 4:
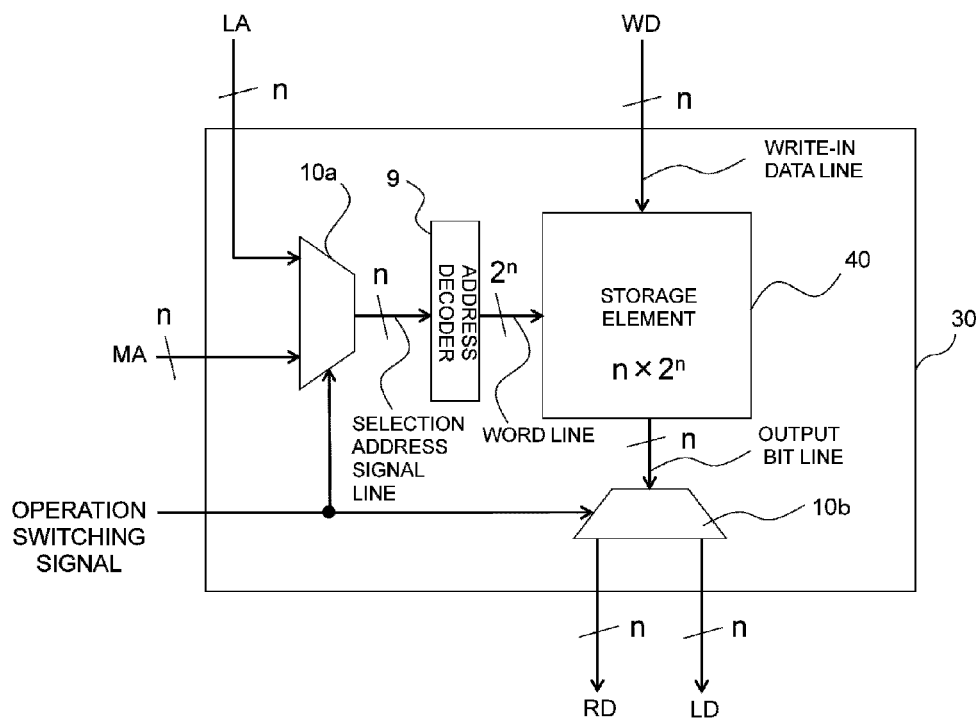
FIG. 4 is a view showing a first example of the MLUT.

FIG. 4 is a view showing the first example of the MLUT. The MLUT 30 shown in FIG. 4 includes an address switching circuit 10a, an address decoder 9, a storage element 40 and an output data switching circuit 10b. The MLUT 30 shown in FIG. 10 operates to output the logic operation data LD in accordance with the logic operation address LA, when the operation switching signal shows logic operation. Further, the MLUT 30 operates to receive the write-in data or output read-out data in accordance with the memory operation address, when the operation switching signal shows memory operation.

The address switching circuit 10a connects n number of memory operation address signal lines into which the memory operation address MA is inputted, n number of logic operation address input signal lines into which the logic operation address LA is inputted, and the operation switching signal lines into which the operation switching signal is inputted. The address switching circuit 10a operates to output either the memory operation address MA or the logic operation address LA to the n number of selection address signal lines based on the operation switching signal. The reason why the address switching circuit 10a selects the address signal lines is because the storage element 40 is a 1-port storage element which receives either the reading-out operation or the writing-in operation.

The address decoder 9 shown in FIG. 4 decodes the selection address signal received from the n number of address signal lines supplied from the address switching circuit 10a, and outputs a decode signal to n-th power of 2 number of word lines.

The n×$2^n$ number of storage elements are arranged in the connected portions of the n-th power of 2 number of word lines, n number of write-in data lines, and n number of output bit lines. The detailed example of the storage elements will be described later with reference to FIG. 5.

When signals from the n number of output bit lines are received, the output data switching circuit 10b operates to output data read out from the storage elements to the n number of read-out data signal lines, or output the read out data to the logic operation signal lines, in accordance with the inputted operation switching signal.

[2.2] Storage Elements of MLUT

Figure 5:
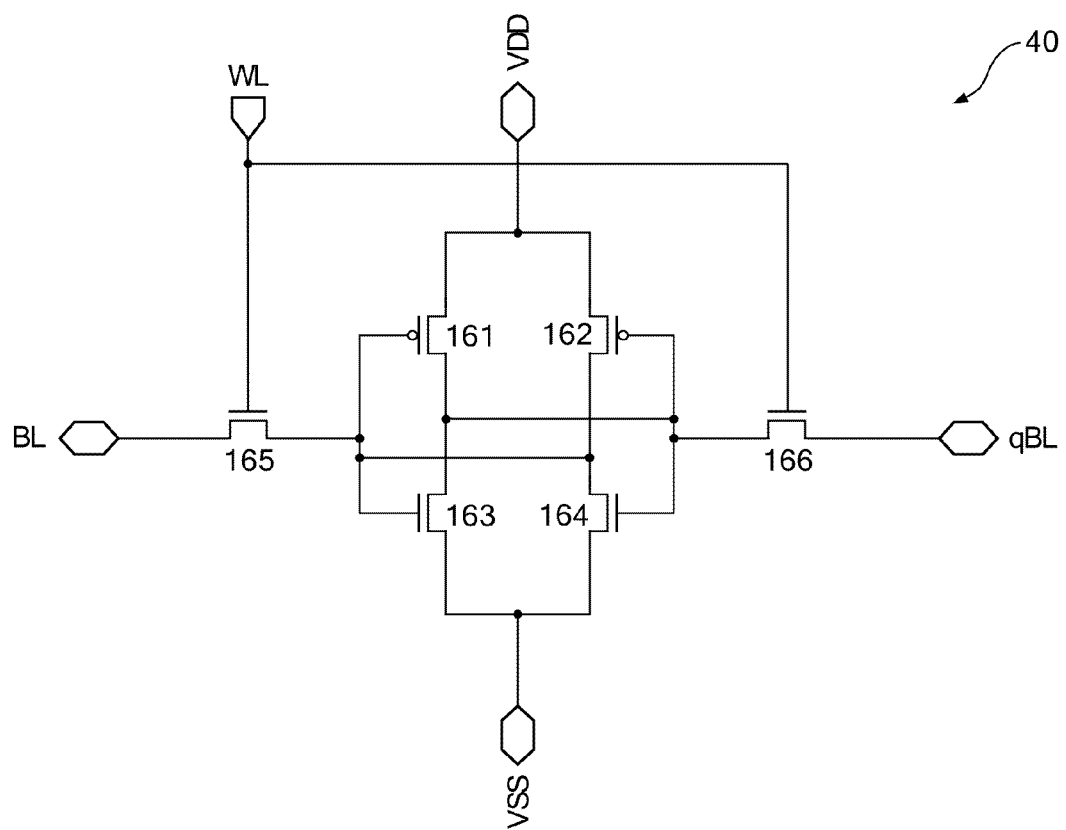
FIG. 5 is a view showing one example of a 1-port storage element.

FIG. 5 is a view showing one example of a 1-port storage element. The 1-port storage element shown in FIG. 5 is a SRAM, and may be used as the storage elements shown in FIG. 4. The 1-port SRAM 40 shown in FIG. 5 includes a first and a second positive channel metal oxide semiconductor (pMOS) transistors 161, 162, and a first to a fourth negative channel MOS (nMOS) transistors 163-166.

The source of the first pMOS transistor 161 and the source of the second pMOS transistor 162 are connected to the supply voltage end (VDD). The drain of the first pMOS transistor 161 is connected to the source of the first nMOS transistor 163, the gate of the second pMOS transistor 162, the gate of the second nMOS transistor 164, and the source of the third nMOS transistor 165. The gate of the first pMOS transistor 161 is connected to the gate of the first nMOS transistor 163, the drain of the second pMOS transistor 162, the drain of the second nMOS transistor 164, and the source of the fourth nMOS transistor 166. The drain of the first nMOS transistor 163 and the drain of the second nMOS transistor 164 are connected to the ground voltage end (VSS).

The drain of the third nMOS transistor 165 is connected to a first bit line BL. The gate of the third nMOS transistor 165 is connected to a word line WL. The drain of the fourth nMOS transistor 166 is connected to a second bit line qBL. The gate of the fourth nMOS transistor 166 is connected to the word line WL.

According to the above described configuration, the 1-port storage element 40 retains signal levels of the write-in bit line BL and the write-in bit line qBL by the signal level "H" of the word line WL in the write-in operation.

[2.3] Logic Operation of MLUT

A. Logic Element

Figure 6:
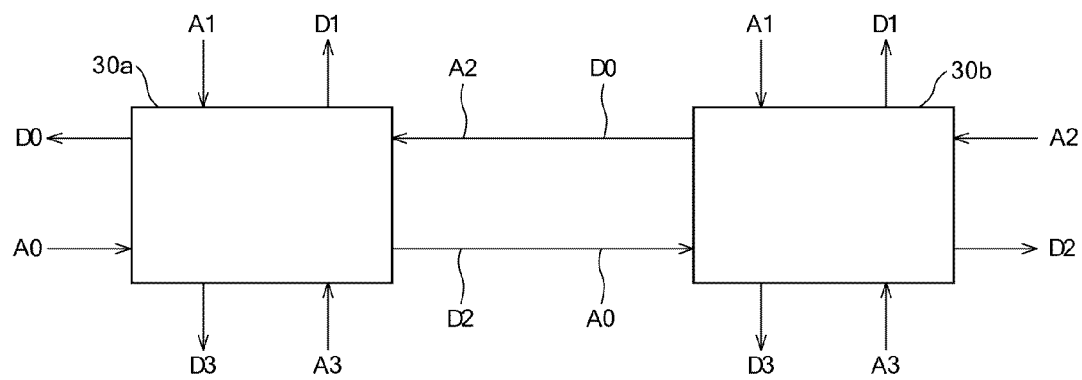
FIG. 6 is a view showing one example of the MLUT which operates as a logic element.

FIG. 6 is a view showing one example of the MLUT which operates as a logic element. The MLUTs 30a, 30b shown in FIG. 6 receive the logic operation address LA from logic operation address lines A0-A3, and output the logic operation data LD to logic operation data lines D0-D3. Note that the logic operation address line A2 of the MLUT 30a is connected to the logic operation data line D0 of the adjacent MLUT 30b, so that the MLUT 30a receives the logic operation data LD outputted from the MLUT 30b as the logic operation address LA. Further, the logic operation data line D2 of the MLUT 30a is connected to the logic operation address line A0 of the MLUT 30b, so that the logic operation data LD outputted from the MLUT 30a is received by the MLUT 30b as the logic operation address LA. In this manner, one pair of the address line and the data line is used for connecting the MPLDs with each other. Hereinbelow, the pair of the address line and the data line to be used for connecting the MLUTs, such as the logic operation address line A2 and the logic operation data line D2 of the MLUT 30a, will be referred to as "an AD pair".

Note that the number of AD pairs included in the MLUTs 30a, 30b shown in FIG. 6 is four. However, the number of the AD pairs is not limited to four, as described later.

Figure 7:
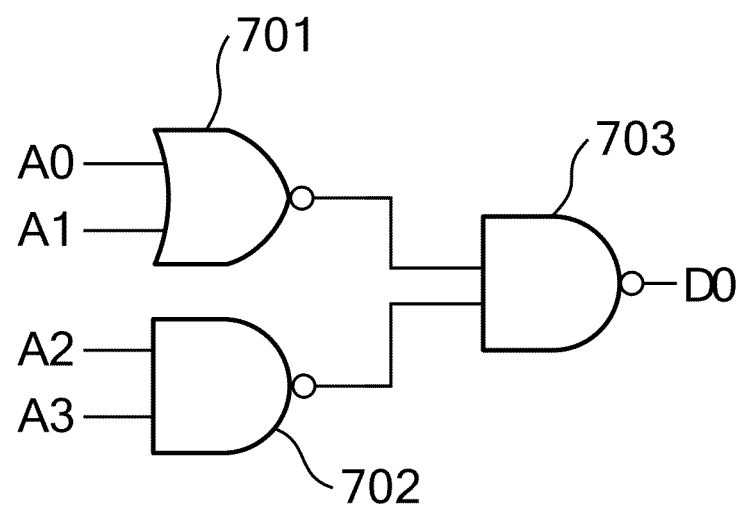
FIG. 7 is a view showing one example of the MLUT which operates as a logic circuit.

FIG. 7 is a view showing one example of the MLUT which operates as a logic circuit. In this example, the logic circuit is configured in the following manner. That is, the logic operation address lines A0 and A1 are inputs of a 2-input NOR circuit 701, and the logic operation address lines A2 and A3 are inputs of a 2-input NAND circuit 702. Further, an output of the 2-input NOR circuit 701 and an output of the 2-input NAND circuit 702 are inputted to a 2-input NAND circuit 703, and an output of the 2-input NAND circuit 703 is outputted to the data line D0.

FIG. 8 is a view showing a truth table of the logic circuit of FIG. 7. Since the logic circuit of FIG. 7 has four inputs, all inputs from the inputs A0-A3 are used as inputs. On the other hand, since the logic circuit only has one output, only the output D0 is used as an output. In each field for the outputs D1-D3 in the truth table, "*" is described. This means that the value may take either "0" or "1". However, when actually writing in the truth table data into the MLUT for reconfiguration, either one value of "0" or "1" needs to be written into these fields.

B. Functions of Connection Element

Figure 9:
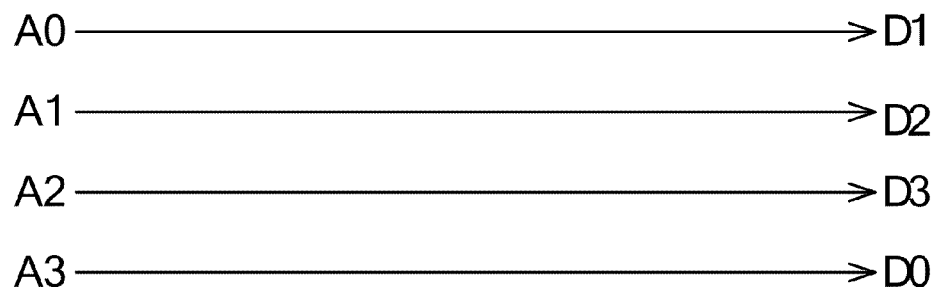
FIG. 9 is a view showing one example of the MLUT which operates as a connection element.

FIG. 9 is a view showing one example of the MLUT which operates as a connection element. In FIG. 9, the MLUT as the connection element operates to output a signal of the address line A0 to the data line D1, output a signal of the address line A1 to the data line D2, and output a signal of the logic operation address line A2 to the data line D3. The MLUT as the connection element further operates to output a signal of the address line A3 to the data line D0.

FIG. 10 is a view showing a truth table of the connection element of FIG. 9. The connection element shown in FIG. 9 has four inputs and four outputs. Accordingly, all inputs from the inputs A0-A3 and all outputs to the outputs D0-D3 are used. The MLUT operates as a connection element which outputs the signal of the input A0 to the output D1, outputs the signal of the input A1 to the output D2, outputs the signal of the input A2 to the output D3, and outputs the signal of the input A3 to the output D0, in accordance with the truth table shown in FIG. 10.

Figure 11:
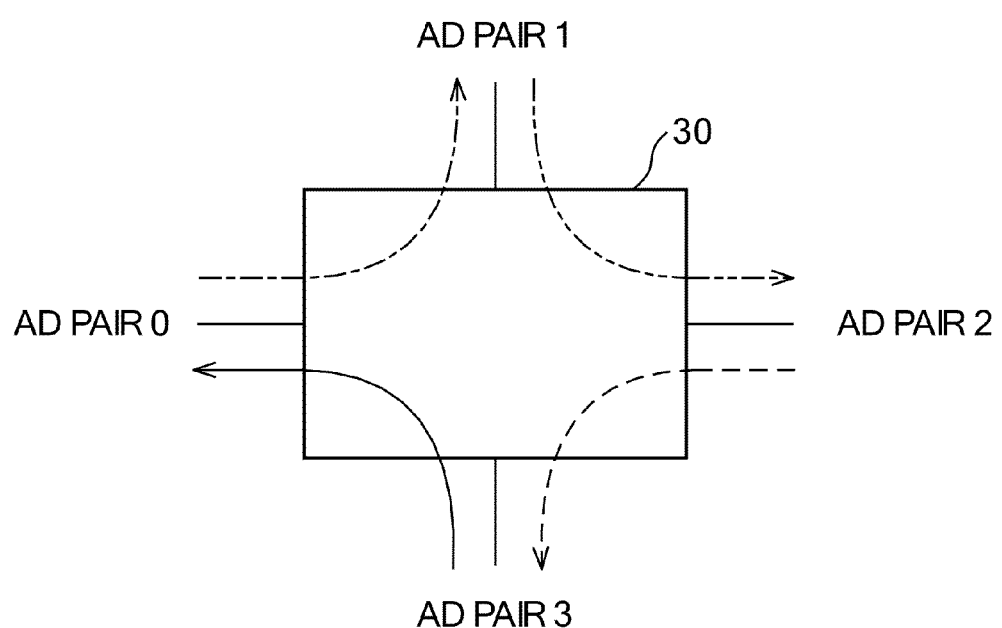
FIG. 11 is a view showing one example of the connection element realized by the MLUT including four AD pairs.

FIG. 11 is a view showing one example of the connection element realized by the MLUT including four AD pairs. In FIG. 11, the alternate long and short dash line shows a signal flow of the signal inputted to the AD pair 4 being outputted to the AD pair 1. The alternate long and two short dashes line shows a signal flow of the signal inputted to the AD pair 1 being outputted to the AD pair 2. The dashed line shows a signal flow of the signal inputted to the AD pair 2 being outputted to the AD pair 3. The solid line shows a signal flow of the signal inputted to the AD pair 3 being outputted to the AD pair 4.

Note that the number of AD pairs included in the MLUT 30 shown in FIG. 11 is four. However, the number of the AD pairs is not limited to four, as described later.

C. Combination Function of Logic Element and Connection Element

Figure 12:
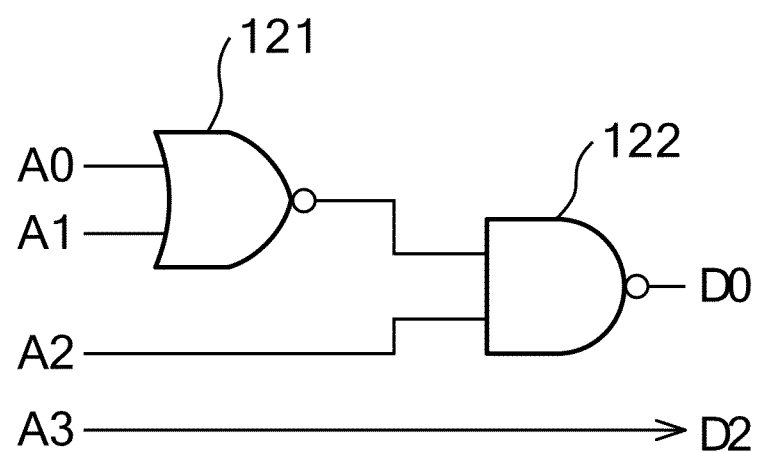
FIG. 12 is a view showing one example of a single MLUT which operates as the logic element and the connection element.

FIG. 12 is a view showing one example of a single MLUT which operates as the logic element and the connection element. In the example shown in FIG. 12, the logic circuit is configured in the following manner. That is, the logic operation address lines A0 and A1 are inputs of a 2-input NOR circuit 121, an output of the 2-input NOR circuit 121 and the logic operation address line A2 are inputs of a 2-input NAND circuit 122, and an output of the 2-input NAND circuit 122 is outputted to the data line D0. Further, at the same time, a connection element which outputs the signal of the address line A3 to the data line D2 is configured.

FIG. 13 is a view showing a truth table of the logic element and the connection element of FIG. 12. The logic operation of FIG. 12 uses inputs D0-D3 as three inputs, and one output D0 as an output. On the other hand, the connection element of FIG. 12 configures a connection element which outputs the signal of the input A3 to the output D2.

Figure 14:
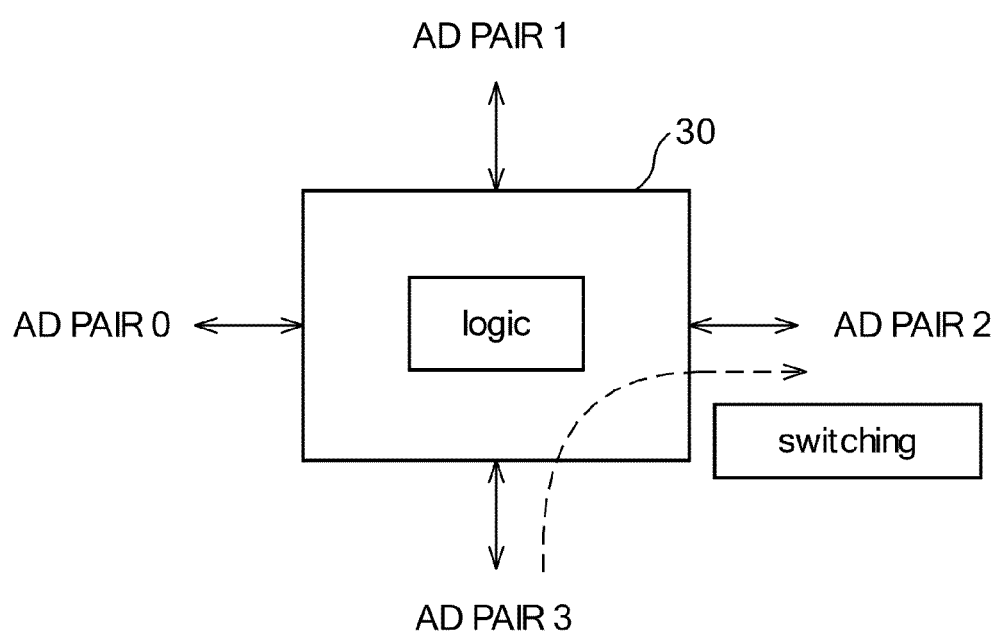
FIG. 14 is a view showing one example of the logic operation and the connection element realized by the MLUT including four AD pairs.

FIG. 14 is a view showing one example of the logic operation and the connection element realized by the MLUT including four AD pairs. As describe above, the MLUT 30 realizes two operations of the logic operation (three inputs and one output) and the connection element (one input and one output) by a single MLUT 30. Concretely, the logic operation uses the address line of the AD pair 4, the address line of the AD pair 1, and the address line of the AD pair 2 as the inputs. Further, the address line of the AD pair 4 is used as the output. Still further, the connection element outputs the signal inputted to the AD pair 3 to the AD pair 2 as shown in a dashed line.

Note that an MLUT including N number of AD pairs may configure an arbitrary logic circuit including N number of inputs and N number of outputs. Further, the MLUT including N number of AD pairs may configure an arbitrary logic circuit including an arbitrary number of inputs, the numbers ranging in 1-N in total, and an arbitrary number of outputs, the numbers ranging in 1-N, and at the same time a connection element.

[2.4] MLUT Including Seven AD Pairs

One example of realizing an operation of the truth table on the MLUT including seven AD pairs will be described with reference to FIGS. 15-17.

Figure 15:
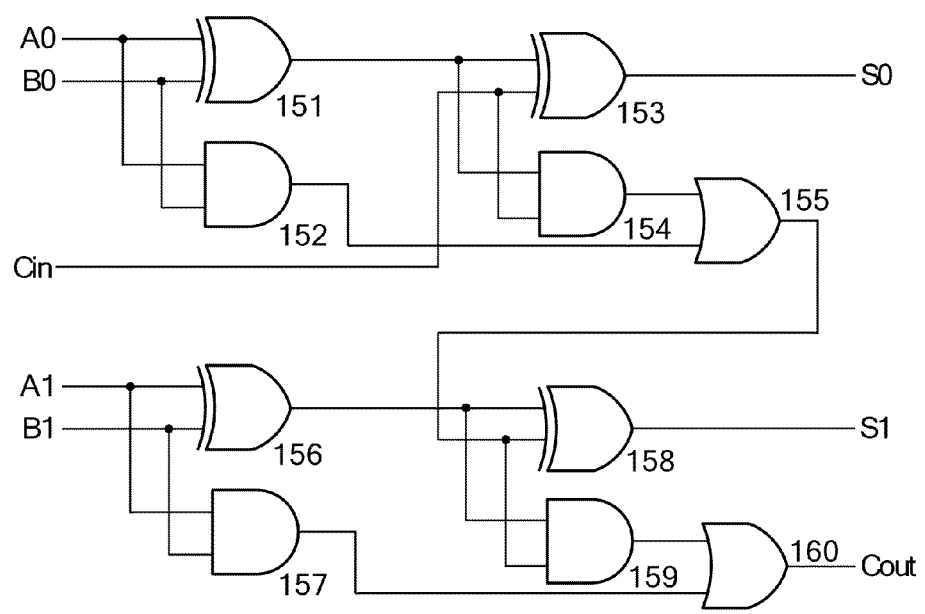
FIG. 15 is a view showing one example of a circuit configuration of a 2-bit adder configured by the MLUT.

FIG. 15 is a view showing one example of a circuit configuration of a 2-bit adder configured by the MLUT. The 2-bit adder may be configured by connecting two 1-bit full adders.

In FIG. 15, the 2-bit adder includes: a first 1-bit full adder which uses inputs A0, B0 and Cin as inputs and uses an output S0 and a carry as outputs; and a second 1-bit full adder which uses inputs A1, B1 and the carry of the first 1-bit full adder as inputs and uses an output S1 and Cout as outputs.

In the first 1-bit full adder, inputs A0 and B0 are inputs of a first 2-input XOR circuit 151 and a first 2-input AND circuit 152. An output of the first 2-input XOR circuit 151 and the input Cin are inputs of a second 2-input XOR circuit 153 and a second 2-input AND circuit 154. An output of the first 2-input AND circuit 152 and an output of the second 2-input AND circuit 154 are an input of a first 2-input OR circuit 155. Further, an output of the second 2-input XOR circuit 153 is the output S0, and an output of the first 2-input OR circuit 155 is the carry output.

In the second 1-bit full adder, inputs A1 and B1 are inputs of a third 2-input XOR circuit 156 and a third 2-input AND circuit 157. An output of the third 2-input XOR circuit 156 and an output of the first 2-input OR circuit 155 are inputs of a fourth 2-input XOR circuit 158 and a fourth 2-input AND circuit 159. An output of the third 2-input AND circuit 157 and an output of the fourth 2-input AND circuit 159 are an input of a second 2-input OR circuit 160. Further, an output of the fourth 2-input XOR circuit 158 is the output S1, and an output of the second 2-input OR circuit 160 is Cout.

FIG. 16 is a view showing a truth table of the 2-bit adder operation of FIG. 15. In the 2-bit adder operation of FIG. 15, five inputs of the inputs A0, A1, B0, B1 and Cin, and three outputs of the outputs S0, S1 and Cout are used.

Figure 17:
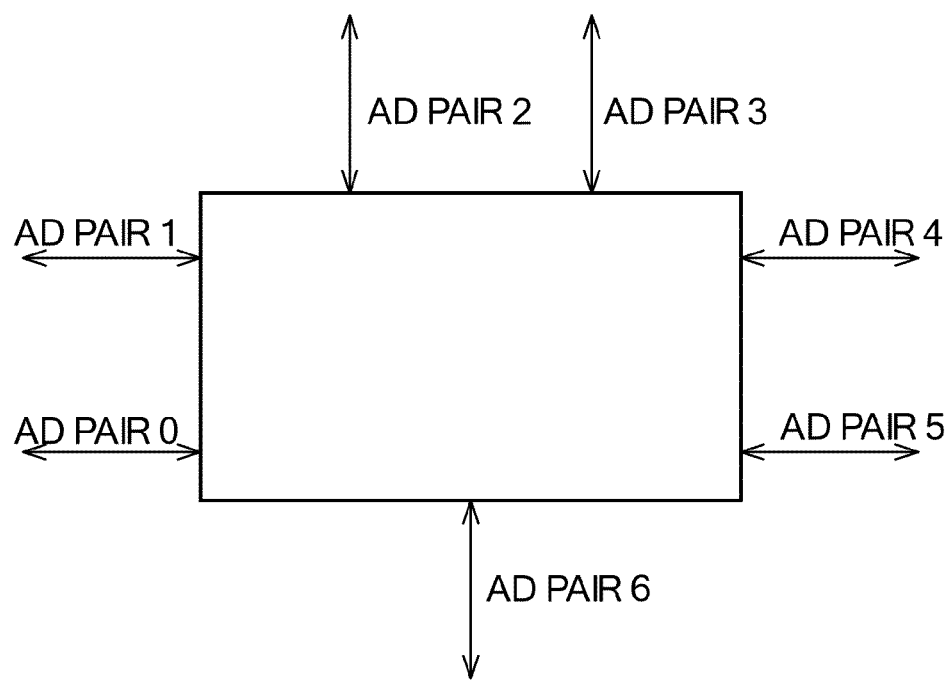
FIG. 17 is a view showing one example of the MLUT including seven AD pairs.

FIG. 17 is a view showing one example of the MLUT including seven AD pairs. In order to realize the 2-bit adder described in FIGS. 15 and 16 in the MLUT 30 shown in FIG. 17 as the truth table, it is required to use logic control address lines of five AD pairs as input lines, and logic control data lines of three AD pairs as output lines. Further, two AD pairs may be used for connection elements. Accordingly, a logic operation of the 2-bit adder as well as two connection elements may be realized in the MLUT 30 including seven AD pairs.

For example, the AD pair 0 is used for the input A0 and the output S0; the AD pair 1 is used for the input A1 and the output S1; the AD pair 2 is used for the input Cin and the output Cout; and the address line of the AD pair 3 is used for the input B0. Further, the address line of the AD pair 4 may be used for the input B1.

An adder is a circuit which is very commonly used when configuring an arithmetic circuit for four arithmetic operations, and the like. Further, in a normal arithmetic process, data of 2 bits or more is processed. Accordingly, it is advantageous to configure a 2-bit adder configured by five inputs and three outputs by a single MLUT, thereby improving an arrangement and a wiring efficiency of the MPLD. That is to say, by configuring the 2-bit adder by a single MLUT, the number of the arithmetic circuits which may be mounted on the MPLD having the same number of MLUTs may be increased. Further, it is also possible to provide logic circuits in which a wiring pattern is determined, such as a multi-bit adder or a multi-bit multiplier, as a module including a 2-bit adder.

Further, it is even more advantageous to realize 2-path connection elements as well as realizing the logic operation of the 2-bit adder in the MLUT having seven AD pairs, in consideration of the arrangement/wiring efficiency of the MPLD. That is to say, when executing the arrangement/wiring algorithm, the MLUT in which the 2-bit adder is arranged, may additionally include the connection elements. Accordingly, the degree of freedom in wiring the truth tables arranged in the MLUT may be increased. Note that since the MLUT operates as the logic elements and/or connection elements, the writing of truth table data into the MLUT means the arrangement of the logic operation and/or the wiring between the MLUTs. Accordingly, the generation of the truth table data is referred to as "the arrangement/wiring".

In this example, an embodiment of realizing the logic operation of the 2-bit adder and the connection elements at the same time in the MLUT having seven AD pairs has been explained. Alternatively, an MLUT having five AD pairs may realize the logic operation of a 2-bit adder. Further, an MLUT having six AD pairs may realize the logic operation of a 2-bit adder and one connection element. Still further, an MLUT having eight AD pairs may realize the logic operation of a 2-bit adder and three connection elements.

Still further, an MLUT having nine AD pairs may realize the logic operation of a 4-bit adder. Still further, an MLUT having ten AD pairs may realize the logic operation of a 4-bit adder and one connection element. In this manner, it is possible to improve the arrangement/wiring efficiency in MLUTs having approximately 5-10 AD pairs.

[2.5] Physical Arrangement of MLUT

Figure 18A:
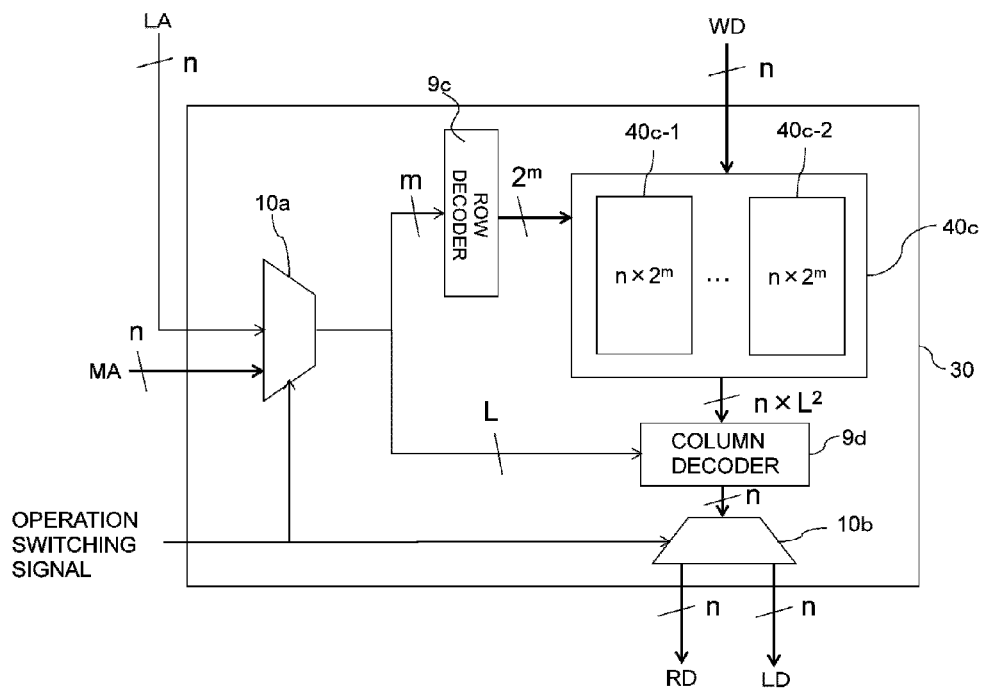
FIG. 18A is a view showing another example of the MLUT including seven AD pairs.

FIG. 18A is a view showing one example of the MLUT including seven AD pairs. The MLUT 30 shown in FIG. 18A includes an address row decoder 9c, an address column decoder 9d, and a storage element 40c. In the MLUT 30 shown in FIG. 18A, a logic operation address LA and write-in data WD, each including seven signals are inputted, and read-out data RD and logic operation data LD, each including seven signals are outputted. Since the address switching circuit 10a and the output data switching circuit 10b operate in the same manner as the circuits described with reference to FIG. 4, the description thereof will be omitted.

The address row decoder 9c decodes the logic operation address LA which is the m number of signal inputs, and outputs a word selection signal to m-th power of 2 number of word lines. The storage element 40c is $2^L$ number of storage element blocks ($40c$-1, ..., $40c$-$2^L$). Each storage element block includes $n \times 2^m$ number of storage elements, and is arranged in the connected portions of the $2^m$ number of word lines, n number of write-in data lines, and n number of output bit lines. Here, m is an integer of N-L, and L is an integer smaller than n. "n, m, L" may for example be "7, 5, 2" or "7, 4, 3".

The address column decoder 9d decodes the logic operation address LA which is the L number of signal inputs, generates L-th power of 2 number of block selection signals, and selects n number of output bit lines among the above described $2^L$ number of storage element blocks, by the block selection signals. For example, when L=2, there are $2^2=4$ number of storage element blocks, and each storage element block includes $2^5=32$ number of word lines and output bit lines. Accordingly, the address column decoder 9d selects 32 output bit lines of any storage element block by the block selection signal. Further, when L=3, there are $2^3=8$ number of storage element blocks, and each storage element block includes $2^4=16$ number of word lines and output bit lines. Accordingly, the address column decoder 9d selects 16 output bit lines of any storage element block by the block selection signal.

By providing the address column decoder 9d and expanding the storage element in the column direction, the length of the output bit lines may be reduced.

Figure 18B:
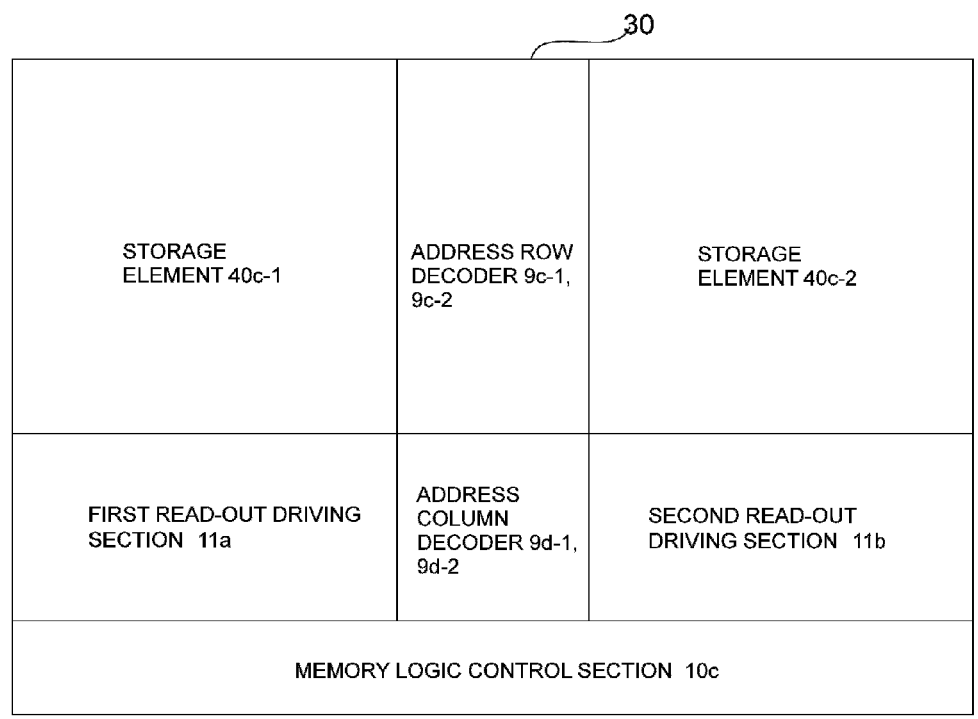
FIG. 18B is a view showing one example of a planer configuration of the MLUT including seven AD pairs.

FIG. 18B is a view showing a floorplan of the MLUT in which two MLUTs 30 shown in FIG. 18A are combined. The MLUT 30 shown in FIG. 18B includes the configuration of the MLUT shown in FIG. 18A. The MLUT 30 shown in FIG.

18B includes a memory logic control section 10c, address row decoders 9c-1, 9c-2, address column decoders 9d-1, 9d-2, storage elements 40c-1, 40c-2, and read-out driving section 11a, 11b.

Seven selection address lines which input seven selection address signals outputted from the memory logic control section 10c are respectively connected to the address row decoders 9c-1, 9c-2, and the address column decoders 9d-1, 9d-2. The address row decoder 9c-1 and the address column decoder 9d-1 respectively supply the word selection signal and the block selection signal to the storage element 40c-1. The address row decoder 9c-2 and the address column decoder 9d-2 respectively supply the word selection signal and the block selection signal to the storage element 40c-2.

Although not shown in the MLUT 30 of FIG. 18B, the logic operation address LA and the write-in data WD, each including seven signals are inputted, and the read-out data RD and the logic operation data LD, each including seven signals are outputted. Although also not shown in the MLUT 30 of FIG. 18B, a memory operation address MA and operation switching signals are inputted.

In the memory logic control section 10c, the address switching circuit 10a and the output data switching circuit 10b shown in FIG. 18A are arranged. The memory operation address MA, the logic operation address LA, the write-in data WD, the read-out data RD, and the logic operation data LD are respectively inputted and outputted to and from the MLUT 30 via the memory logic control section 10c.

The address row decoders 9c-1, 9c-2 are arranged between the storage element 40c-1 and 40c-2.

The first and the second read-out driving sections 11a, 11b are respectively arranged in between the first and the second storage element regions 40c, 40d, and the memory logic control section 10c. The first and the second read-out driving sections 11a, 11b are configured to amplify the seven bit signals read out from the storage element 40 arranged in the first and the second storage element regions 40c, 40d, so as to increase speed of the reading out.

In this example, the number of the selection address signals to be inputted to the address row decoders is four or five. By configuring the number of the selection address signals to five or less, the number of the word selection signals would be $2^4=16$ or $2^5=32$, which makes it possible to reduce the length of the output bit lines. Accordingly, a circuit configuration which does not require a sense amplifier and a pre-charge circuit which are essential configuration elements in general SRAM circuit may be realized. The MLUT 30 shown in FIGS. 18A and 18B does not require a scaled-up number of storage elements, unlike the general SRAM The number of the storage elements included in the MLUT is approximately $10 \times 2^{10}$ at most. This is a very small circuit compared to a SRAM memory as a storage device configured as a large-scale circuit generally having several M number of bits or more. Accordingly, when being mounted on a storage device which is used as a general SRAM memory, the sizes of the sense amplifier, the pre-charge circuit and the surrounding circuits which would not be a problem in downsizing, would be a problem in the circuit configuration of MLUT. The sense amplifier and the pre-charge circuit arranged in storage devices such as general SRAM memories are circuits that are arranged so as to prevent the transmission delay period of signals from being longer due to the time constant t generated in the wiring layers being increased. This is because the wiring length between the address decoders and the storage elements are long. Accordingly, by suppressing the time constant t generated in the wiring length between the address decoders and the storage elements such that the operation of the MLUT is not influenced therefrom, a configuration which does not require the sense amplifier and the pre-charge circuit may be realized. In the examples shown in FIGS. 18A and 18B, by configuring the number of the selection address signals to be inputted to the address row decoders to five or less, the wiring length between the address row decoders and the storage elements may be suppressed such that the operation of the MLUT is not influenced.

Further in this example, the address row decoder 9c is arranged between the first storage element region 40c and the second storage element region 40d. In storage devices such as the general SRAM memory, the address row decoder is arranged so as contact one side of the storage element region. By arranging the address row decoder in this manner, the storage element which is adjacent to the address row decoder and the storage element which is most distant from the address row decoder have different wiring length. Accordingly, the signal transmission delay periods from the address row decoder are different due to the time constant t generated in the wiring layer being different. As described above, since the configuration in this example does not have the sense amplifier and the pre-charge circuit, it is preferable to make the difference of the signal transmission delay period between each storage elements smaller. Thus, in this example, the storage element region is divided into the first storage element region 40c and the second storage element region 40d, having the same size, and the address row decoder 9c is arranged therebetween. In this manner, it is made possible to suppress the signal transmission delay period between each storage element.

In this example, the number of selection addresses of the address row decoder is five, however, the number of the selection addresses of the address row decoders may be configured to an arbitrary number of six or less. However, when the number of the address row decoders is not suitable, the wiring length of the address row decoders is increased, which may not realize a suitable circuit. Here, the MLUT having seven AD pairs has been explained, however, the number of AD pairs may be an arbitrary number ranging in 5-10, by adjusting the number of selection addresses to be wired to the address row decoders and the address column decoders.

[2.6] Second Example of MLUT

The MLUT being used as the 1-port storage element has been explained with reference to FIGS. 4-18A. Further, an MLUT which is used as a 2-port storage element described below is also applicable.

Figure 19:
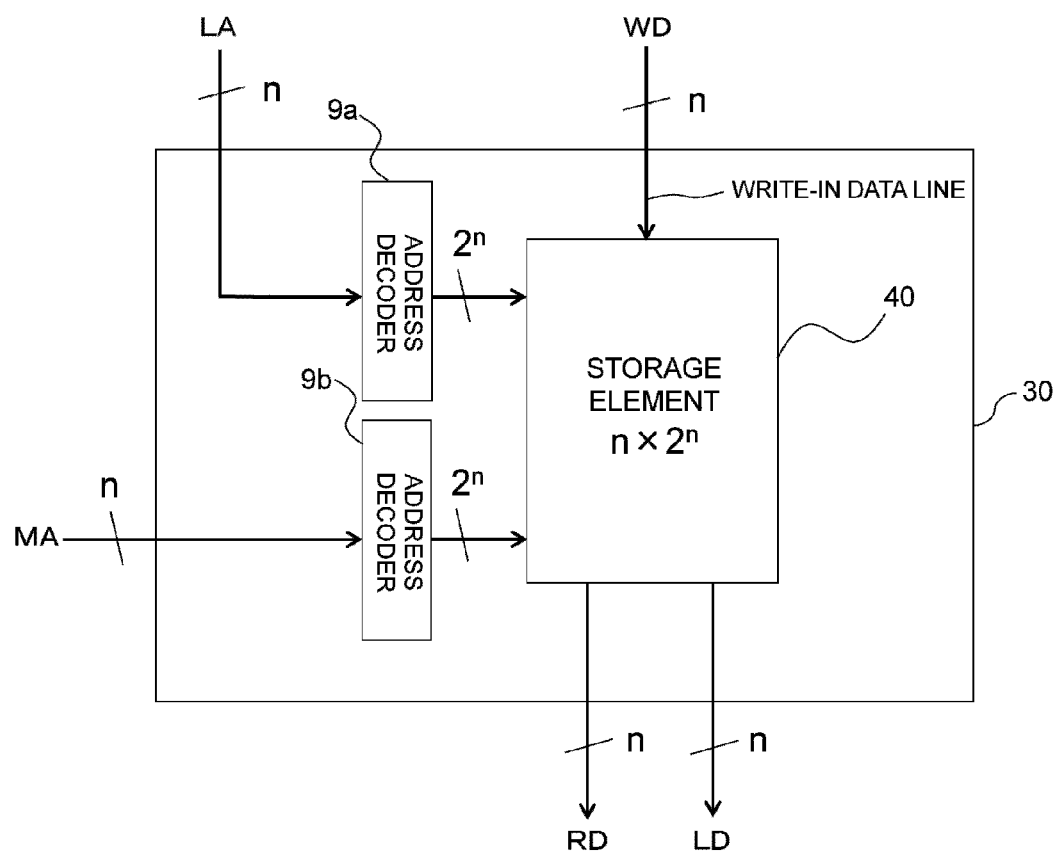
FIG. 19 is a view showing a second example of MLUT.

FIG. 19 is a view showing a second example of an MLUT. The MLUT 30 shown in FIG. 19 may perform writing in and reading out data at the same time. The MLUT 30 shown in FIG. 19 includes a memory operation address decoder 9a, a logic operation address decoder 9b, and a storage element 40. The MLUT shown in FIG. 19 may perform the logic operation and the memory operation at the same time, unlike the MLUT shown in FIG. 4. Accordingly, the MLUT 30 shown in FIG. 19 does not require the operation switching selection signal, and does not include the address switching circuit 10a and the output data selection circuit 10b, unlike the MLUT shown in FIG. 4, and instead has each of address decoders 9a, 9b. Other than these, the MLUT has the same configuration as that shown in FIG. 4. Note that the storage element included in the MLUT 30 shown in FIG. 18B is a 2-port storage element which enables writing in and reading out of data.

[2.7] 2-Port Storage Element

Figure 20:
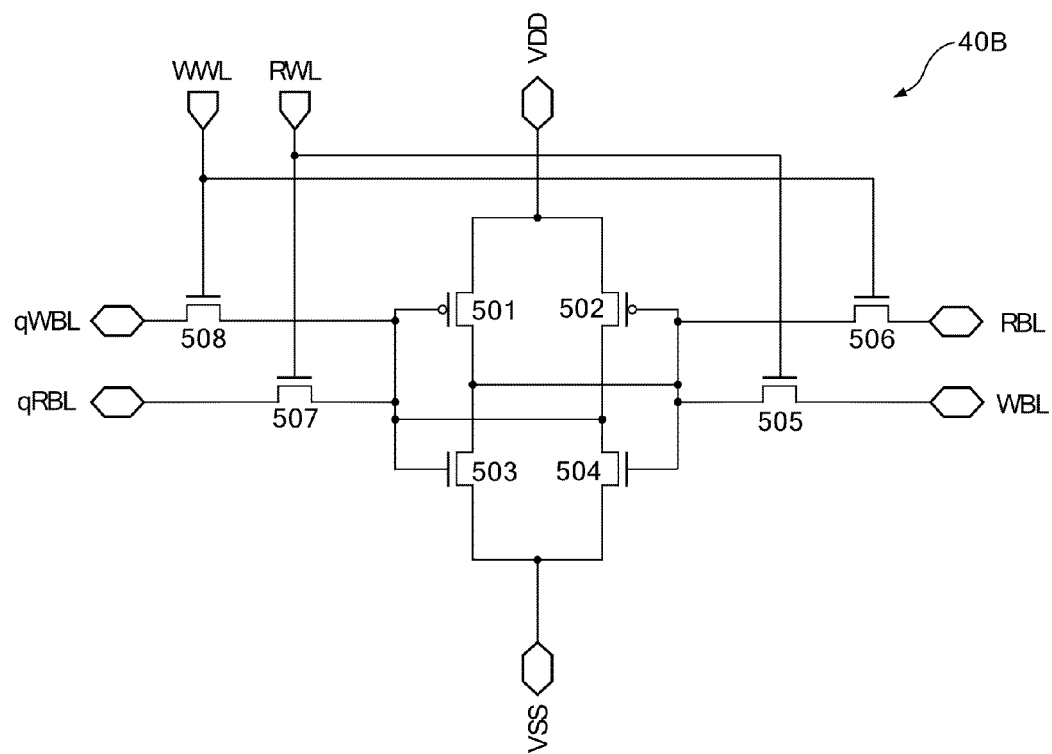
FIG. 20 is a view showing one example of 2-port storage element.

FIG. 20 is a view showing one example of the 2-port storage element. In the example shown in FIG. 20, the 2-port storage element 40B is a SRAM, and includes a first and a second pMOS transistors 501, 502, and a first to a sixth nMOS transistors 503-508.

As shown in FIG. 20, the 2-port SRAM 40 configured by a plurality of MOS transistors is connected to VDD, VSS, a write-in word line WWL, a read-out word line RWL, a first write-in bit line WBL, a second write-in bit line qWBL, a first read-out bit line RBL, and a second read-out bit line qRBL. The signal applied to the first write-in bit line WBL is an inversion signal of the signal applied to the second write-in bit line qWBL. In the same manner, the signal applied to the first read-out bit line RBL is an inversion signal of the signal applied to the second read-out bit line qRBL.

The source of the first pMOS transistor 501 and the source of the second pMOS transistor 502 are connected to the VDD. The drain of the first pMOS transistor 501 is connected to the source of the first nMOS transistor 503, the gate of the second pMOS transistor 502, the gate of the second nMOS transistor 504, the source of the third nMOS transistor 505, and the source of the fourth nMOS transistor 506.

The gate of the first pMOS transistor 501 is connected to the gate of the first nMOS transistor 503, the drain of the second pMOS transistor 502, the drain of the second nMOS transistor 504, the source of the fifth nMOS transistor 507, and the source of the sixth nMOS transistor 508. The drain of the first nMOS transistor 503 and the drain of the second nMOS transistor 504 are connected to the VSS.

The drain of the third nMOS transistor 505 is connected to the first write-in bit line WBL. The gate of the third nMOS transistor 505 is connected to the read-out word line RWL. The drain of the fourth nMOS transistor 506 is connected to the first read-out bit line RBL. The gate of the fourth nMOS transistor 506 is connected to the write-in word line WWL.

The drain of the fifth nMOS transistor 507 is connected to the second read-out bit line qRBL. The gate of the fifth nMOS transistor 507 is connected to the read-out word line RWL. The drain of the sixth nMOS transistor 508 is connected to the second write-in bit line qWBL. The gate of the sixth nMOS transistor 508 is connected to the write-in word line WWL.

By the above described configuration, in the write-in operation, the 2-port SRAM 40 retains the signal level of the first write-in bit line WBL and the second write-in bit line qWBL by the signal level "H" of the write-in word line WWL.

By the above described configuration, in the read-out operation, the 2-port SRAM 40 retains the signal level of the first read-out bit line RBL and the second read-out bit line qRBL by the signal level "H" of the read-out word line RWL.

In this manner, the memory operation address MA and the logic operation address LA may perform the memory operation or the logic operation only for a part of the $n \times 2^n$ number of storage elements by activating one word line of the storage element. Further, since the memory operation address MA and the logic operation address LA are connected to the entire storage elements in the MLUT 30, the memory operation or the logic operation may be performed for the entire $n \times 2^n$ number of storage elements. Note that the MLUT including a 2-port storage element may perform the memory operation and the logic operation at the same time.

[2.8] Third Example of MLUT

Figure 21:
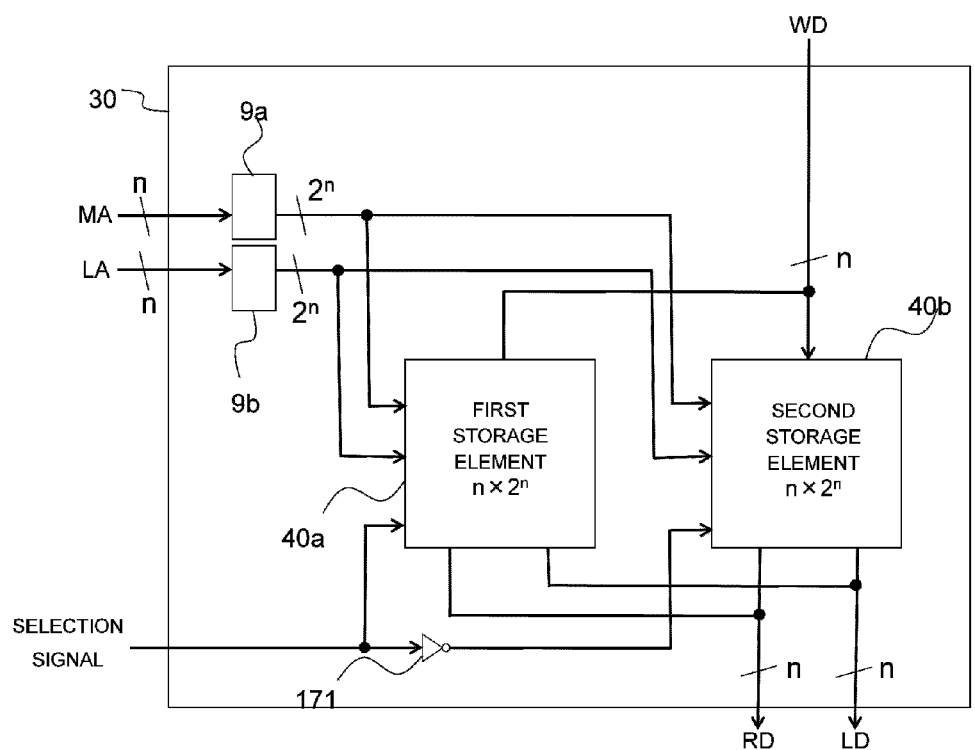
FIG. 21 is a view showing a third example of MLUT.

FIG. 21 is a view showing a third example of MLUT. The MLUT 30 shown in FIG. 21 includes an address decoder 9a, an address decoder 9b, a first storage element 40a, a second storage element 40b, and a NOT circuit 171. In the MLUT 30 shown in FIG. 21, the memory operation address MA, the logic operation address LA, the write-in data WD and the select signal are inputted, and the read-out data RD and the logic operation data LD are outputted.

The difference between the MLUT according to the third example and the MLUT according to the second example is that the first storage element 40a and the second storage element 40b may respectively perform differently by the select signal. That is to say, the first storage element 40a and the second storage element 40b are configured so that when one is selected for the logic operation, the other is selected for the memory operation.

The NOT circuit 171 includes an input terminal into which the select signal is inputted, and an output terminal to which an inversion signal of the select signal is outputted.

The $n \times 2^n$ number of the first and the second storage elements 40 respectively include $2^n$ number of memory operation word terminals (not shown), $2^n$ number of logic operation word terminals (not shown), n number of write-in data terminals (not shown), n number of read-out data terminals (not shown), n number of logic operation data output terminals (not shown), and a select terminal (not shown). Each of the memory operation word terminals connected to the memory operation word terminal is configured to select n number of storage elements. In the same manner, each of the logic operation word terminals connected to the logic operation word terminal is configured to select n number of storage elements. The write-in data WD is inputted into the write-in data terminal. The write-in data WD is used when the MLUT is subjected to the memory operation or the reconfiguration. However, the write-in data WD is not used when the truth table data written into the MLUT is read out. That is to say, the write-in data WD is configured so as not to be applied to the storage element when the truth table data written into the MLUT is read out, and to be a high impedance input. The read-out data terminals output data stored in the n number of storage elements selected by the memory operation word terminals. In the same manner, the logic operation data output terminals output data stored in the n number of storage elements selected by the logic operation word terminals.

The select signal is inputted into the select terminal of the first storage element. An output signal of the NOT circuit, that is, an inversion signal of the select signal is inputted to the select terminal of the second storage element. In this manner, the first storage element and the second storage element are configured so that when one is selected for the logic operation, the other is selected for the memory operation. By this configuration, a dynamic reconfiguration is made possible. That is to say, such configuration is allowed for one storage element to perform the logic operation and the other storage element to perform the memory operation.

[3] Structure of MLUT

A description is given for the structure of the MLUT. First each MLUT arrangement structure which is arranged in the MLUT regions is explained. Next, a connection structure of the AD pairs in the MLUT is explained. And finally, one embodiment of a structure of the MLUT region is explained.

[3.1] Arrangement Structure of MLUT

Here, each MLUT arrangement structure which is arranged in the MLUT regions is explained. First, a matrix arrangement structure of the MLUT is explained, followed by the explanation of an alternate arrangement structure of the MLUT.

[3.1.1] Matrix Arrangement Structure of MLUT

Figure 22:
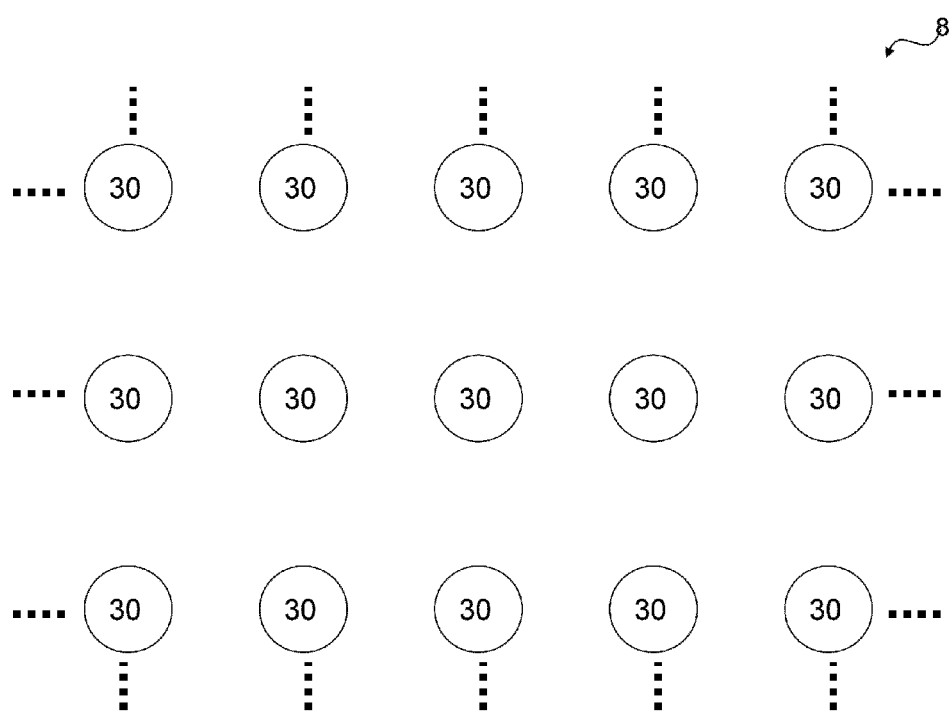
FIG. 22 is a plan view showing a first example of MLUT arrangement.

FIG. 22 is a plan view showing a first example of the MLUT arrangement. A first example of an arrangement of the MLUT in the MLUT region will be described with reference to FIG. 22. In FIG. 22, the MLUTs are described in circles for illustrative purposes. However, as described above, in normal embodiments of the present invention, the planer shape of the MLUTs is a rectangle or a square. Further, in the following description, the MLUTs may be described as circles, however, it should be understood that each MLUT has a rectangle or a square shape.

In FIG. 22, the MLUTs 30 are arranged in a matrix. MLUT region 8 is a region where the MLUTs 30 are arranged in the semiconductor device. MLUTs 30 are arranged, in the MLUT region 8, in a first direction with an interval of the same distance, and in a second direction which is perpendicular to the first distance with an interval of the same distance as that in the first direction, or of a different distance from that in the first direction. The MLUTs 30 thus arranged, whereby the MLUTs 30 may be connected in a regular manner when the MLUTs 30 are wired with short distance. Note that the wiring with short distance is referred to as the wiring which connects MLUTs adjacent to each other.

[3.1.2] Alternate Arrangement Structure

Figure 23:
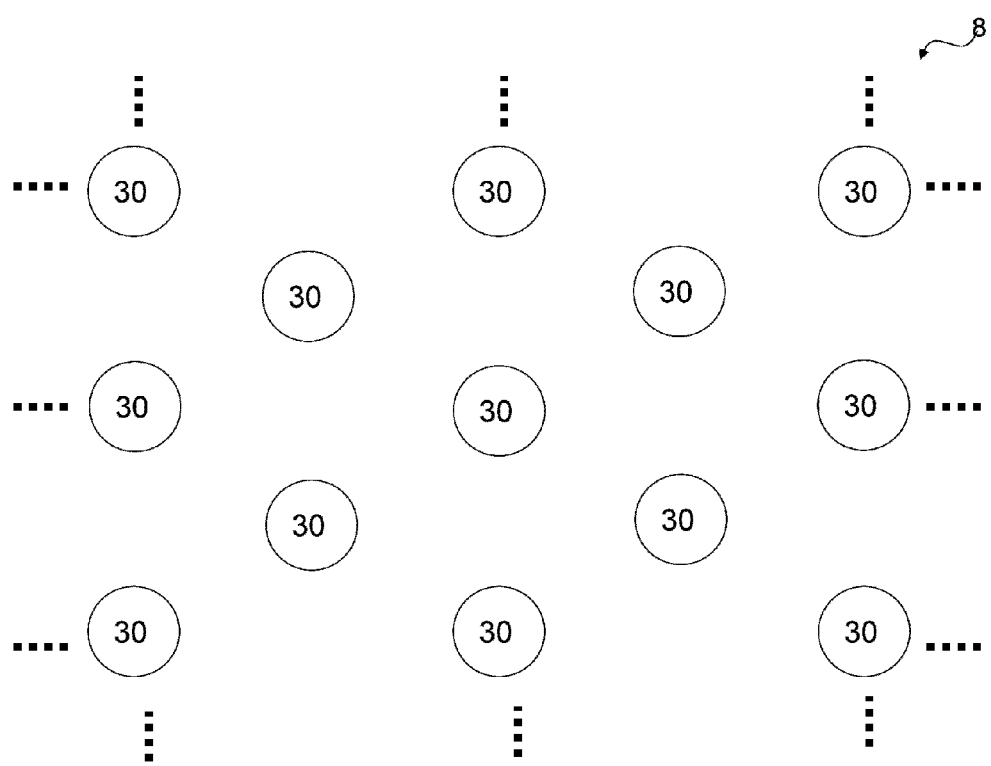
FIG. 23 is a plan view showing a second example of the MLUT arrangement.

FIG. 23 is a plan view showing a second example of the MLUT arrangement. A second example of an arrangement of the MLUT in the MLUT region 8 will be described with reference to FIG. 23. In the second example shown in FIG. 23, MLUTs 30 are arranged in a first direction with an interval of the same distance, and in a second direction which is perpendicular to the first distance with an interval of the same distance. In addition, MLUTs 30 are arranged in four directions different from the first and the second direction with an interval of the same distance. In this description, such arrangement structure is referred to as an alternate arrangement structure. Note that, preferably, the distance between the MLUTs in the first and the second directions and the distance between the other MLUTs arranged in the four directions may be the same. Further, the MLUTs 30 arranged in the four directions may be arranged at the intersections of diagonal lines of a rectangle configured by two MLUTs 30 arranged in the first direction and two MLUTs 30 arranged in the second direction. In such case, each of the MLUTs 30 is arranged in the same interval respectively in the first direction and in the second direction which is perpendicular to the first direction. Further, the MLUTs 30 may also be arranged in the same interval in the third and the fourth directions which are different from the first and the second directions.

[3.2] AD Pair Connection Structure Between MLUTs

[3.2.1] AD Pair Connection Structure

Figure 24:
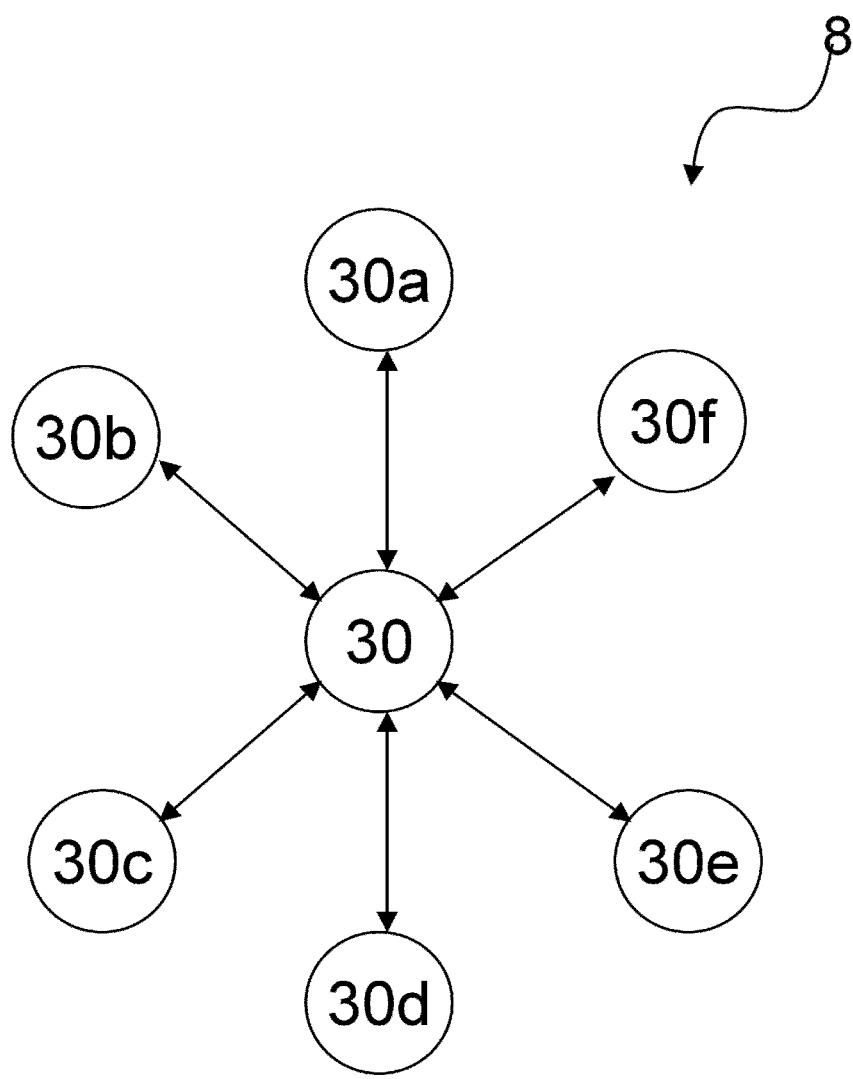
FIG. 24 is a view showing one example of the connection in the MLUT.

FIG. 24 is a view showing one example of the connection in the MLUTs. The AD pairs shown here are used as input/output signal lines of MPLD when the MLUTs operate as the truth table. The MLUTs respectively include a memory operation address line, a memory operation data line, and other wirings such as a control signal line, which are used when the MLUTs are used as a memory circuit. However, the wirings other than the AD pairs are omitted in FIG. 24 for simplifying the explanation. The connections between the adjacent MLUTs, that is to say, the wirings with short distance will be described with reference to FIG. 24. Note that separated wirings are referred to as wirings of AD pairs connecting between the MLUTs, that are not the wirings with short distance. In FIG. 24, an MLUT 30 including six AD pairs, a first MLUT 30a, a second MLUT 30b, a third MLUT 30c, a fourth MLUT 30d, a fifth MLUT 30e and a sixth MLUT 30f, which are adjacent to the MLUT 30, are alternately arranged. Further, in FIG. 24, the direction parallel to the straight line connecting the first MLUT 30a and the fourth MLUT 30d is assumed as the vertical direction, and the direction parallel to the straight line connecting the second MLUT 30b and the sixth MLUT 30f is assumed as the horizontal direction.

In this example, each AD pair included in the MLUT 30 is adjacently wired to respectively different MLUTs. That is to say, the first AD pair is connected to the adjacent first MLUT 30a. The second AD pair is connected to the adjacent second MLUT 30b. The third AD pair is connected to the adjacent third MLUT 30c. The fourth AD pair is connected to the adjacent fourth MLUT 30d. The fifth AD pair is connected to the adjacent fifth MLUT 30e. The sixth AD pair is connected to the adjacent sixth MLUT 30f.

Figure 25:
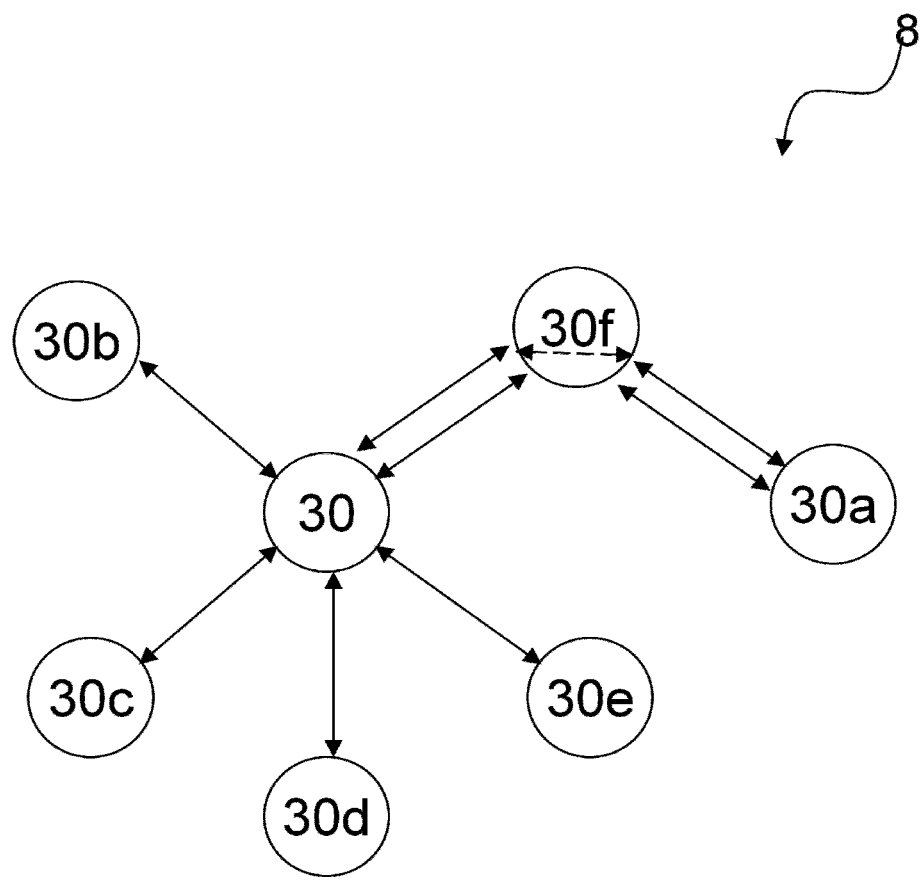
FIG. 25 is a view showing an example of connecting MLUTs distantly arranged with each other via an adjacent MLUT.
Figure 26A:
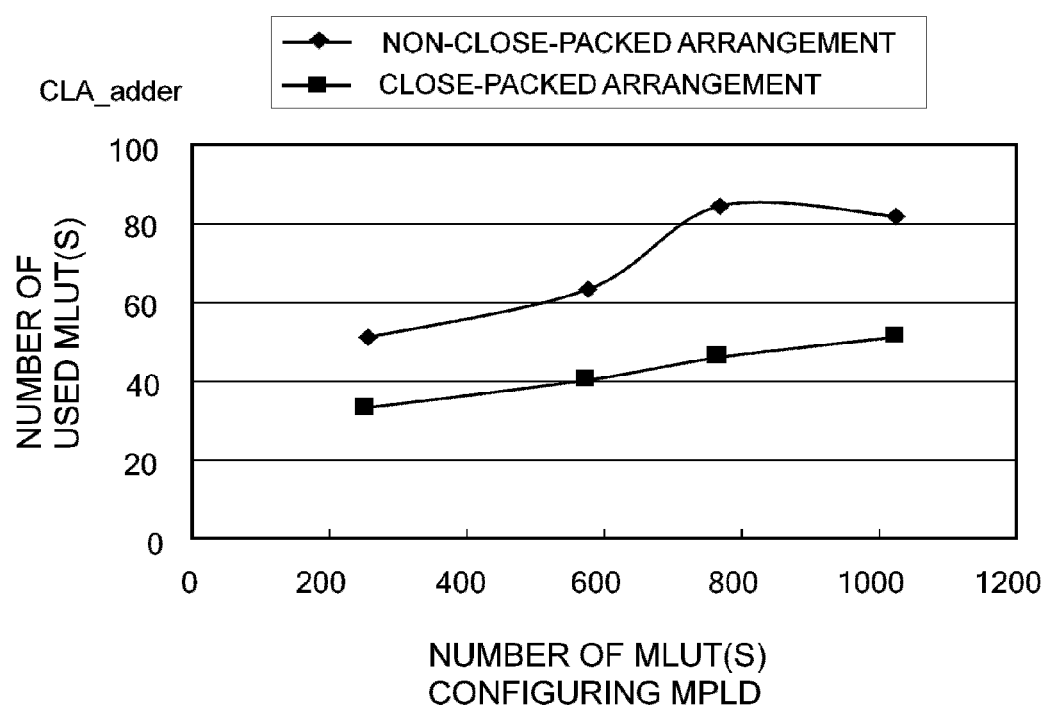
FIG. 26A is a view showing one example of the number of MLUTs required to configure a desired logic circuit.
Figure 26B:
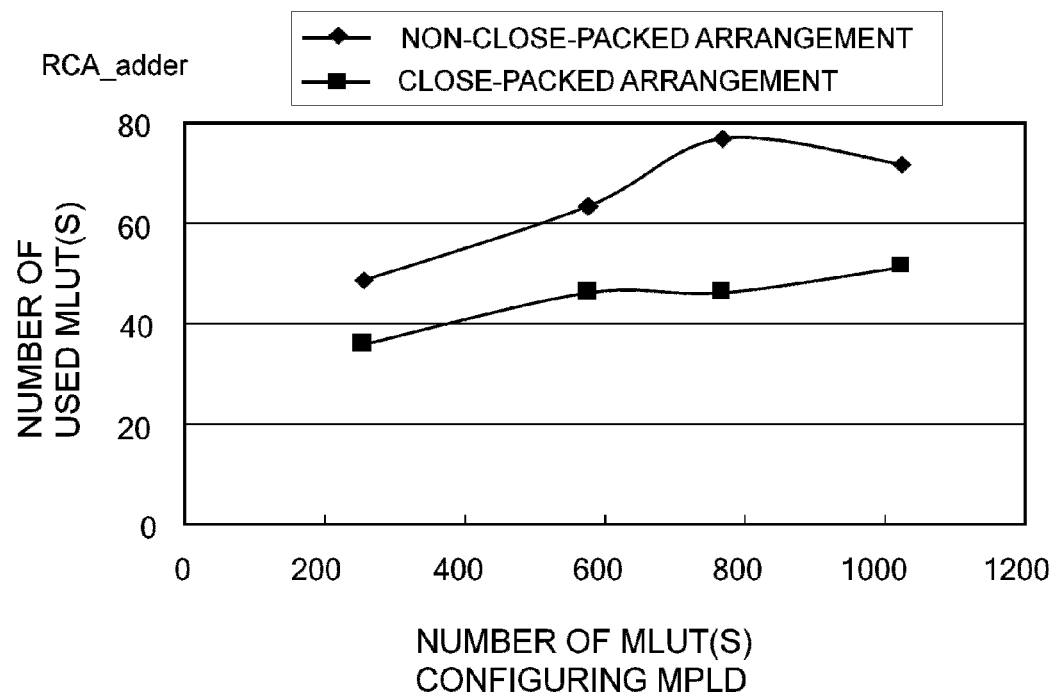
FIG. 26B is a view showing another example of the number of MLUTs required to configure a desired logic circuit.
Figure 26C:
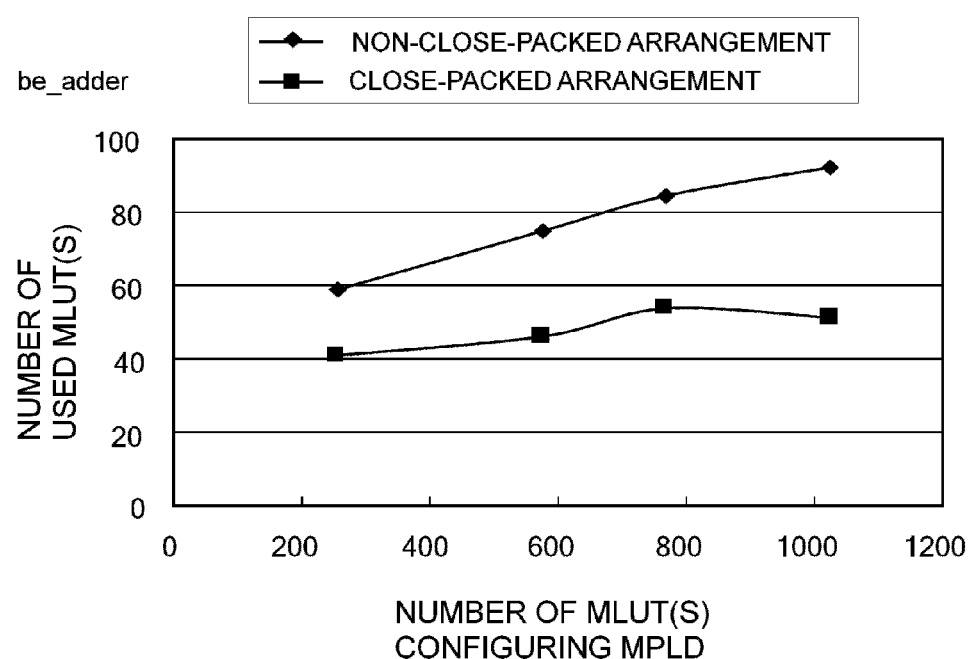
FIG. 26C is a view showing still another example of the number of MLUTs required to configure a desired logic circuit.
Figure 26D:
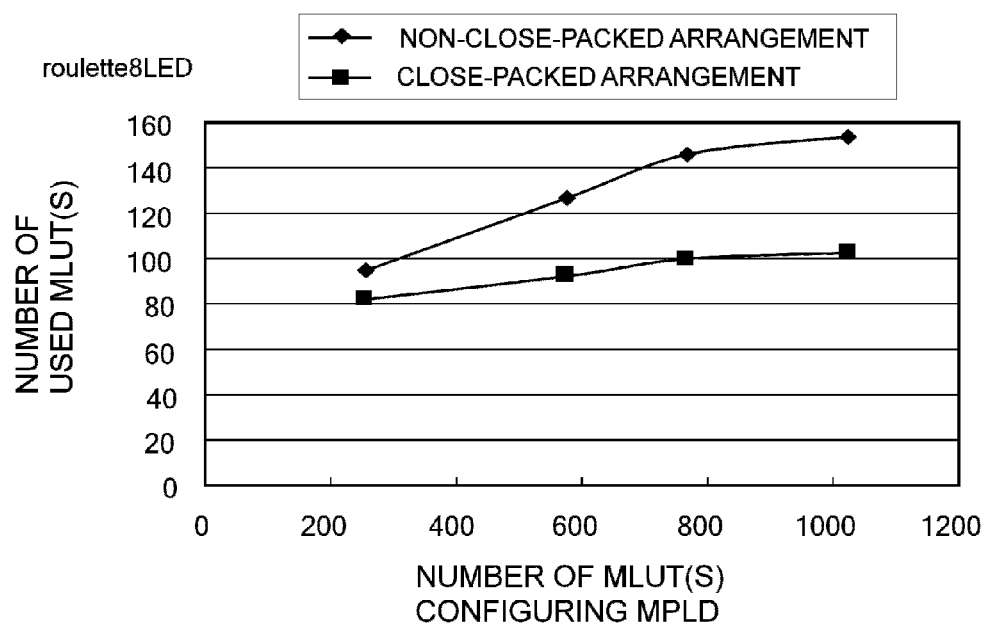
FIG. 26D is a view showing still another example of the number of MLUTs required to configure a desired logic circuit.

FIG. 25 is a view showing one example of connecting MLUTs distantly arranged with each other via an adjacent MLUT. In this case, the MLUT 30f operates as a connection element to perform connection between the MLUT 30a and the MLUT 30. When the MLUT 30f is used as the connection element to connect the MLUT 30a and the MLUT 30 which are distantly arranged with each other in this manner, a part of the truth table of the MLUT 30f is used for the connection of the MLUT 30 and the MLUT 30a, whereby the scale of the logic circuit that can be realized by the truth table in the MLUT 30f will be smaller. As shown in FIG. 25, when the MLUTs 30 and 30a which are distantly arranged with each other are connected by using the adjacent MLUT as the connection element, the total number of MLUT required to configure a desired logic configuration is to be increased compared to the MLUTs shown in FIG. 24.

Figure 27:
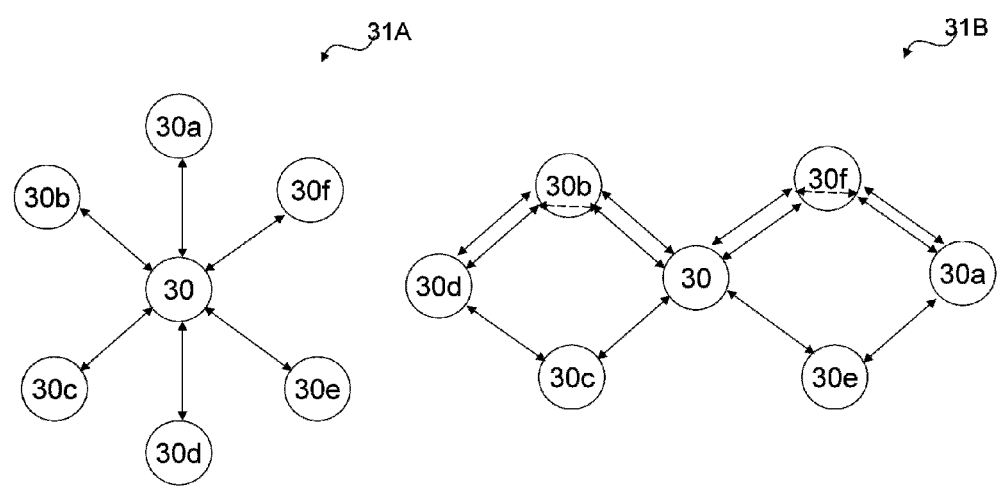
FIG. 27 is a view showing a close-packed arrangement configuration and a non-close-packed arrangement configuration.

FIGS. 26A-26D are views respectively showing one example of the number of MLUTs required to configure a desired logic circuit. FIG. 27 is a view showing a close-packed arrangement configuration 31A which is an MLUT structure connecting adjacent MLUTs by AD pairs, and a non-close-packed arrangement configuration 31B which is an MLUT structure connecting distantly arranged MLUTs by AD pairs. The desired logic circuit is realized by arranging and wiring circuits such as a CLA adder, an RCA adder, a be adder, an 8-roulette LED circuit, and the like to an MPLD including approximately 200-1000 number of MLUTs by an automatic arrangement/wiring tool.

As a result, in all of the circuit configurations used in comparisons, the MPLDs having the close-packed arrangement configuration 31A had the higher arrangement/wiring efficiency than the MPLDs having the non-close-packed arrangement configuration 31B, in the MPLDs having any size. Accordingly, the MPLDs having the close-packed arrangement configuration 31A can reduce the total number of MLUTs configuring a desired logic circuit than the MPLDs having the non-close-packed arrangement configuration 31B.

Figure 28:
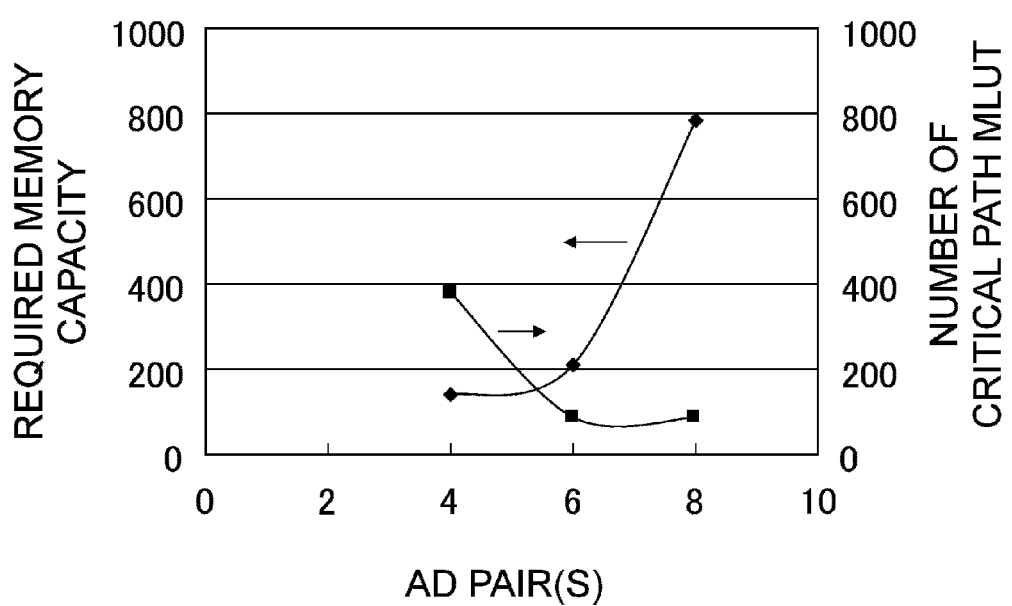
FIG. 28 is a view showing one example of the number of AD pairs in the close-packed arrangement configuration.

FIG. 28 is a view showing one example of the number of AD pairs in the close-packed arrangement configuration. In FIG. 28, a required memory capacity and the number of critical path cells for a 32-bit multiplier circuit of a manual configuration are calculated. As shown in the figure, the number of critical path MLUTs is decreased when the number of AD pairs included in the MLUT is six or more. The required memory capacity is increased when the number of AD pairs included in the MLUT is six or more. Such results indicate that when the number of AD pairs is small, the number of MLUTs inserted to the wirings for switching between the MLUTs each operating as a logic circuit at the time of arranging and wiring the desired logic circuit to the MPLD 20 is increased. When the number of the AD pairs is small, the number of MLUTs which function as the connection element is limited. Accordingly, there is a possibility that the MLUTs operating as the logic circuit may not be wired therebetween, unless passing through a number of MLUTs which function as the connection element. As a result, when the number of AD pairs is small, the number of MLUTs required to realize a logic circuit may increase. In the example of FIG. 28, it is preferable that five AD pairs among the N number of AD pairs included in the MLUT are used to configure the truth table as the logic circuit. Accordingly, the number of AD pairs included in the MLUT is preferably five or more.

On the other hand, when the number of AD pairs included in the MLUT is increased, it is estimated that the number of AD pairs per MLUT actually used when arranged and wired is decreased. Then, the arrangement/wiring efficiency may thus be lowered. In the case of the 32-bit multiplier circuit shown in FIG. 28 is manually arranged and wired, when the number of the AD pairs is eight, the region required for the arrangement/wiring was four times larger than that when the number of AD pairs is six.

[3.2.2] AD Connection Structure in the Matrix Arrangement Structure

Figure 29:
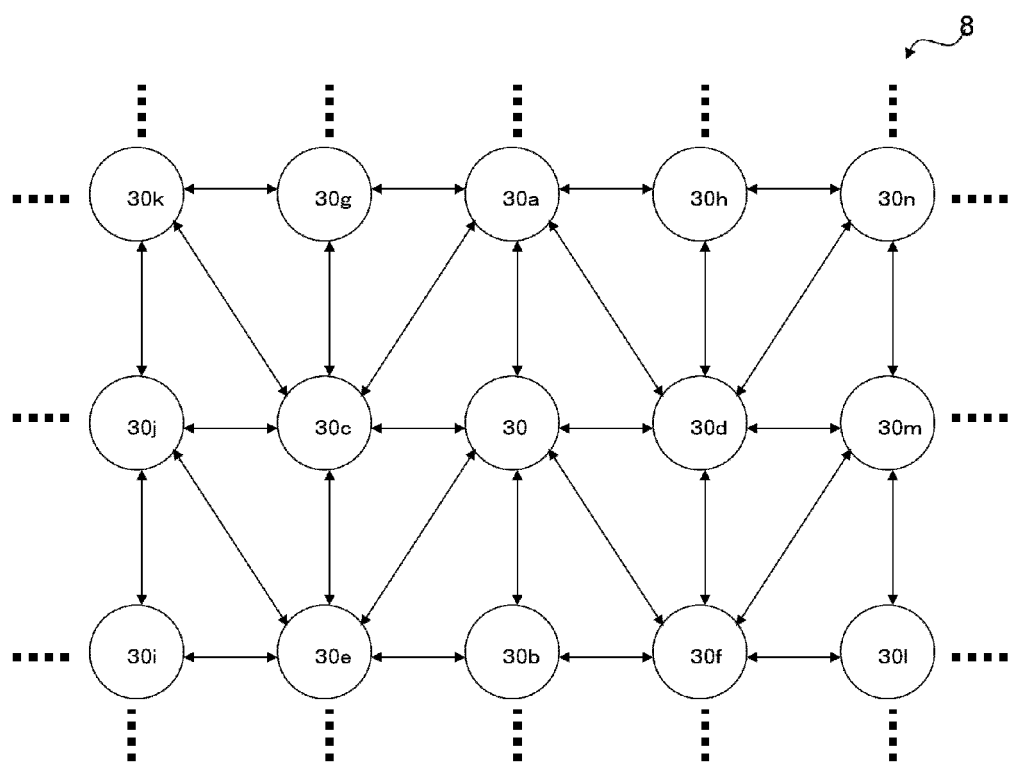
FIG. 29 is a view showing one example of a connection configuration of AD pairs in the MLUT.

FIG. 29 is a view showing one example of a connection configuration of AD pairs in the MLUT. The MLUTs 30 are arranged in a matrix, each having six AD pairs. In FIG. 29, the direction parallel to the straight line connecting the MLUT 30 and the MLUT 30a is assumed as the vertical direction of the MLUT region 8. Further, the direction parallel to the straight line connecting the MLUT 30 and the MLUT 30c is assumed as the horizontal direction of the MLUT region 8. The MLUTs 30 include the first and the second AD pairs which are connected with the close distance wiring to the MLUTs 30a and 30b arranged in the vertical direction; the third and the fourth AD pairs which are connected with the close distance wiring to the MLUTs 30c and 30d arranged in the horizontal direction; and the fifth and the sixth AD pairs which are connected with the close distance wiring to the MLUTs 30e and 30f adjacent to each other arranged in the horizontal direction with respect to the MLUT 30 in the vertical direction.

In this example, two AD pairs of an MLUT arranged in a certain column (for example, the MLUT 30) are connected with a short distance wiring to two MLUTs adjacent in the horizontal direction of an MLUT adjacent in a direction of a first column. Further, two AD pairs of the MLUTs arranged in a column adjacent to such column (which are, for example, the MLUTs 30c and 30d) are connected with a short distance wiring to two MLUTs adjacent in the horizontal direction of an MLUT adjacent in a direction of a second column which is an opposite direction of the direction of the first column. By these close distance wiring, the AD pairs connecting the adjacent MLUTs may have a structure not intersecting with each other in the same plane.

Note that in this example, the fifth and the sixth AD pairs of the entire MLUTs are respectively connected with the short distance wiring to two MLUTs adjacent in the horizontal direction of an MLUT arranged in the vertical direction. However, a structure in which these AD pairs are connected with the short distance wiring to an MLUT adjacent in the vertical direction of an MLUT arranged in a horizontal direction may alternatively be applied. For example, the fifth and the sixth AD pairs of the MLUT 30 may be connected with the short distance wiring to two MLUTs 30e and 30g adjacent in the vertical direction of the MLUT 30 arranged in the horizontal direction.

[3.2.3] AD Connection Structure in Alternate Arrangement Structure

Figure 30:
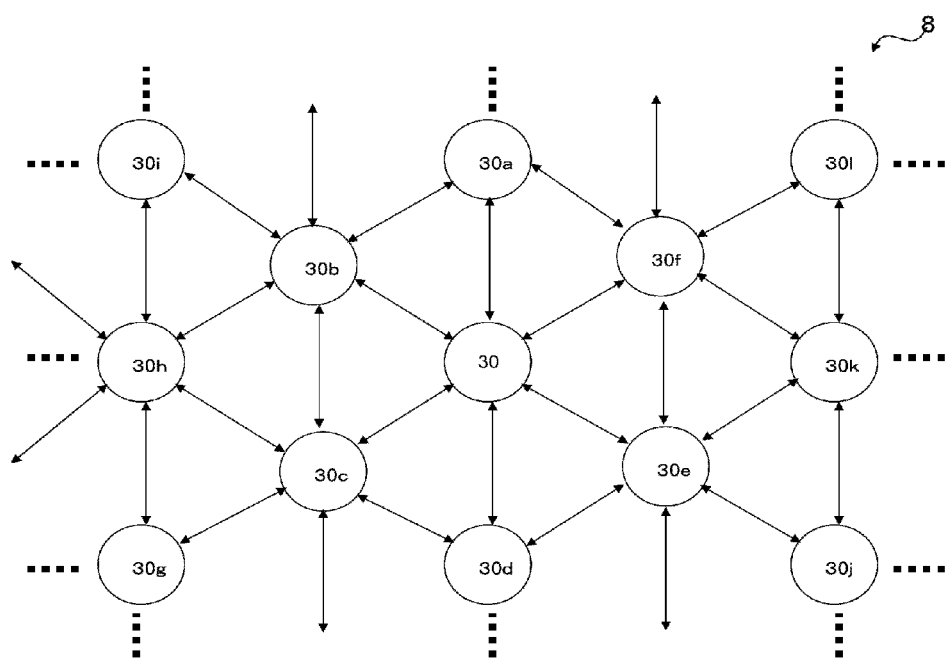
FIG. 30 is a view showing another example of a connection configuration of AD pairs in the MLUT.

FIG. 30 is a view showing another example of a connection configuration of AD pairs in the MLUT. The MLUTs 30 are arranged in a six direction arrangement structure, each having six AD pairs. In FIG. 30, the direction parallel to the straight line connecting the MLUT 30 and the MLUT 30a is assumed as the vertical direction of the MLUT region 8. Further, the direction parallel to the straight line connecting the MLUT 30b and the MLUT 30f is assumed as the horizontal direction of the MLUT region 8.

The MLUTs 30 include the first and the second AD pairs which are connected to two MLUTs 30a and 30d arranged in the vertical direction; and the third, the fourth, the fifth, and the sixth AD pairs which are connected with the short distance wiring to four MLUTs 30b, 30c, 30e and 30f arranged in both positions adjacent to a column adjacent to the column in which the MLUT 30 is arranged.

In this example, the AD pairs connecting the MLUTs may have a structure not intersecting with each other in the same plane. Further, the connection structure of the AD pairs of the entire MLUTs may have the same structure. Note that in this example, two AD pairs of the entire MLUTs are connected to an MLUT arranged in the vertical direction, however, these AD pairs may alternatively take structures being connected to an MLUT arranged in the horizontal direction. That is to say, the first and the second AD pairs of the MLUT 30 may be connected with the short distance wiring to two MLUTs 30h and 30k, in place of being connected with the short distance wiring to the MLUTs 30a and 30d arranged in the horizontal and vertical direction.

[3.2.4] AD Connection Structure of MLUT Including D Flip-Flop

Figure 31:
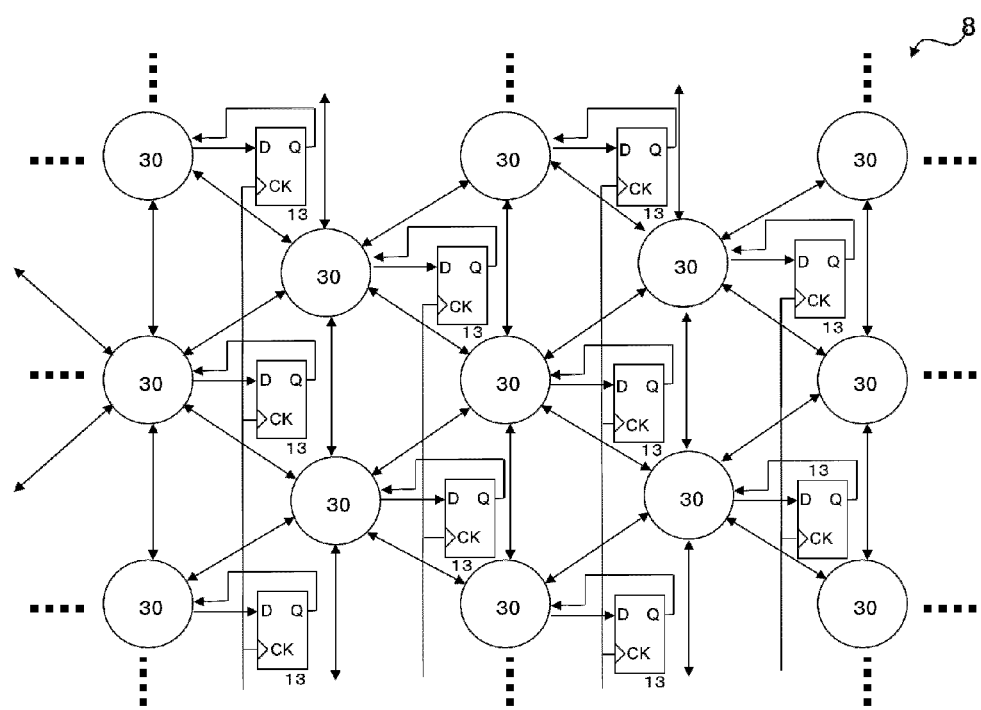
FIG. 31 is a view showing still another example of a connection configuration of AD pairs in the MLUT.

FIG. 31 is a view showing still another example of a connection configuration of AD pairs in the MLUT. The MLUTs are respectively arranged in the alternate arrangement structure, each having seven AD pairs. Further, the MLUTs are respectively arranged adjacent to a D flip-flop 13. Among the seven AD pairs included in the MLUT, six AD pairs are connected with the short distance wiring to respectively adjacent six MLUTs. The remaining one AD pair is connected to the adjacent D flip-flop 13. The six AD pairs to be connected with the short distance wiring may have the same connection structure as that shown in FIG. 30. As to the remaining one AD pair, an address line thereof is connected to a D input of the D flip-flop 13, and a data line thereof is connected to a Q output. All of the CK inputs of the D flip-flop 13 are connected, whereby the entire D flip-flops 13 may be operated by one clock signal. Further, the CK inputs of the D flip-flops 13 may be connected for each column, whereby the D flip-flops 13 may be operated for each column having different clock signals. Still further, the CK inputs of the D flip-flops 13 may be connected for each number of groups, the number being arbitrary such as 8 or 16, whereby the D flip-flops 13 may be operated for each group having different clock signals.

In this example, since the D flip-flop is connected to one AD pair of each MLUT, a sequential circuit can be formed in the MLUT region. In the MLUT region configured by MLUTs only including the function of configuring the truth table, it is possible to configure a combination circuit, whereas configuring a sequential circuit is difficult. However, in this example, the D flip-flop is connected to one AD pair of each MLUT, whereby forming the sequential circuit is made possible.

Note that in this example, D flip-flop is connected to the AD pairs, however, other flip-flops such as a set/reset flip-flop, a T flip-flop, or a JK flip-flop may alternatively be connected thereto. Further, a D flip-flop including inputs/outputs such as a set input, a reset input, or a QB output may also be connected thereto. Still further, the data line of the MLUT connected to the Q output of the D flip-flop may be connected to the QB output of the D flip-flop. Still further, not all of the respective MLUTs are required to include AD pairs to be connected to the D flip-flop, and a structure may be applied in which only a predetermined proportion of the MLUTs among the MLUTs configuring the MLUT region may include the AD pairs to be connected to the D flip-flop. Still further, in the following description, connecting one AD pair in the MLUT to a D flip-flop may be referred to as a "D flip-flop connection".

[3.2.5] AD Pair Connection Structure in MLUT Including Separated Wiring

Figure 32:
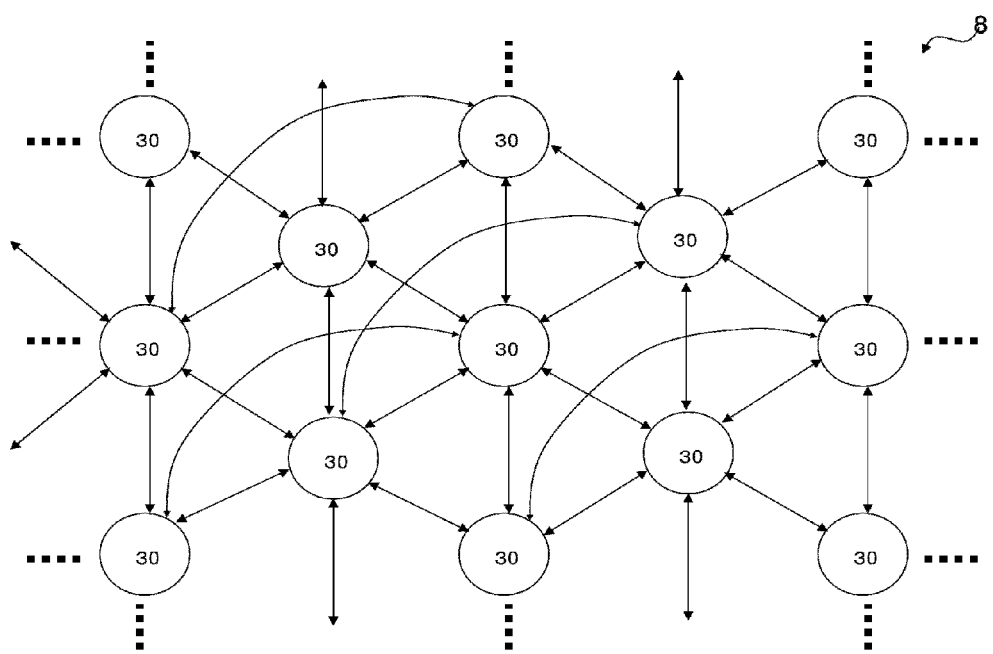
FIG. 32 is a view showing still another example of a connection configuration of AD pairs in the MLUT.

FIG. 32 is a view showing still another example of a connection configuration of AD pairs in the MLUT. The MLUTs 30 are respectively arranged in the alternate arrangement structure, each having seven AD pairs. Among the seven AD pairs included in the MLUT, six AD pairs are connected with the short distance wiring to respectively adjacent six MLUTs 30. The remaining one AD pair is connected to an MLUT changed by one column for each column.

In this example, since each MLUT 30 includes one separated wiring, the separated wiring can decrease the transmission delay period of data, compared to connecting the MLUTs by using the MLUT 30 as a connection element. Further, the separated wiring may increase a wiring flexibility when the logic circuit is arranged and wired in the MLUT region 8. Note that the separated wirings are referred to as connection wirings between the MLUTs, that are not the wirings with short distance. Accordingly, by connecting an MLUT with another MLUT which is not adjacent to each other, the above described effects of the separated wiring are obtained.

Note that in this example, the entire MLUTs respectively include AD pairs with separated wirings, although a structure may be applied in which only a predetermined proportion of the MLUTs includes the AD pairs with separated wirings. For example, a structure may be applied in which one AD pair of a predetermined proportion of the MLUTs is used as the separated wiring, and one AD pair of the other MLUTs is connected to the D flip-flop.

[3.3] Structure of MLUT Region

[3.3.1] Overall Structure of MLUT Region

Figure 33:
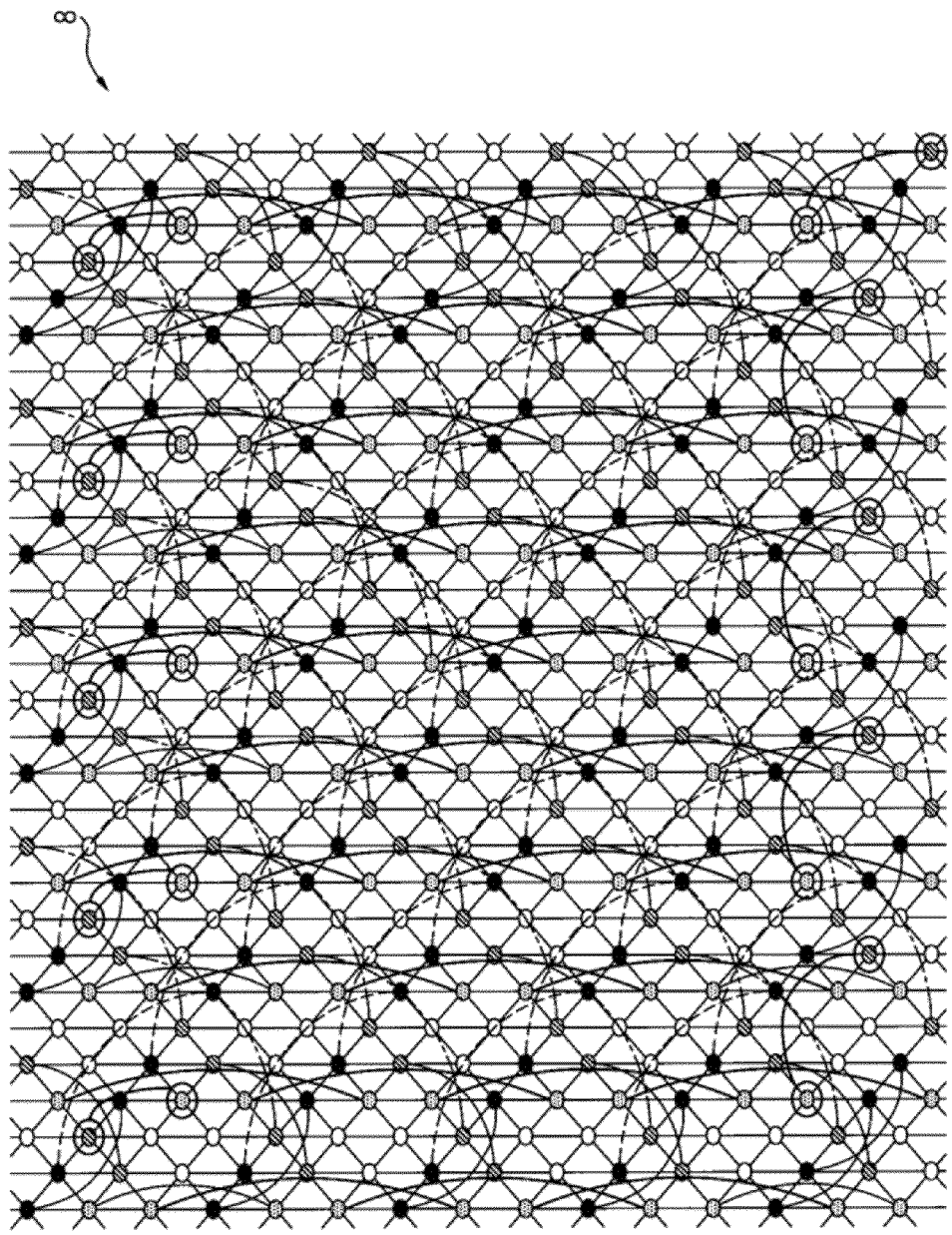
FIG. 33 is a view showing still another example of a connection configuration of AD pairs in the MLUT.

FIG. 33 is a view showing still another example of a connection configuration of AD pairs in the MLUT. One example of the overall structure of the MLUT region according to this example will be described with reference to FIG. 33. In this example, the MLUT region 8 includes 450 number of MLUTs 30 arranged in the alternate arrangement structure of 30 rows×15 columns. Each of the MLUTs includes seven AD pairs, and six AD pairs and used as short distance wiring. The remaining one AD pair is used for separated wiring or D flip-flop connection. In the figure, an MLUT which is not connected with separated wirings is connected to a D flip-flop.

In this example, MLUT region is explained by using an MLUT including seven AD pairs arranged in the alternate arrangement structure of 30 rows×15 columns. However, it should be clearly understood for a person skilled in the art that an MLUT region may be configured by using MLUTs with other arrangements. Further, among the MLUTs arranged in the MLUT region, the proportion of the MLUT connected with separated wirings and the MLUTs connected to D flip-flops may be arbitrary selected based on the usage and function of an MPLD to be used. Still further, in this example, the arrangement structure of the MLUT is the alternate arrangement structure, although a similar connection structure as this example may be included also in a matrix arrangement structure. That is to say, a structure may be applied in which the arrangement structure of the MLUT is topologically converted from the alternate arrangement structure to the matrix arrangement structure, while maintaining the wiring structure of this example.

[3.3.2] Structure of MLUT Blocks

Figure 34:
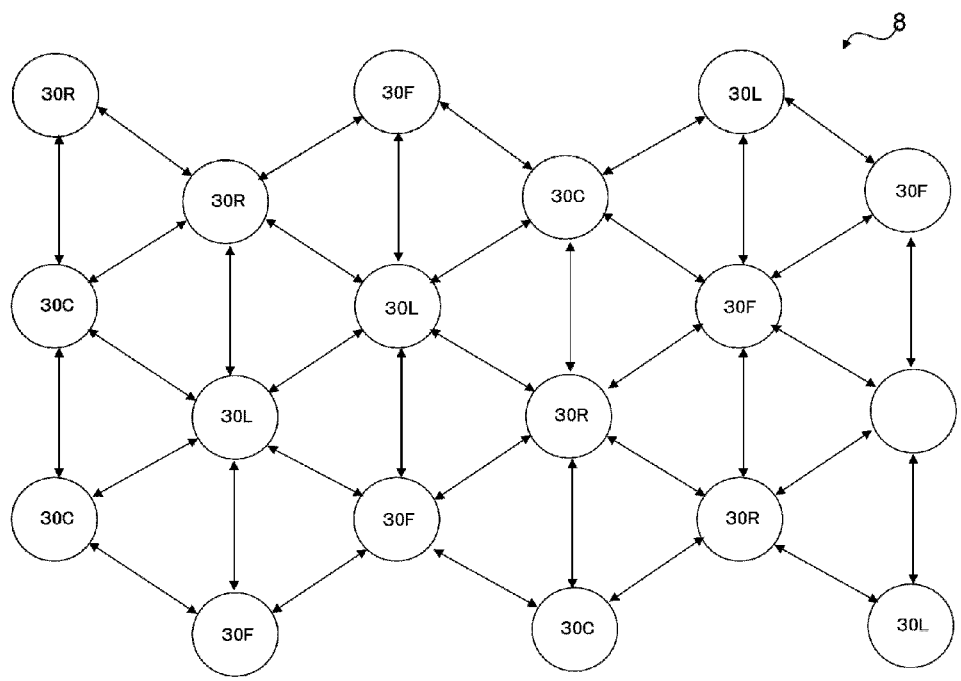
FIG. 34 is a view showing one example of an MLUT block including the MLUTs.

FIG. 34 is a view showing one example of an MLUT block including the MLUTs. In this example, the MLUT block is configured by MLUTs of 3 rows×6 columns as one block. The respective MLUTs in each block are connected with the separated wirings or the D flip-flop connection, in accordance basically to the same wiring regulation.

Hereinbelow, the basic wiring regulation is described.

Six AD pairs are used for short distance wirings. This regulation is also applied to the MLUTs 30 arranged in an end portion of the MLUT region 8. Accordingly, the MLUT region 8 in this example includes AD pairs arranged with the short distance wirings as input/output line AD pairs, and such AD pairs may be connected to other configuration elements arranged in the semiconductor device 100.

In six MLUTs among the 18 number of MLUTs 30 included in one MLUT block, one AD pair is connected to the D flip-flop. Accordingly, in the MLUT region of this example, a third number of MLUTs are connected to D flip-flops. Concretely, such MLUTs are the MLUTs 30 allotted with the reference numeral of "30F" in FIG. 34. That is to say, such MLUTs are the ones arranged in the second and the third columns from the left on the lower row; the fifth and the sixth columns from the left on the center row; and the third and the sixth columns from the left on the upper row.

The remaining 12 MLUTs included in one MLUT block are connected with the separated wirings. Among the separated wirings, four separated wirings are connected by a first separated wiring pattern in which MLUTs arranged in vertical direction are connected. Another four separated wirings are connected by a second separated wiring pattern in which MLUTs aligned from the lower left to the upper right are connected. The remaining four separated wirings are connected by a third separated wiring pattern in which MLUTs aligned from the lower right to the upper left are connected.

The MLUTs connected by the first separated wiring pattern are the ones arranged in the first and the fourth columns from the left on the lower row; the first column from the left on the center row; and the fourth column from the left on the upper row. Such MLUTs are allotted with the reference numeral of "30C" in FIG. 34. The MLUT arranged in the fourth column from the left on the lower row and the MLUT arranged in the first column from the left on the center row are respectively connected to the one separated by five MLUTs in the upper vertical direction with the separate wirings. The MLUT arranged in the first column from the left on the lower row and the MLUT arranged in the fourth column from the left on the upper row are respectively connected to the one separated by five MLUTs in the lower vertical direction.

The MLUTs connected by the second separated wiring pattern are the ones arranged in the sixth column from the left on the lower row; the second and the third columns from the left on the center row; and the fifth column from the left on the upper row. Such MLUTs are allotted with the reference numeral of "30L" in FIG. 34. The MLUT arranged in the sixth column from the left on the lower row and the MLUT arranged in the third column from the left on the center row are respectively connected to the one separated by five MLUTs in the upper right direction with the separate wirings. The MLUT arranged in the second column from the left on the center row and the MLUT arranged in the fifth column from the left on the upper row are respectively connected to the one separated by five MLUTs in the lower left direction.

The MLUTs connected by the third separated wiring pattern are the ones arranged in the fifth column from the left on the lower row; the fourth column from the left on the center row; and the first and the second columns from the left on the upper row. Such MLUTs are allotted with the reference numeral of "30R" in FIG. 34. The MLUT arranged in the fourth column from the left on the center row and the MLUT arranged in the first column from the left on the upper row are respectively connected to the one separated by five MLUTs in the upper left direction with the separate wirings. The MLUT arranged in the fifth column from the left on the lower row and the MLUT arranged in the second column from the left on the upper row are respectively connected to the one separated by five MLUTs in the lower right direction.

Figure 35:
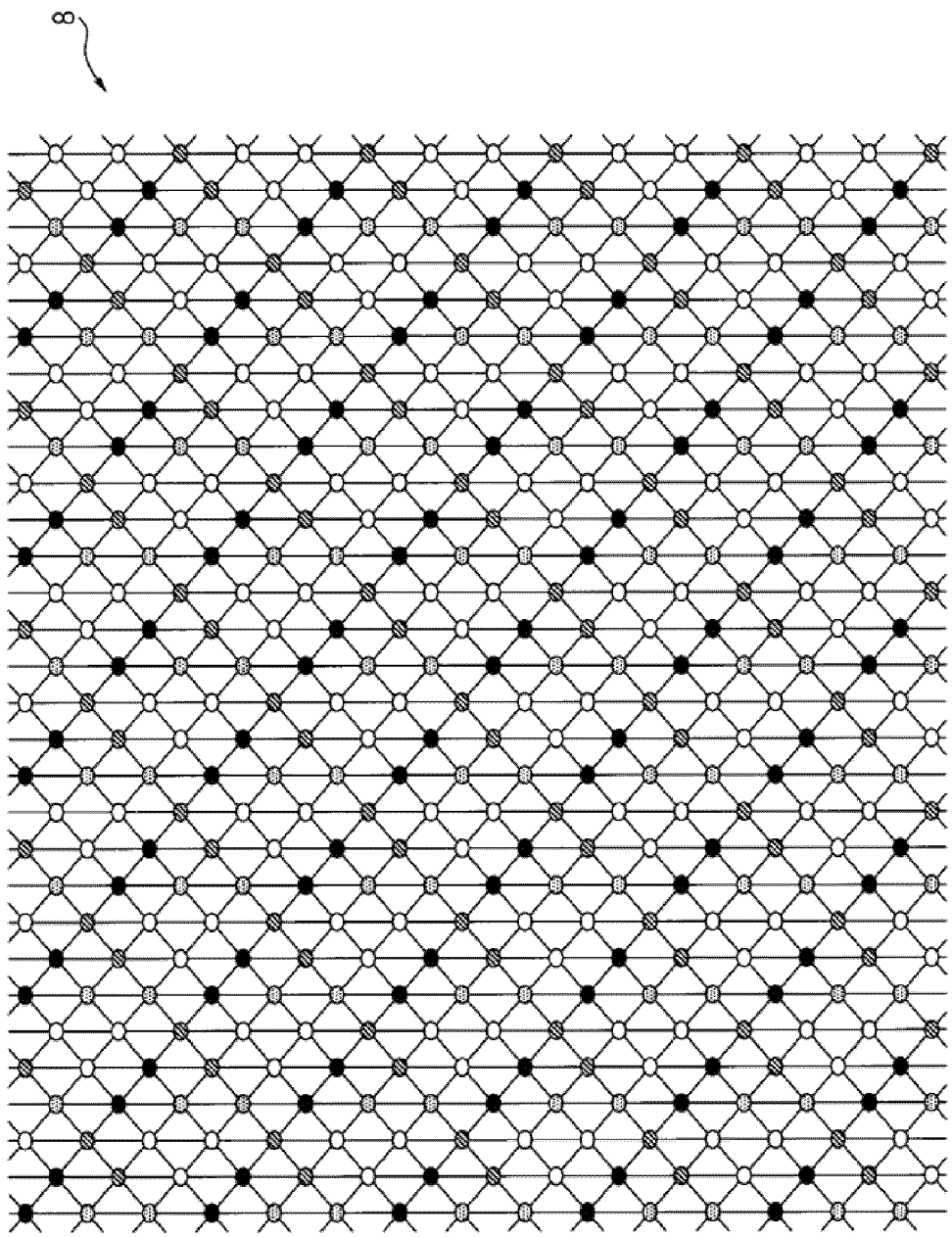
FIG. 35 is a view showing one example of an arrangement of a short distance wiring pattern in an MLUT region including MLUTs arranged in 30 rows×15 columns.

FIG. 35 is a view showing one example of an arrangement of a short distance wiring pattern in an MLUT region including MLUTs arranged in 30 rows×15 columns. In FIG. 35, 450 MLUTs described in circles and short distance wirings which respectively connect six adjacent MLUTs are described. Some of the AD pairs included in the MLUT 30 arranged in an end portion of the MLUT region 8 are not yet connected. As described above, such unconnected AD pairs may be connected to other configuration elements of the semiconductor device such as an input/output circuit section 15, an internal bus circuit, and the like.

Figure 36:
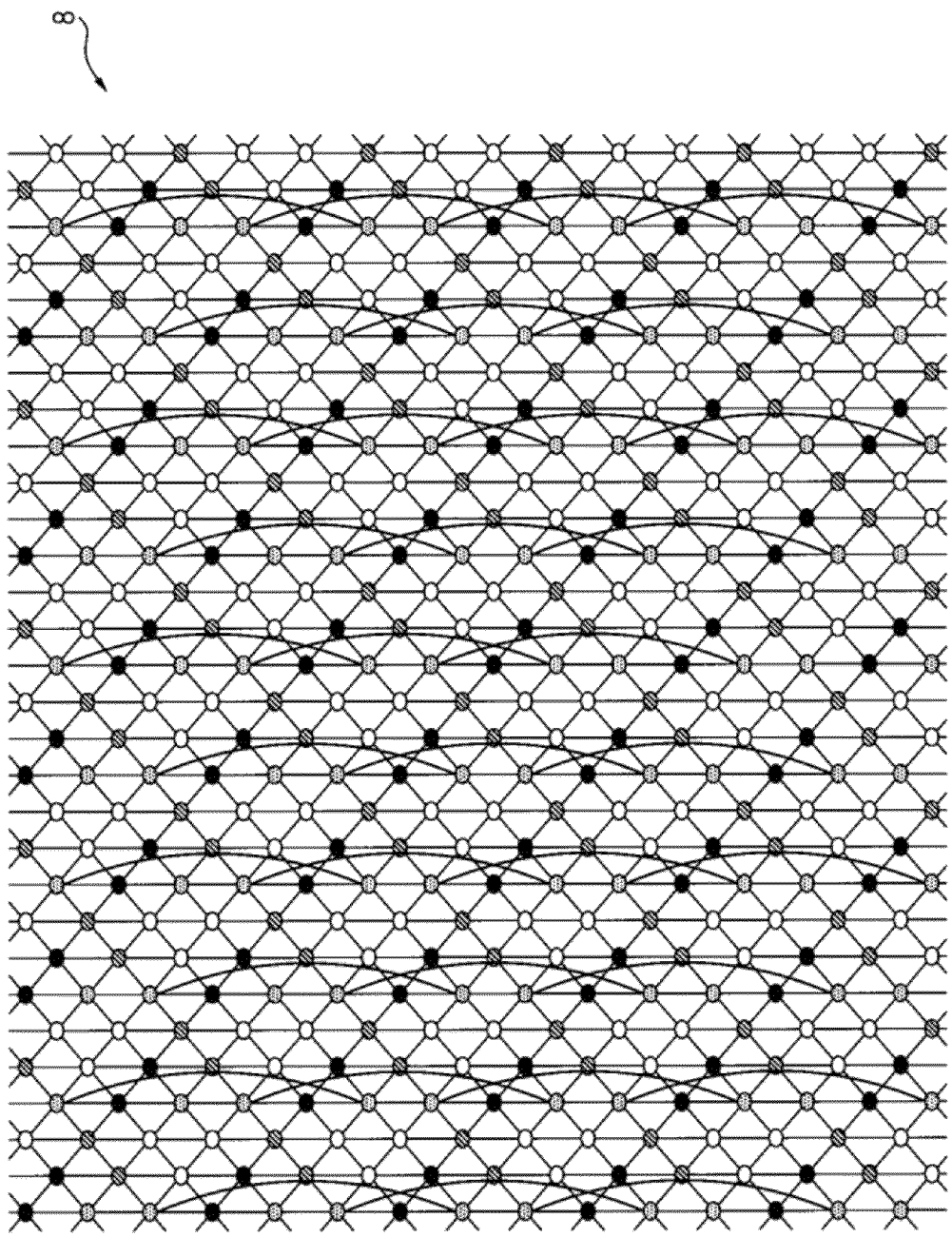
FIG. 36 is a view showing an arrangement of a first separated wiring pattern in an MLUT region including MLUTs arranged in 30 rows×15 columns.
Figure 37:
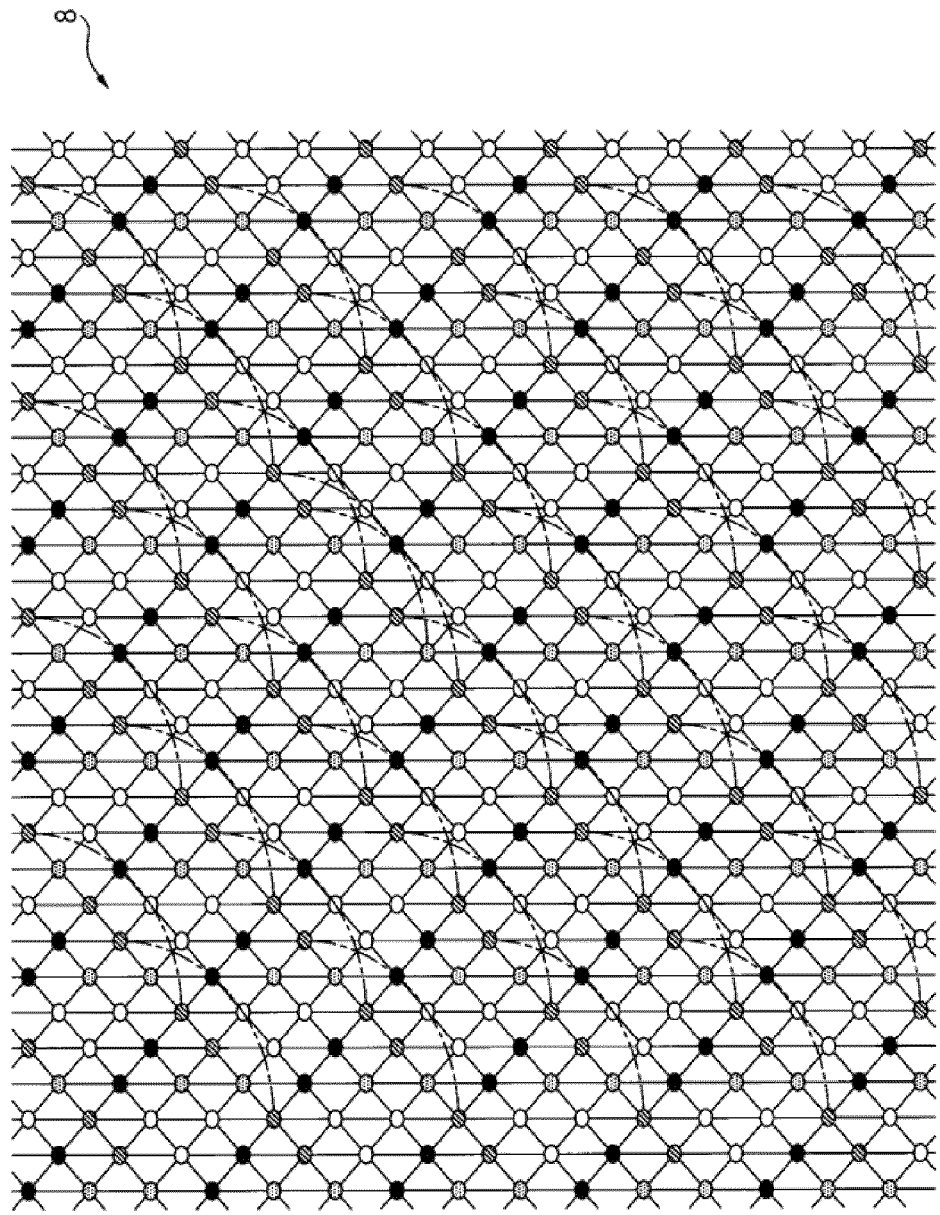
FIG. 37 is a view showing an arrangement of a second separated wiring pattern in the MLUT region including MLUTs arranged in 30 rows×15 columns.
Figure 38:
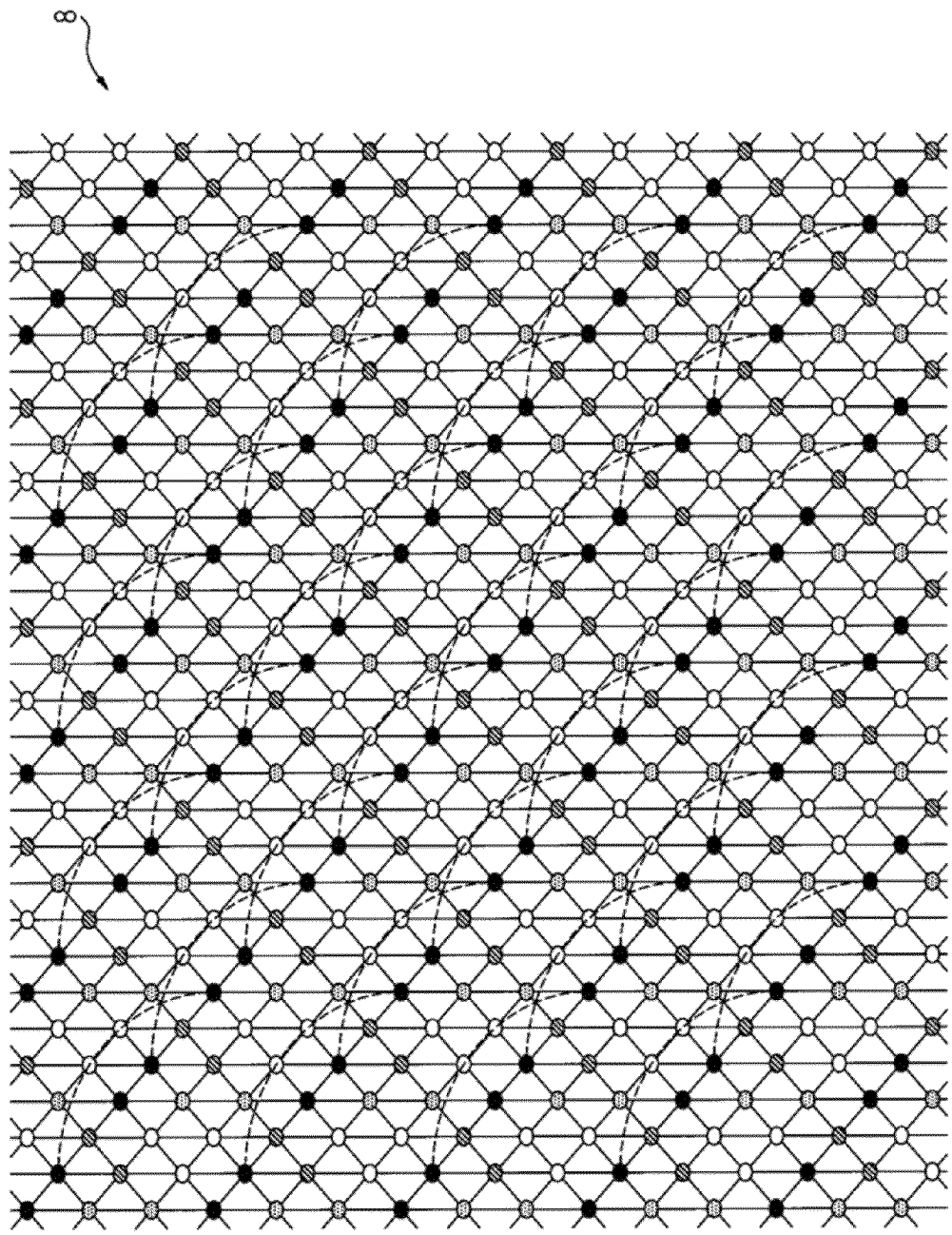
FIG. 38 is a view showing an arrangement of a third separated wiring pattern in the MLUT region including MLUTs arranged in 30 rows×15 columns.

FIGS. 36-38 are views showing arrangements of the first to the third separated wiring patterns in an MLUT region of this example. Hereinbelow, one example of arrangements of the first to the third separated wiring patterns will be described with reference to each drawing.

[3.3.3] Arrangement Structure of the First Separated Wiring Pattern

FIG. 36 is a view showing an arrangement of the first separated wiring pattern in an MLUT region including MLUTs arranged in 30 rows×15 columns. In FIG. 36, 450 number of MLUTs 30 described in circles, short distance wirings which respectively connect six adjacent MLUTs, and the first separated wiring pattern in which every five MLUT 30 is connected in the vertical direction are described. Note that some of the MLUTs 30 located in the vicinity of an upper end portion and a lower end portion of the MLUT region 8 among the MLUTs arranged at locations which should be connected by a separated wiring pattern of the first separated wiring pattern are not connected by the separated wiring pattern of the first separated wiring pattern. For these MLUTs, an MLUT which should be connected based on the regulation of the first separated wiring pattern doe not exist on the MLUT region 8. Accordingly, such MLUTs are connected with separated wirings by the later described fourth and the fifth separated wiring patterns.

[3.3.4] Arrangement Structure of the Second Separated Wiring Pattern

FIG. 37 is a view showing an arrangement of the second separated wiring pattern in an MLUT region including MLUTs arranged in 30 rows×15 columns. In FIG. 37, 450 number of MLUTs 30 described in circles, short distance wirings which respectively connect six adjacent MLUTs, and the second separated wiring pattern in which every five MLUT aligned from the lower left to the upper right are connected are described. Note that some of the MLUTs 30 located in the vicinity of the end portion of the MLUT region 8 among the MLUTs arranged at locations which should be connected by a separated wiring pattern of the second separated wiring pattern are connected with separated wirings by the later described fourth and the fifth separated wiring patterns, in the same manner as in the first separated wiring pattern.

[3.3.5] Arrangement Structure of the Third Separated Wiring Pattern

FIG. 38 is a view showing an arrangement of the third separated wiring pattern in an MLUT region including MLUTs arranged in 30 rows×15 columns. In FIG. 38, 450 number of MLUTs 30 described in circles, short distance wirings which respectively connect six adjacent MLUTs, and the third separated wiring pattern in which every five MLUT aligned from the lower right to the upper left are connected are described. Note that some of the MLUTs 30 located in the vicinity of the end portion of the MLUT region 8 among the MLUTs arranged at locations which should be connected by a separated wiring pattern of the second separated wiring pattern are connected with separated wirings by the later described fourth and the fifth separated wiring patterns, in the same manner as in the first and the second separated wiring patterns.

[3.3.6] Arrangement Structure of the Fourth Separated Wiring Pattern

Figure 39:
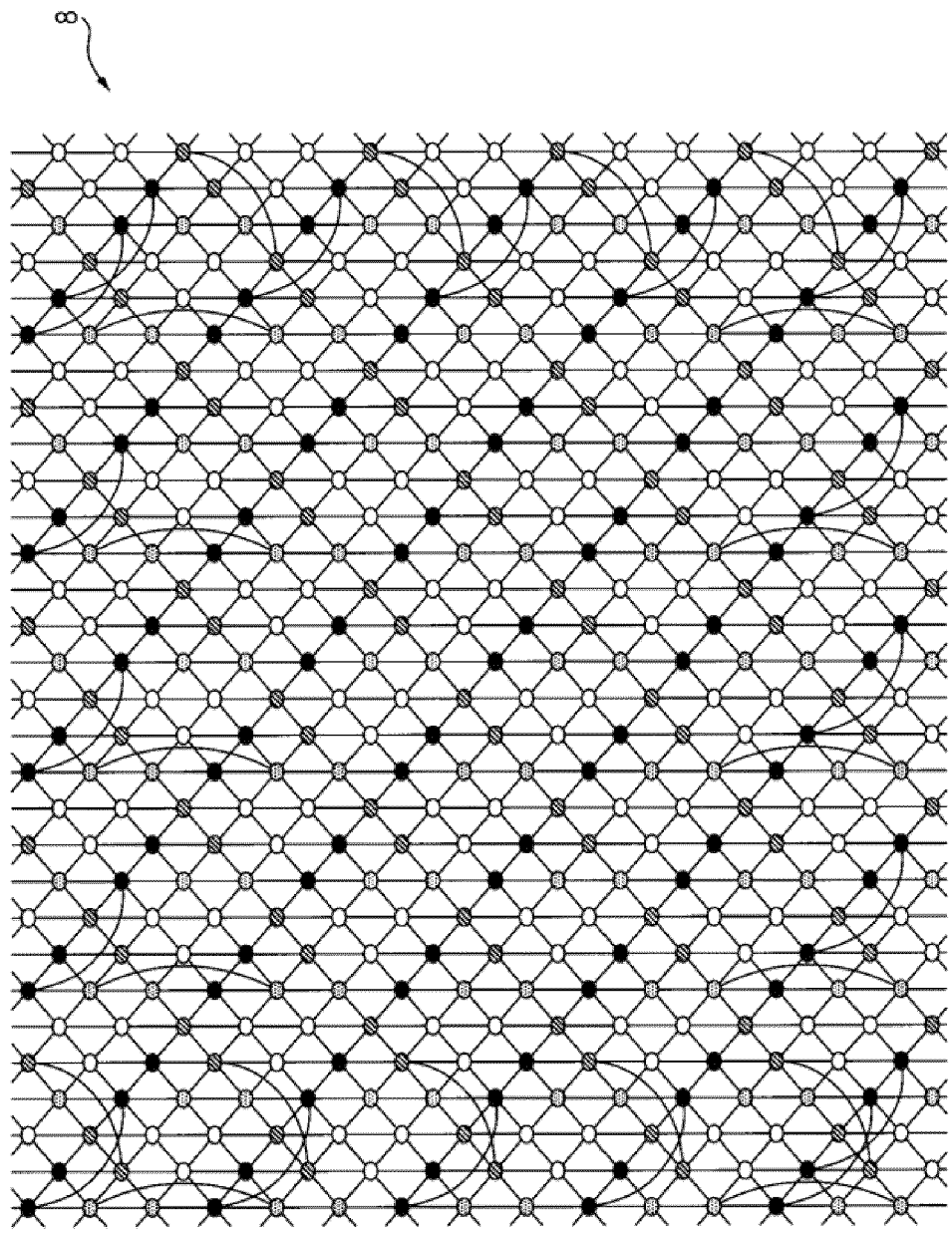
FIG. 39 is a view showing an arrangement of a fourth separated wiring pattern in the MLUT region including MLUTs arranged in 30 rows×15 columns.

FIG. 39 is a view showing an arrangement of the fourth separated wiring pattern in an MLUT region including MLUTs arranged in 30 rows×15 columns. As described above, the arrangement of the fourth separated wiring pattern in not based on the connection regulation defined in the MLUT block shown in FIG. 34, but connects some of the MLUTs 30 located in the vicinity of the end portion of the MLUT region 8. However, the fourth separated wiring pattern is arranged so as to have a similar arrangement as those in the first to the third separated wiring patterns. The regulation of the fourth wiring pattern will be described below.

First, the fourth separated wiring pattern is arranged in parallel to a direction in which MLUTs are aligned in either a vertical direction, a direction from the lower left to the upper right, or a direction from the lower right to the upper left, in the same manner as the first to the third separated wiring patterns.

Next, the fourth separated wiring pattern is arranged for every four MLUT in either of the directions. In order to comply with this regulation, some of the MLUTs which should normally be connected by the first to the third separated wiring patterns are connected by the fourth separated wiring pattern. For example, in FIG. 38, although the MLUT arranged in the left end column on the upper end row is an MLUT which should normally be connected by the first separated wiring pattern, it is connected by the fourth separated wiring pattern.

Since the fourth separated wiring pattern has a wiring pattern which is similar to the first to the third separated wiring patterns, it can suppress the influence to be given to the arrangement/wiring algorithms to be used when logic circuit information is arranged and wired to the respective MLUTs 30 on the MLUT region 8.

[3.3.7] Arrangement Structure of the Fifth Separated Wiring Pattern

Figure 40:
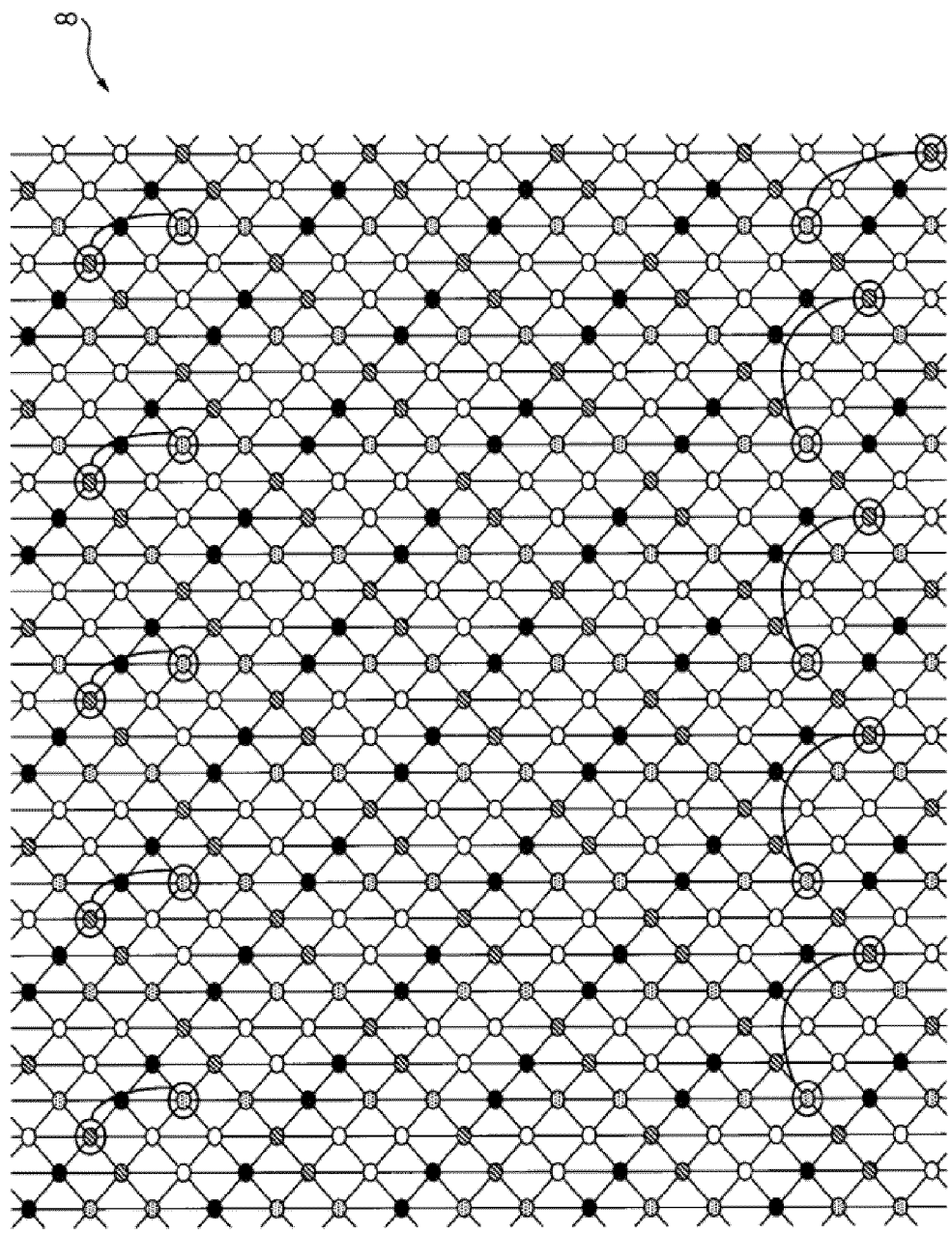
FIG. 40 is a view showing an arrangement of a fifth separated wiring pattern in the MLUT region including MLUTs arranged in 30 rows×15 columns.

FIG. 40 is a view showing an arrangement of the fifth separated wiring pattern in an MLUT region including MLUTs arranged in 30 rows×15 columns. The MLUTs to be connected by the fifth separated wiring patterns are the MLUTs 30 which could not be connected by either one of the first to the fourth separated wiring patterns. In the MLUT region of this example, such MLUT 30 may be connected via D flip-flop.

[4] Semiconductor Device in which One MPLD is Mounted

Here, one example of a semiconductor device in which one MPLD is mounted will be described.

Figure 41:
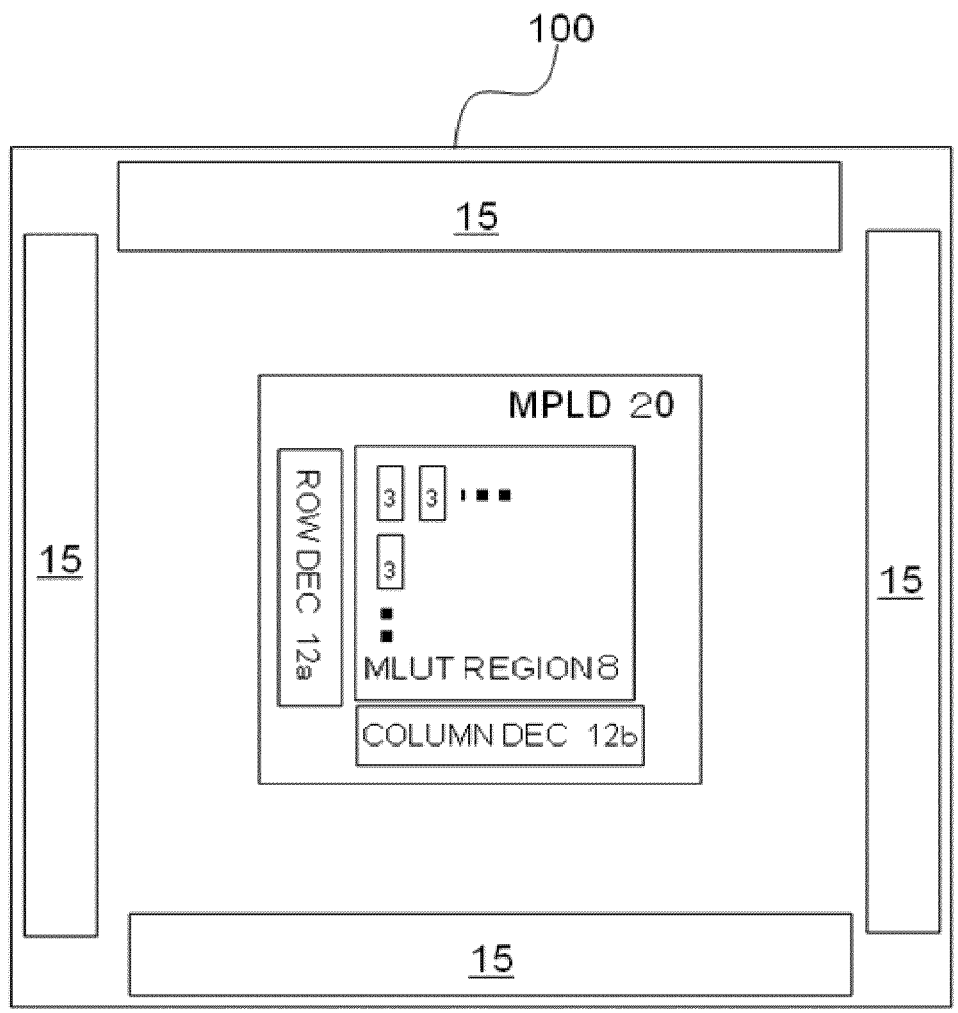
FIG. 41 is a view showing one example of an arrangement block of a semiconductor device in which an MPLD is mounted.

[4.1] Arrangement Structure of Semiconductor Device in which One MPLD is Mounted FIG. 41 is a view showing one example of an arrangement block of a semiconductor device in which an MPLD is mounted. The semiconductor device 100 includes an MPLD 20 and input/output circuit sections 15. Each of the input/output circuit sections includes an input circuit which inputs signals to devices outside of the semiconductor device 100, an output circuit which outputs signals to devices outside of the semiconductor device 100, a power supply cell and an I/O pad.

Each of the input circuit may be connected to an address line which selects each MLUT 30 arranged in the MPLD 20, an address line which selects a storage element 40 configuring each MLUT 30, and a memory operation data line for writing memory operation information and the like into the storage element 40 configuring each MLUT 30. Further, the input circuit may be connected to at least one logic operation address line of an AD pair which is arranged in the end portion of the MPLD 20 and is not connected to the other MLUT 30, and to the control signal, and the like. Each of the output circuit may be connected to a memory operation data line, at least one logic operation data line of an AD pair which is arranged in the end portion of the MPLD 20 and is not connected to the other MLUT 30, and the like. The input and output circuits and each of the AD pairs of the MPLD 20 may be directly connected. Further, the input and output circuits and each of the AD pairs of the MPLD 20 may be connected via a buffer circuit. By being connected via the buffer circuit, the signal transmission speed may be improved.

The MPLD may configure a logic circuit of a multi-input and multi-output. For example, with reference to FIG. 33, the MPLD 20 including MLUT region 8 of 15 rows×30 columns includes 118 AD pairs which are not yet connected. These AD pairs may all be used as input and output signals. This means that the MPLD 20 including the MLUT region 8 includes 118 input signal lines and 118 output signal lines, and is capable of performing logic operation for multi-bit signals, such as 64 bits, in parallel. Accordingly, the MPLD realizes a logic circuit which is high-speed, and is capable of multi-input and multi-output. Further, as described above, since the MPLD includes MLUTs arranged regularly, the MPLD may also be used for a circuit or a truth table with regularity.

[4.2] Arrangement/Wiring Flow for MPLD

Here, one example of a flow of arranging/wiring an MPLD to be mounted in a semiconductor device will be described.

Figure 42:
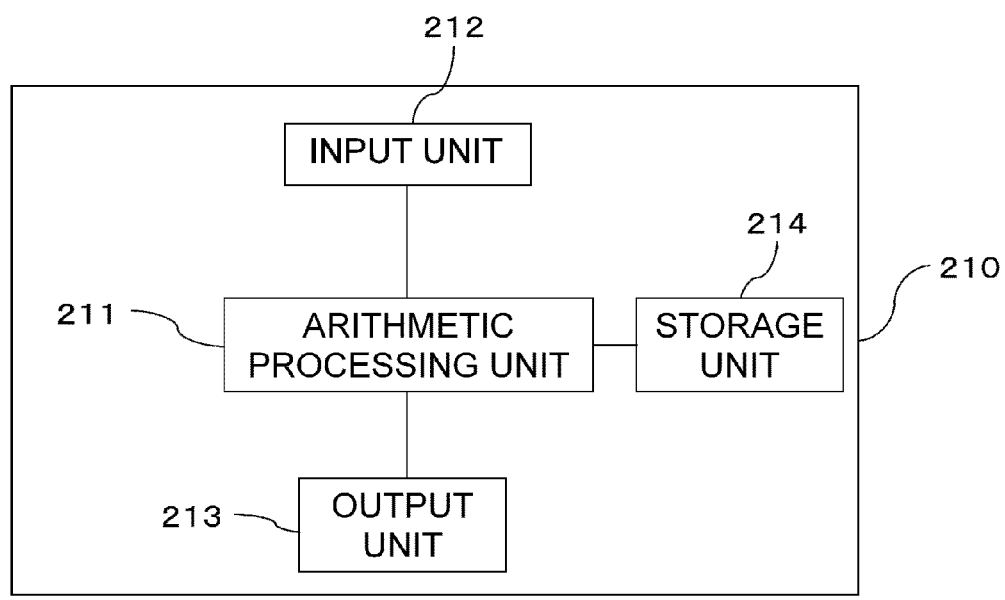
FIG. 42 is a view showing one example of an information processor which executes the arrangement/wiring of the MPLD.

FIG. 42 is a view showing one example of an information processor which executes the arrangement/wiring of the MPLD. The information processor 210 includes an arithmetic processing section 211, an input section 212, an output section 213, and a storage section 214. The arithmetic processing section 211 stores in the storage section 214 truth table data such as arrangement/wiring software inputted to the input section 212, a circuit description (hereinbelow also referred to as a netlist) such as a register transfer level (RTL) description, and the like. Further, the arithmetic processing section 211 executes the following arrangement/wiring flow for the circuit description stored in the storage section 214 by using the arrangement/wiring software stored in the storage section 214, and outputs the same to the output section 213. The output section 213 may be connected to a semiconductor device 100 (not shown), and the bit stream data including the arrangement/wiring information executed by the arithmetic processing section 211 may be written into the semiconductor device 100 via the output section 213.

Figure 43:
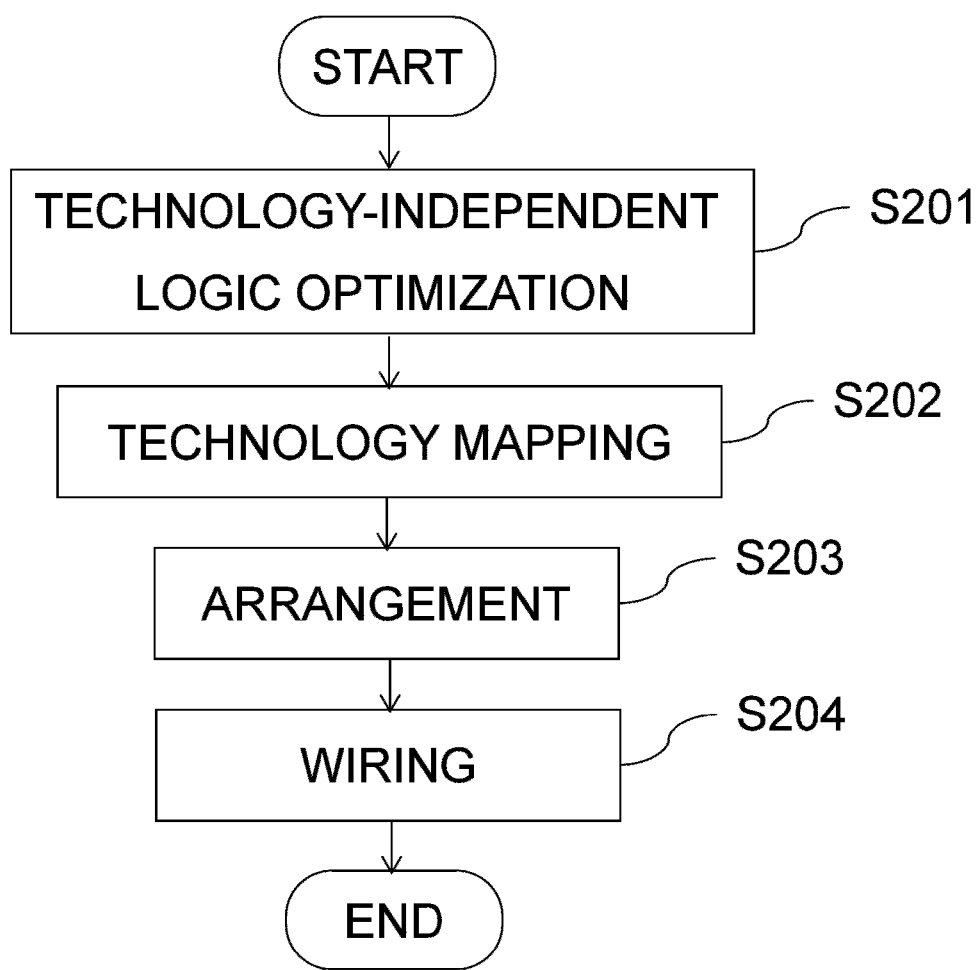
FIG. 43 is a view showing one example of a flow of the information processor generating a bit stream data for being arranged and wired to the MPLD.

FIG. 43 is a view showing one example of a flow of the information processor generating a bit stream data for being arranged and wired to the MPLD. First, the netlist is subjected to a technology-independent logic optimization (S201), and then to a technology mapping (S202), an arrangement (S203), and wiring (S204). The arranged/wired bit stream data corresponds to logic circuit information written into each MLUT 30, and is written into the storage element included in each MLUT 30 by the memory operation of the MPLD 20. Hereinbelow, each step will be described in order.

[4.2.1] Technology-Independent Logic Optimization

First the step of technology-independent logic optimization of the netlist (S201) is explained. In this step, the netlist may be optimized in a state of separating arithmetic operator units such as an adder, a subtractor, a multiplier, and a divider, from other logic circuit units.

When separating the arithmetic operator units from other logic circuit unit in the RTL description, arithmetic symbols described in the RTL description may be extracted, whereby the arithmetic operator units can be separated. For example, when RTL description is described in Verilog HDL, operators such as "+" meaning addition, "−" meaning subtraction, "*" meaning multiplication, "/" meaning division, and "%" meaning residue operation may be extracted, whereby the arithmetic operator units can be separated from the RTL description. The arithmetic operator units can be separated in the same manner in the case where other languages similar to C language are used.

The arithmetic operator units may be optimized by taking a full adder, a half adder, and the like, as a basic unit. When the arithmetic operator units are optimized together with the other logic circuit units, the arithmetic operator is configured by combining basic gate circuits such as an NAND circuit, an XOR circuit, and the like. However, in this case, various gate circuits may be subjected to logical combination, and there may be a possibility that the circuit configuring each arithmetic operator is lengthy. Accordingly, the arithmetic operator units are separated from the other logic circuit units, and are subjected to module combination by taking a full adder, a half adder, and the like as the basic unit, whereby the arithmetic operator units can be efficiently optimized.

Here, the module combination is referred to as generating a module pattern for data path type modules such as a memory having a regular structure, an arithmetic logic unit (ALU), a multiplier, and an adder by providing necessary information such as module functions and bit width.

For example, in a case where an MPLD is configured by MLUTs including AD pairs of five or more, the arithmetic operator unit can be subjected to the module combination by taking a 2-bit adder as a basic unit. A 4-bit adder can be configured by two bit adders. An 8-bit adder can be configured by four bit adders.

A basic arithmetic circuit such as the 8-bit adder may store wiring information of a 2-bit adder in the storage section 214. By this configuration, the stored arithmetic circuit does not require the later described wiring processing, whereby the processing may be speeded up. However, the arithmetic circuits have various numbers of bits. Further, the adders include what is called a "carry look ahead" in addition to the full adders and the half adders. Accordingly, storing arithmetic circuits of all patterns in the storage section is not realistic. Thus, a predetermined wiring regulation to configure an arithmetic circuit by a 2-bit adder is stored in the storage section 214, whereby the arithmetic circuit can be configured based on such wiring regulation.

The other logic circuit units use general methods applied in a normal LSI design, or an FPGA design. For example, processing such as minimization of the state number of a state machine, dual-stage logic optimization, and multi-stage logic optimization, and the like is performed.

[4.2.2] Technology Mapping

Next, a step of technology mapping in which the information processor 210 makes the netlist which has been subjected to the technology-independent logic optimization, a netlist suitable for MLUT configuring an MPLD (S202) will be described. In one example, the technology mapping includes a first step of decomposing the netlist which has been subjected to the technology-independent logic optimization, and a second step of covering the netlist decomposed in the first step.

In the first step, the number of inputs/outputs K of a logic circuits are adjusted, so that one logic circuit may be included in the truth table configured in the MLUT. When the number of AD pairs of an MLUT is N, the number of inputs/outputs K should be the number N of the AD pairs or less. In the first step, a kernel may be extracted, and Roth-Karp decomposition may be used.

In the second step, some of the nodes in the netlist obtained in the first step are covered in order to optimize the number of truth tables configured in the MLUT. In this step, among the truth tables decomposed in the first step, truth tables which can be included in one MLUT by combining two truth tables or more are collected to one truth table. Thus, the number of the truth tables configured in the MLUT 30 is optimized.

Preferably, when optimizing a combination circuit, the number of inputs/outputs included in the combination circuit having been subjected to the optimization may be the number of AD pairs included in an MLUT or less. Thus, the MLUT in which the combination circuit is arranged may also be used as a connection element at the same time. Note that when the MLUTs configuring the MPLD include six AD pairs or more, the number of input lines and output lines may be optimized to five or less. Thereby, a truth table of a 2-bit adder can by configured in one MLUT by including five input lines and output lines.

[4.2.3] Arrangement

Next a step of arranging the netlist which has been executed with the technology mapping in each MLUT in the MPLD (S203) will be described. In the netlist which has been executed with the technology mapping, a truth table of the logic circuit unit configured according to the number of AD pairs included in the MLUT, and a connection relation between the AD pairs included in each MLUT are described. In this step, truth tables of the logic circuit unit are arranged in each MLUT at suitable positions. As concrete arrangement methods, there are mentioned, configuration arrangement methods used at initial arrangements (random method, pair-linking method, cluster generation method, and min-cut method), repetition improvement method used for improving arrangements (Steinberg method, pair exchange method, force directed relaxation method, and simulated annealing method), as well as the normal LSI design.

[4.2.4] Wiring

Finally, a step of wiring the MLUTs in which the netlist having been executed with the technology mapping is arranged (S204) will be described. According to the netlist which has been executed with the technology mapping, the AD pairs included in the MLUTs operating as the logic circuit are wired by using MLUTs functioning as connection elements. As concrete arrangement methods, there are mentioned, Lee algorithm, and line search algorithm, as well as the normal LSI design. As a result, a bit stream data configuring the truth table data in which a netlist realizing a desired logic circuit is arranged and wired in the MPLD is generated.

[4.3] Reconfiguration in Semiconductor Device in which One MPLD is Mounted

As described above, an MPLD includes a plurality of storage elements capable of configuring logic circuits which may be subjected to reconfiguration. By using this characteristic of MPLD, in a semiconductor device in which PLD is mounted, logic circuit information written into MPLD can be reconfigured.

For example, the reconfiguration in the semiconductor device 100 in which MPLD 20 is mounted shown in FIG. 41 may be realized by using the information processor 210 shown in FIG. 42. A plurality of pieces of bit stream data configuring the logic circuit information to be written into MPLD 20 are stored in the storage section 214 of the information processor 210. Then, the information processor 210 writes the bit stream data in the semiconductor device 100 connected to the output section 213 of the information processor 210, whereby the reconfiguration of the MPLD 20 may be realized.

Further, the reconfiguration in the semiconductor device 100 in which MPLD 20 is mounted shown in FIG. 41 may also be realized by using a microprocessor (not shown) which is mounted on the same substrate as the semiconductor device 100 and a storage device (not shown).

[4.4] Partial Reconfiguration in Semiconductor Device in which One MPLD is Mounted

[4.4.1] Flow of Partial Reconfiguration in MPLD

One example of a flow to partially reconfigure the MPLD mounted in the semiconductor device will be described.

Figure 44:
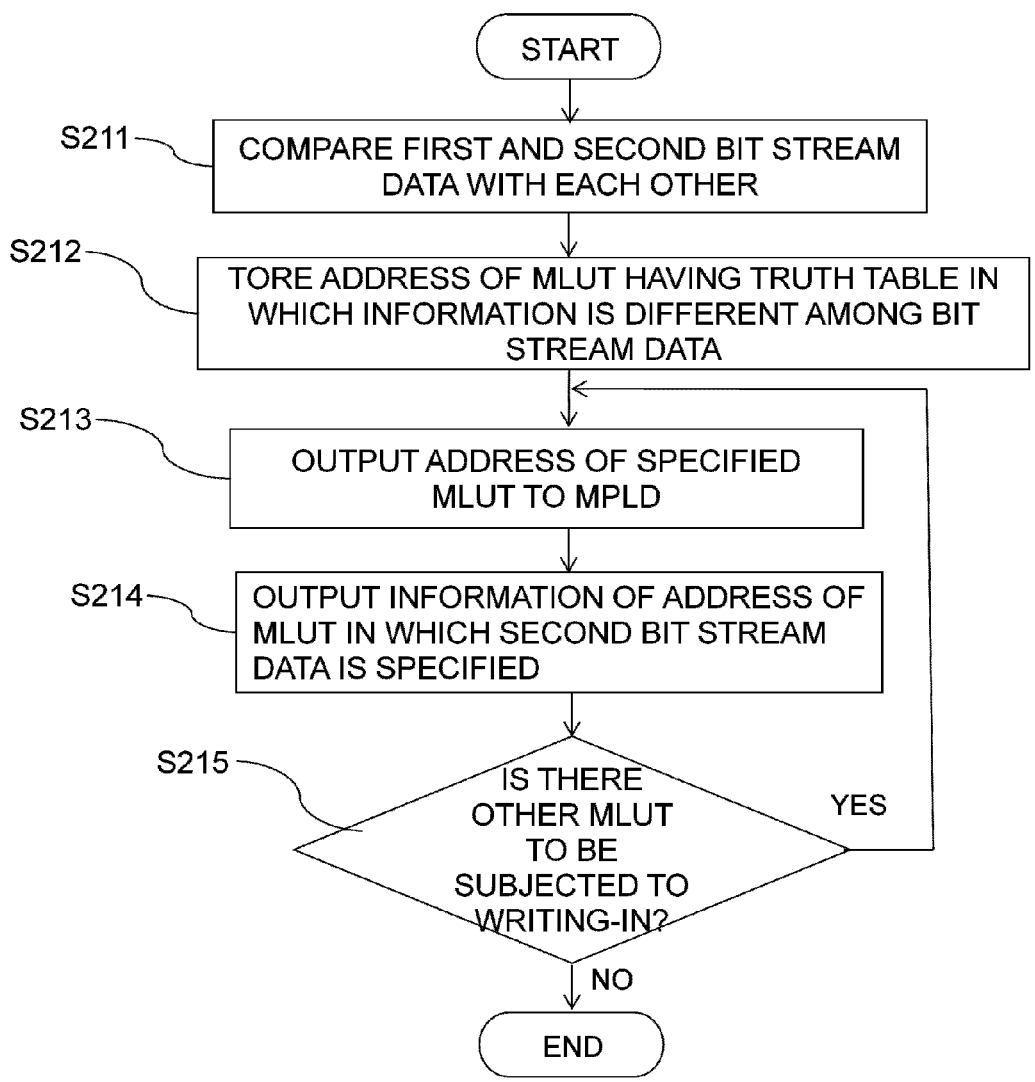
FIG. 44 is a view showing one example of a flow of partially reconfiguring the MPLD to be mounted on the semiconductor device shown in FIG. 41.

FIG. 44 is a view showing one example of a flow of partially reconfiguring the MPLD to be mounted in the semiconductor device shown in FIG. 41. First, in step S211, the information processor 210 compares the first bit stream data written into MPLD with the second bit stream data having been executed with the partial reconfiguration. The comparison is performed by comparing the truth tables described in the MLUTs sharing the same address described in each piece of bit stream data. Further, the symbols of the AD pairs connected to the AD pairs of each MLUT, and the like are compared. The first bit stream data and the second bit stream data having been executed with the partial reconfiguration may be stored in the storage device. Preferably, an MLUT having the same function between the first bit stream data and the second bit stream data may be allotted with the same symbol as that of the first bit stream data when generating the second bit stream data. Next, in step S212, an address of the MLUT in which the truth table data is differently described between the first bit stream data and the second bit stream data is specified, and the specified address is stored in the storage device. The MLUTs located at the same position on the MPLD between the first bit stream data and the second bit stream data may be allotted with the same address. For example, in the MPLD including an MLUT region of 30 rows×15 columns, the address of an MLUT positioned at the upper left corner may be allotted with number 0, the address of the MLUT positioned on the right to such MLUT may be allotted with number 1, and so on, and the address of the MLUT positioned at the lower right corner may be allotted with number 449. Note that when the physical locations of the addresses of each MLUT of the first bit stream data and the second bit stream data do not correspond to each other, a means to clarify the relationship thereof may be provided. For example, data showing the relationship may be stored in the storage device. Next, in step S213, the information processor 210 outputs the specified one address of the MLUT to the MPLD. Concretely, the address is inputted to a row decoder 12a and a column decoder 12b of the MPLD 20. Then in step S214, the information processor 210 writes the truth table data to be described in the second bit stream data of the MLUT of which address is specified, in such MLUT. Since the methods to write data in the MLUT has already been explained, the details thereof will be omitted here.

When an address of an MLUT in which the truth table data is differently described between the first bit stream data and the second bit stream data is further stored in the storage device, the process returns to step S213. When an address of the MLUT 30 in which the logic circuit information is differently described between the first bit stream data and the second bit stream data is not further stored, the partial reconfiguration is ended.

[4.4.2] Example of Partial Reconfiguration

Here, advantages of the partial reconfiguration are explained based on a concrete example. The example is based on butterfly computation generally used at fast Fourier transformation.

Figure 45:
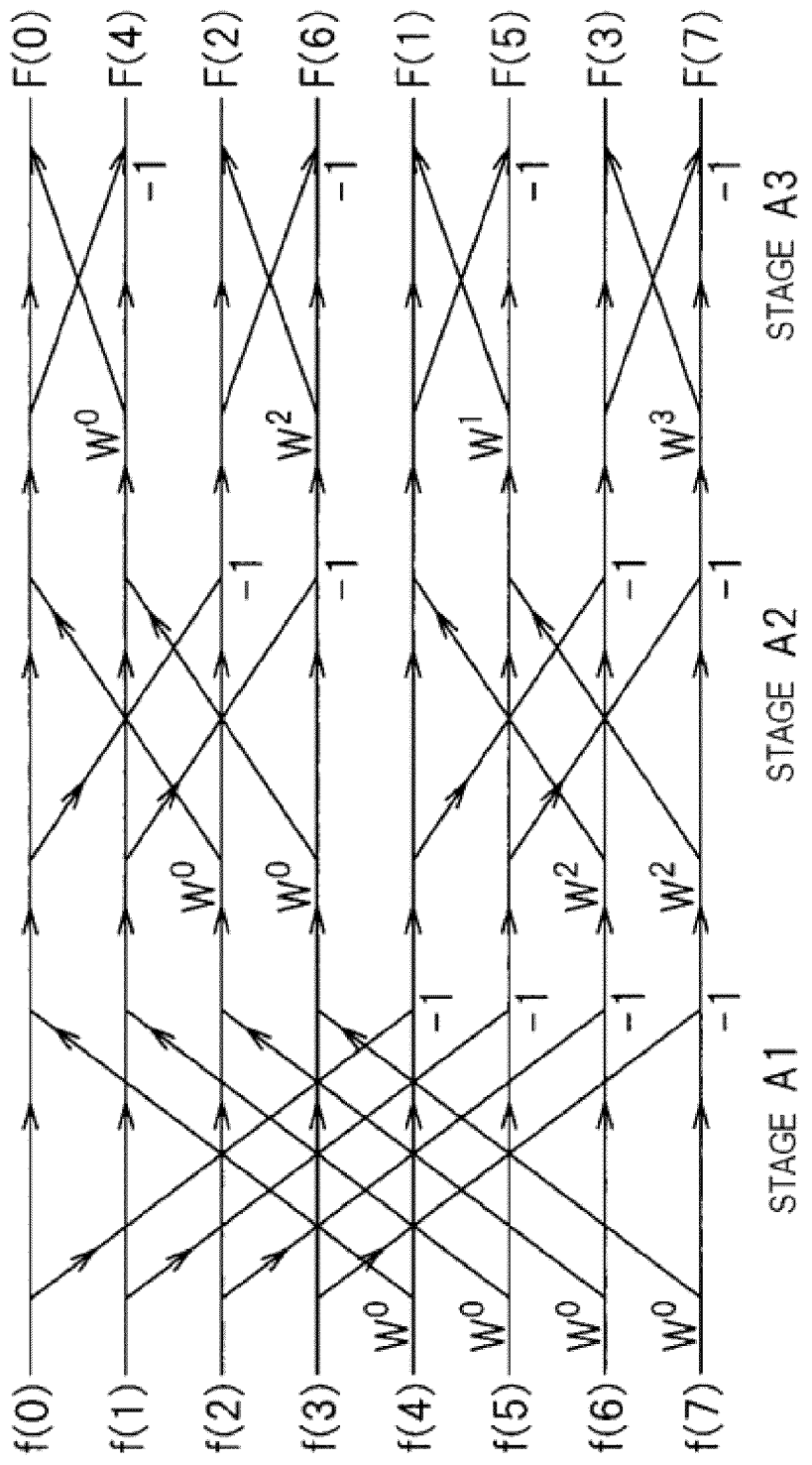
FIG. 45 is a view showing one example of an algorithm when an 8-point discrete Fourier transformation is performed by a butterfly computation.

FIG. 45 is a view showing one example of an algorithm when an 8-point discrete Fourier transformation is performed by a butterfly computation. Here, f(0)-f(7) are eight points on a time line. F(0)-F(7) are eight points after the discrete Fourier transformation. $W^0$-$W^3$ are twiddle factors. In FIG. 45, intersections of directional lines show the points at which addition is performed. Further, the intersections of directional lines described also with "−1" show the points at which subtraction is performed. Further, the directional lines described with the twiddle factors $W^0$-$W^3$ thereon show that the twiddle factors $W^0$-$W^3$ are multiplied. Accordingly, for example in stage A1, f(0) is added with f(4) multiplied by $W^0$, and is subtracted with f(4) multiplied by $W^0$. In this manner, constant multiplication is performed at each Stage in the butterfly computation.

Generally, when realizing constant multiplication by logic circuits, a circuit dedicated for constant multiplication configured by a shift circuit and an adder arithmetic operation is more often configured rather than a multiplier circuit. This is because, the arithmetic operation speed may be improved by configuring the circuit dedicated for constant multiplication by a shift circuit and an adder arithmetic operation, compared to the case when a multiplier circuit is simply configured. Further, the number of circuit elements can be reduced by using a shift circuit and an adder arithmetic operation, whereby an effect that chip area may be reduced. For example, a circuit in which constant "3" is multiplied by a variable "a" is configured by a shift circuit and an adder arithmetic operation shown in the following formula.

$$3*a = 2*a + a = (a<<1) + a$$

Here, "*" shows multiplication, "+" shows addition, and "<" shows a shift circuit. Accordingly, the formula "(a<<1)+a" shows that the variable "a" is shifted to an upper-order bit by two digits, and the variable "a" is added with the resultant thereof.

On the other hand, the twiddle factors $W^0$-$W^3$ of the discrete Fourier transformation may take variable values depending on the usage of the circuit. Accordingly, even when configuring a circuit realizing the butterfly computation by the same 8-point discrete Fourier transformation, various circuits need to be configured according to the usage thereof. For example, a circuit in which the twiddle factor $W^3$ is 3 and multiplies the twiddle factor $W^3$ may be configured as shown in the following formula.

$$3*a = a*2 + a = (a<<1) + a$$

Meanwhile, a circuit in which the twiddle factor $W^3$ is 4 and multiplies the twiddle factor $W^3$ may be configured as shown in the following formula.

$$4*a = a*2 + a*2 = (a<<1) + (a<<1)$$

In the conventional reconfiguration enabling logic circuits such as FPGA, even when a partial circuit is changed in this manner, the arrangement/wiring is required to be performed again, or the entire logic circuit information is required to be rewritten. However, since the MPLD can specify the address of an MLUT in which the logic circuit information is changed, only the MLUT in which the logic circuit information is changed is rewritten, whereby the partial reconfiguration can be performed. In this example, the partial reconfiguration can be performed by rewriting the MLUT configuring the logic circuit of "+a" to the MLUT configuring the logic circuit of "+(a<<1)".

[5] Semiconductor Device in which One MPLD and Arithmetic Processing Section are Mounted Here, an example of a semiconductor device in which one MPLD and arithmetic processing section are mounted will be described.

Figure 46:
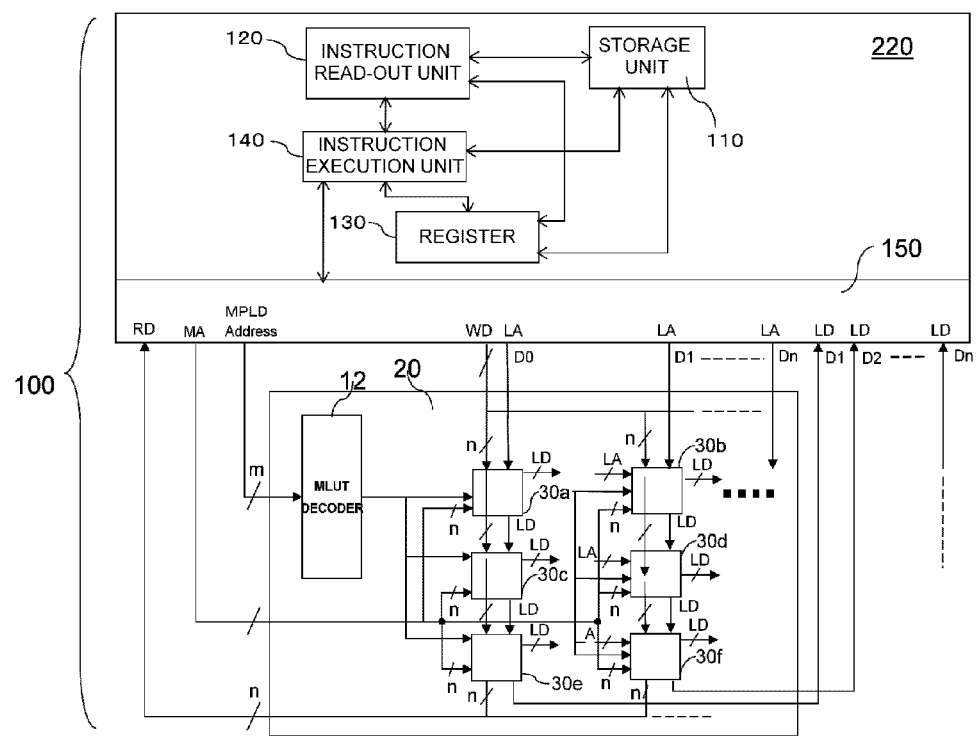
FIG. 46 is a view showing one example of a semiconductor device in which the MPLD is mounted.

[5.1] Semiconductor Device in which MPLD and Arithmetic Processing Section are Mounted FIG. 46 is a view showing one example of a semiconductor device in which the MPLD is mounted. The semiconductor device 100 includes the MPLD 20 and the arithmetic processing section 220.

The arithmetic processing section 220 includes a storage section 110, an instruction read-out section 120, a resister section 130, and an instruction execution section 140. The arithmetic processing section 220 is a device which executes programs stored in the MPLD 20, whereby inputs and outputs data to and from the MPLD 20, and operates data received from the MPLD 20. The arithmetic processing section 220 is, for example, a micro processing unit (MPU) as an arithmetic processor. The MPLD 20 is capable of processing with high speed logic operation of multi inputs and outputs. Accordingly, by limiting the functions of the arithmetic processing section 220 to exception processing such as branch instruction for controlling a part of the logic circuit; the reconfiguration of the MPLD 20 for controlling the state of the MPLD 20; and to data access to the SRAM as the storage region in the MPLD 20, an arithmetic processor in which bit width is narrow such as 8 bits and 16 bits may be configured.

The storage section 110 is a storage device which stores instructions or data. The storage section 110 stores a part of data stored in the MPLD 20. The storage section 110 is, for example, a first-level cache memory. The storage section 110 is, for example, a static random access memory (SRAM). Note that in the following description, although explanation is given with the supposition that the storage section 110 is an upper-level cache memory of the MPLD 20. However, as described later with reference to FIG. 52, the arithmetic processing section 220 is data connected to a storage section 26 in one embodiment. In such case, the main storage device performs in the same manner as to the data inputs/outputs to and from the arithmetic processing section 220 using the memory function of the MPLD 20.

The storage section 110 is provided inside the arithmetic processing section 220, and is located closer to the instruction read-out section 120 compared to the MPLD 20. When the instruction read-out section 120 accesses data stored in the storage section 110 (herein below referred to as "cache hit"), the instruction read-out section 120 is capable of accessing the target data in a short amount of time. On the other hand, when the instruction read-out section 120 access data which is not stored in the storage section 110 (herein below referred to as "cache miss", such data is read out from the MPLD 20 located in the lowermost layer of the storage section 110, whereby the time required to access the target data will be longer. Accordingly, data having high access frequencies from the instruction read-out section 120 is retained in the storage section 110 so that the cache miss does not occur.

The instruction read-out section 120 reads out an instruction from the storage section 110 and outputs the read out instruction to the instruction execution section 140.

When the instruction read out by the instruction read-out section 120 from the storage section 110 is received, the instruction execution section 140 executes the process specified by the instruction for data stored in the resister 130. Such predetermined instruction processes according to the instructions are, for example, a floating-point arithmetic, integer arithmetic, address generation, branch instruction execution, storing operation to store data stored in the resister 130 to the storage section 110, and loading operation to load data stored in the storage section 110 to the resister 130. The instruction execution section 140 includes executors to perform the floating-point arithmetic, integer arithmetic, address generation, branch instruction execution, storing operation, and loading operation, whereby executes the instruction processes by using such executors. The instruction execution section 140 executes storing or loading of data for MPLD 20 via the input/output section 150.

The resister 130 stores, for example, an operant, an address for performing the storing or loading to the MPLD 20, and an address of the MPLD 20 in which instruction being the execution target of the instruction execution section 140 is stored.

The input/output section 150 performs input and output of data to and from the MPLD 20. The MPLD 20 is the same as those shown in the examples explained with reference to FIGS. 1-3. In the input/output section 150, the address line of the logic operation address LA of the MLUT 30 and one output signal line from the output terminal D0 of the arithmetic processing section 220 are connected to each other; and the data line of the logic operation data LD of the MLUT 30 and the input signal line to the input terminal 10 of the arithmetic processing section 220 are connected to each other. In this manner, at least a part of the MLUTs arranged in an end portion of the MPLD 20 receives the logic operation address LA or outputs the logic operation data LA to and from the arithmetic processing section 220.

Further, the input/output section 150 is connected to the signal lines of the MPLD address, the memory operation address MA, the write-in data WD, and the read-out data RD, and performs memory operation for the MPLD 20 by input and output of such data.

As clearly shown from the above described configuration, the arithmetic processing section 220 outputs the memory operation address MA, the MPLD address, the write-in data WD to the MPLD 20 via the input/output section 150, whereby the storing operation for allowing the memory operation of MPLD is executed; and outputs the memory operation address MA, and MPLD address to the MPLD 20 via the input/output section 150, whereby receives the read-output data RD. In this manner, the portion which performs the input and output of the memory operation address MA, the MPLD address, the write-in data WD, and the read-out data RD among the input/output section 150 operates as the input/output section for memory operation.

Further, as also clearly shown from the above described configuration, the arithmetic processing section 220 outputs the logic operation address LA and receives the logic operation data LD via the input/output section 150, whereby receives the result of the logic operation of the MPLD. In this manner, the portion which performs the input and output of the logic operation address LA and the logic operation data LD among the input/output section 150 operates as the input/output section for logic operation.

Figure 47:
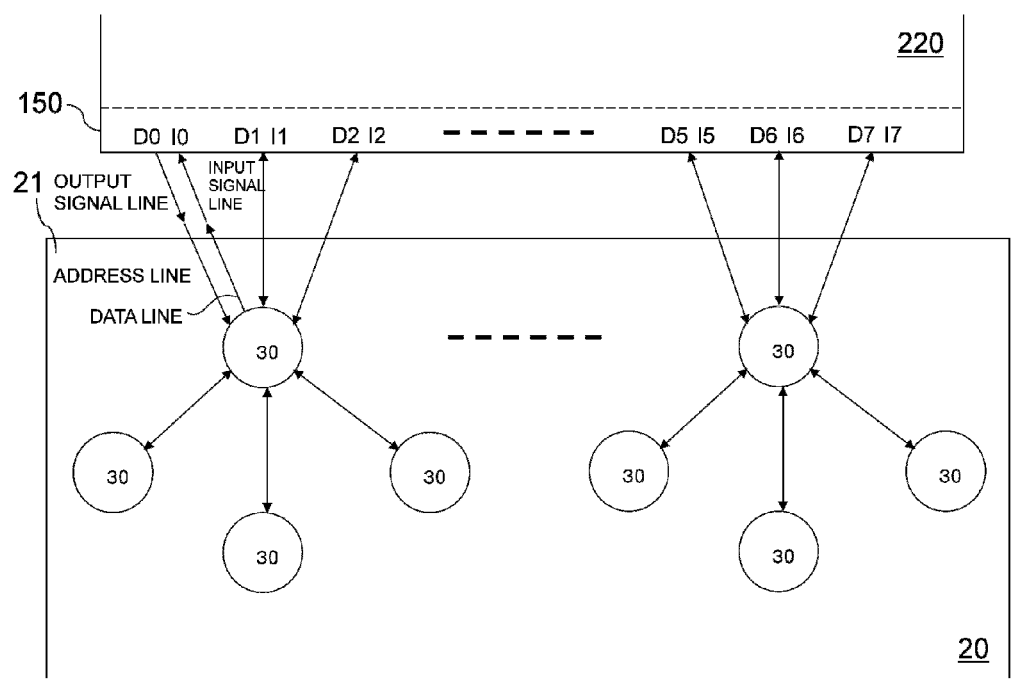
FIG. 47 is a view schematically showing one example of an arithmetic processing section and an input/output section which inputs and outputs data to and from the MPLD.

FIG. 47 is a view schematically showing one example of an arithmetic processing section and an input/output section which inputs and outputs data to and from the MPLD. In the input/output section 21 included in the MPLD 20, the address line of the MLUT 30 and one output signal line from the output terminal D0 of the arithmetic processing section 220 are connected to each other; and the data line of the MLUT 30 and the input signal line to the input terminal 10 of the arithmetic processing section 220 are connected to each other.

The connections between the input/output signal lines for the logic operation of the arithmetic processing section 220 and the address or data lines of the MLUT 30 are provided with the number of input/output bit number of the arithmetic processing section 220. For example, when the arithmetic processing section 220 has an output bit width of 16 bits, the number of the output signal lines and the input signal lines respectively are 16, and the address lines and the data lines of the MLUT to be connected to such signal lines would also be 16, respectively.

The connections between the input/output signal lines for the memory operation of the arithmetic processing section 220 and the address or data lines of the MLUT 30 are provided with the number of input/output bit number of the arithmetic processing section 220. For example, when the arithmetic processing section 220 has an output bit width of 16 bits, the number of the output signal lines and the input signal lines respectively are 16, and the address lines and the data lines of the MLUT to be connected to such signal lines would also be 16, respectively.

In this manner, the input/output signal lines of the arithmetic processing section 220 and the address or data lines of the MLUT 30 are directly connected without a bus connection circuit, whereby the arithmetic processing section 220 and the MPLD 20 are connected to each other. By not having the bus connection circuit in between the connections of the arithmetic processing section 220 and the MPLD 20, no setting of a master slave by an arbitration circuit of the bus is required. As a result, the transmission speed of signals between the arithmetic processing section 220 and the MPLD 20 may be improved. Further, a buffer circuit may be inserted in between each connection. By inserting the buffer circuit, the transmission speed of signals may even more be improved.

Figure 48:
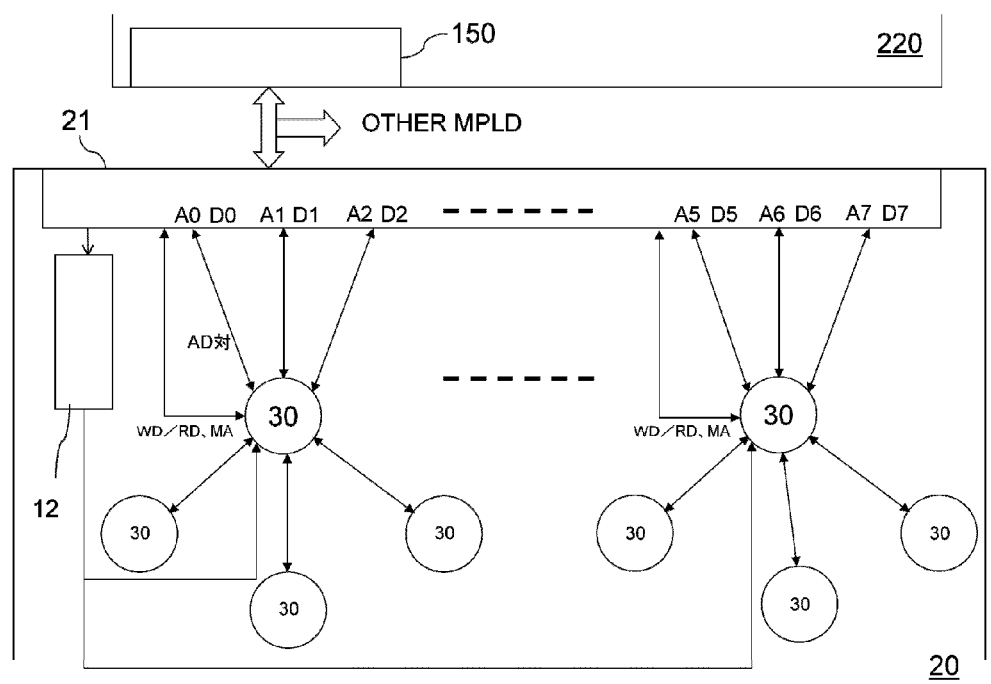
FIG. 48 is a view showing another example of the arithmetic processing section and the input/output section which inputs and outputs data to and from the MPLD.

FIG. 48 is a view showing another example of the arithmetic processing section and the input/output section which inputs and outputs data to and from the MPLD. As shown in FIG. 48, the arithmetic processing section 220 includes an input/output section 150 which performs input and output of data to and from the MPLD 20. Further, the MPLD 20 includes an input/output section 21 which performs input and output of data to and from the arithmetic processing section 220. The input/output section 21 includes, for example, ports A0-A7 which output addresses from the address lines of AD pairs of MLUT 30, and ports D0-D7 which input data from the data lines of AD pairs of MLUT 30, whereby performs data input and output for logic elements of the MPLD 20.

Further, the input/output section 21 performs transmission control according to a predetermined protocol so as to perform data input and output with the input/output section 150 of the arithmetic processing section 220. The transmission control according to the predetermined protocol is, for example, bus controls for a high-speed serial bus such as PCI Express, a parallel bus, and the like. In this manner the arithmetic processing section 220 and the MPLD 20 may be data connected by the predetermined bus.

Note that the arithmetic processor is connected to one MPLD 20 in FIG. 48, although the arithmetic processing section 220 may be connected to other MPLDs via the input/output section 150. Further, the arithmetic processing section 220 may be connected to an address line and data line included in a first MPLD; and an address line and data line included a second MPLD, both via the input/output section 150, thereby performing data input and output of logic operation for the first MPLD, as well as performing memory operation including the reconfiguration for the second MPLD. Accordingly, the arithmetic processing section 220 may perform control to output address and data to the input/output section of the first MPLD, and in addition perform control to output the address to the input/output section and receive data to and from the second MPLD.

Figure 49:
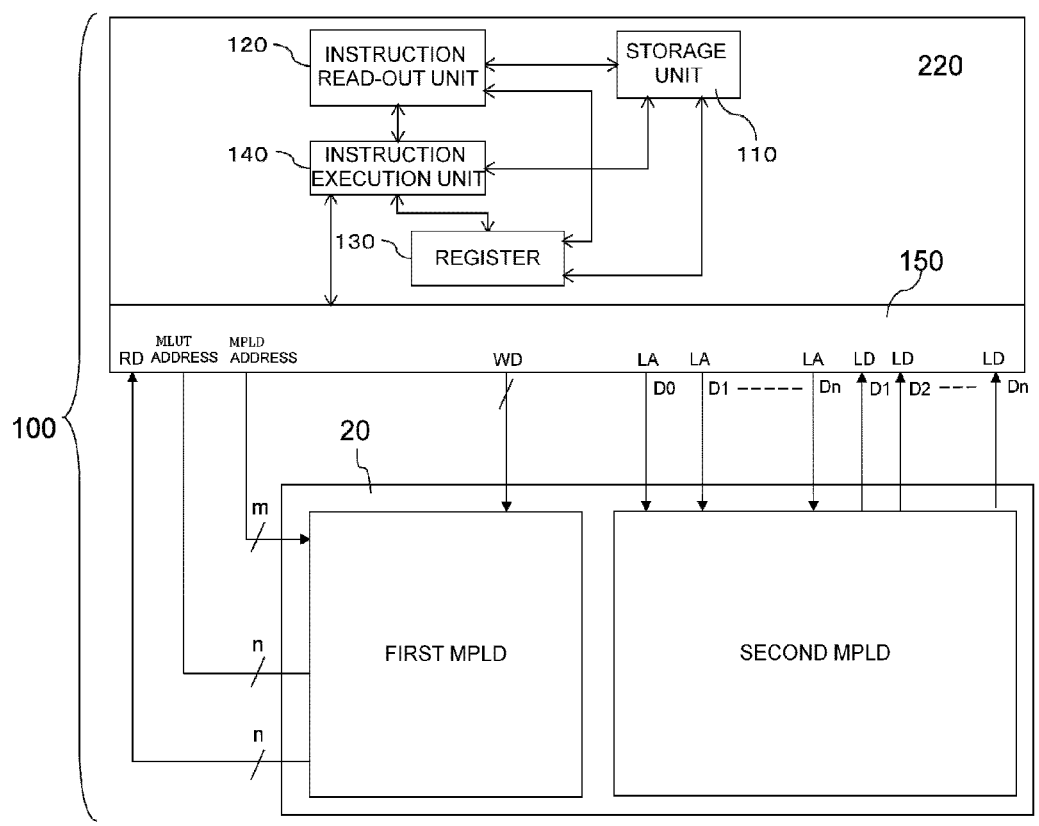
FIG. 49 is a view showing one example of the MPLD which performs the logic operation and a memory operation simultaneously, and the arithmetic processing section.

FIG. 49 is a view showing one example of the MPLD which performs the logic operation and a memory operation simultaneously, and the arithmetic processing section. The MLUT of the MPLD 20 shown in FIG. 49 can perform the logic operation and the memory operation simultaneously in the same manner as the MLUT shown in FIG. 19. Accordingly, the arithmetic processing section 220 performs the memory operation for the first logic section configured by a plurality of MLUTs to be the target of memory operation in the MPLD, and also performs the logic operation for the second logic section configured by a plurality of MLUTs to be the target of logic operation in the MPLD.

Figure 50:
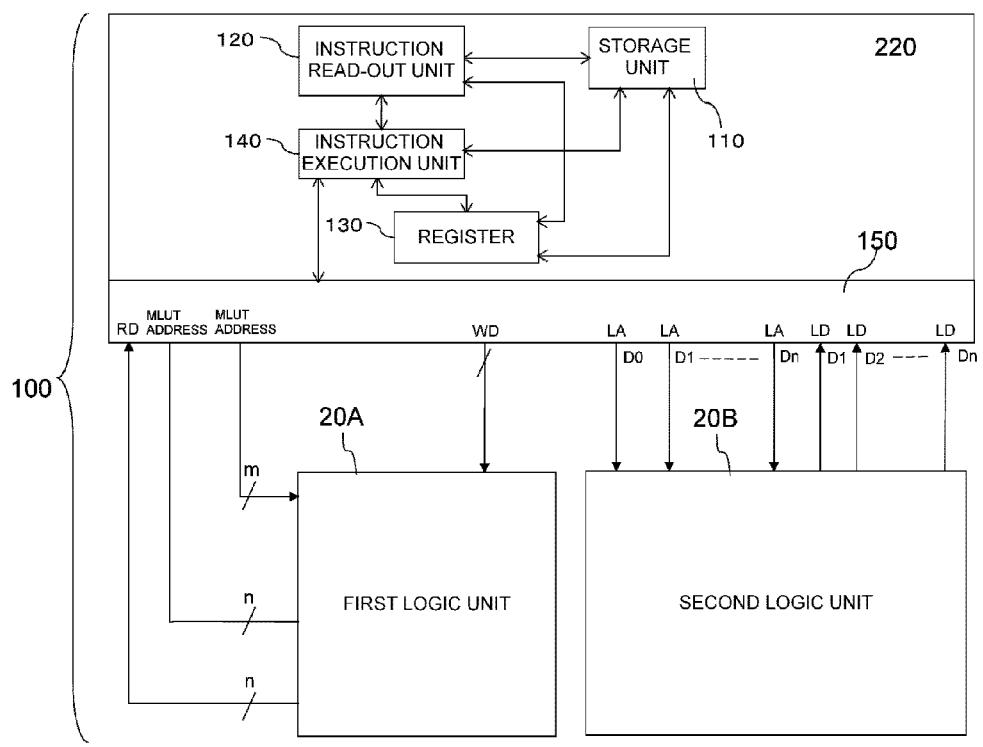
FIG. 50 is a view showing one example of a plurality of MPLDs and the arithmetic processing section.

FIG. 50 is a view showing one example of a plurality of MPLDs and the arithmetic processing section. The MPLDs 20A and 20B shown in FIG. 50 cannot perform the logic operation and the memory operation simultaneously in the same manner as the MLUT shown in FIG. 4. Accordingly, the arithmetic processing section 220 performs the memory operation for the first MPLD 20A configured by a plurality of MLUTs to be the target of memory operation, and also performs the logic operation for the second MPDL 20B configured by a plurality of MLUTs to be the target of logic operation in the MPLD.

Figure 51:
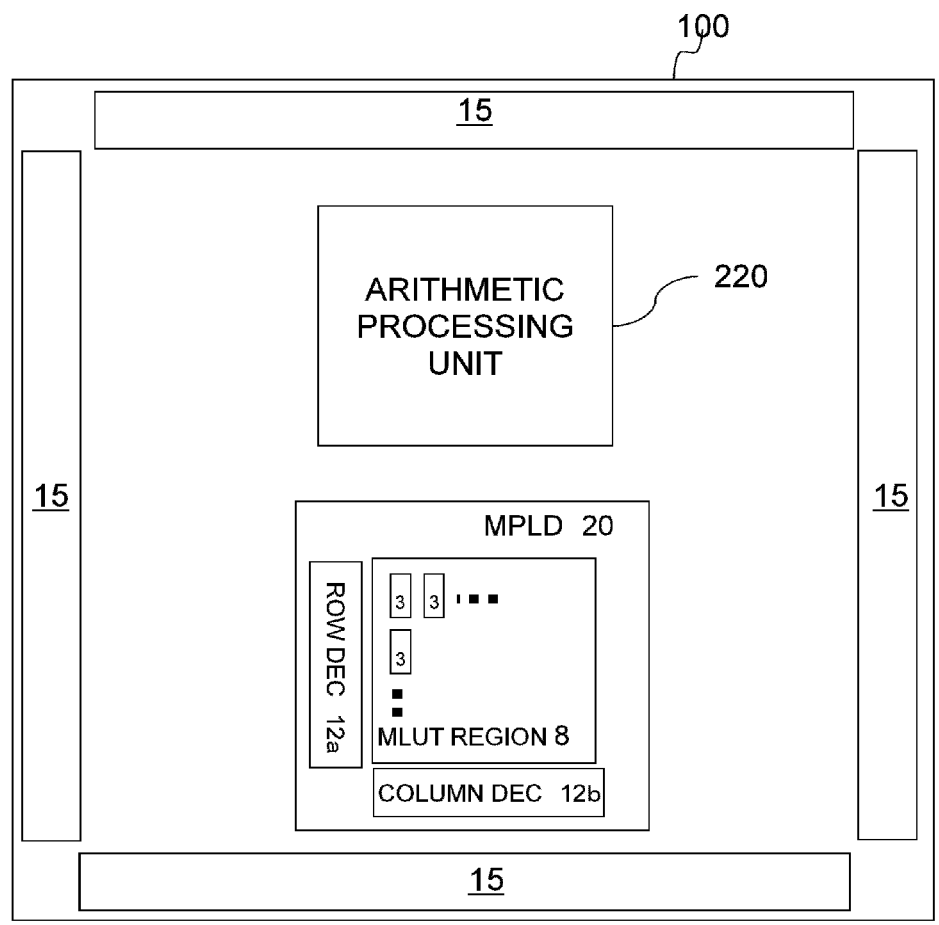
FIG. 51 is a view showing another example of an arrangement block of the semiconductor device in which an MPLD is mounted.

[5.2] Arrangement Structure of Semiconductor Device in which MPLD and Arithmetic Processing Section are Mounted FIG. 51 is a view showing another example of an arrangement block of the semiconductor device in which an MPLD is mounted. The semiconductor device 100 includes the MPLD 20, the arithmetic processing section 220, and the input/output circuit section 15. The input/output circuit section 15 is the same as the one explained in the example with reference to FIG. 41, thus the explanation thereof will be omitted. The arithmetic processing section 220 is the one explained with reference to FIG. 46.

In this example, the MPLD address signal lines and memory operation address signal lines may be connected to the arithmetic processing section 220. Some of the AD pairs arranged in the end portions of the MPLD 20 and are not connected to the other MLUTs 30 are connected to the arithmetic processing section 220. Further, some of the others are connected to the input/output circuit section 15. The arithmetic processing section 220, the MPLD address signal lines, and the memory operation address signal lines may be connected via an internal bus circuit, or may be connected directly. The arithmetic processing section 220 and the AD pairs of the MLUT 30 may be connected via the internal bus circuit. Alternatively, the arithmetic processing section 220 and the AD pairs of the MLUT 30 may be connected directly. When the AD pairs are directly connected, a higher speed operation is possible compared to connecting the same via the internal bus circuit. This is because a bus arbitration circuit operation is not required. Still further, the arithmetic processing section 220 and each of the AD pairs of the MPLD 20 may be connected via a buffer circuit. By connecting the same via the buffer circuit, the signal transmission speed may even be improved.

Figure 52:
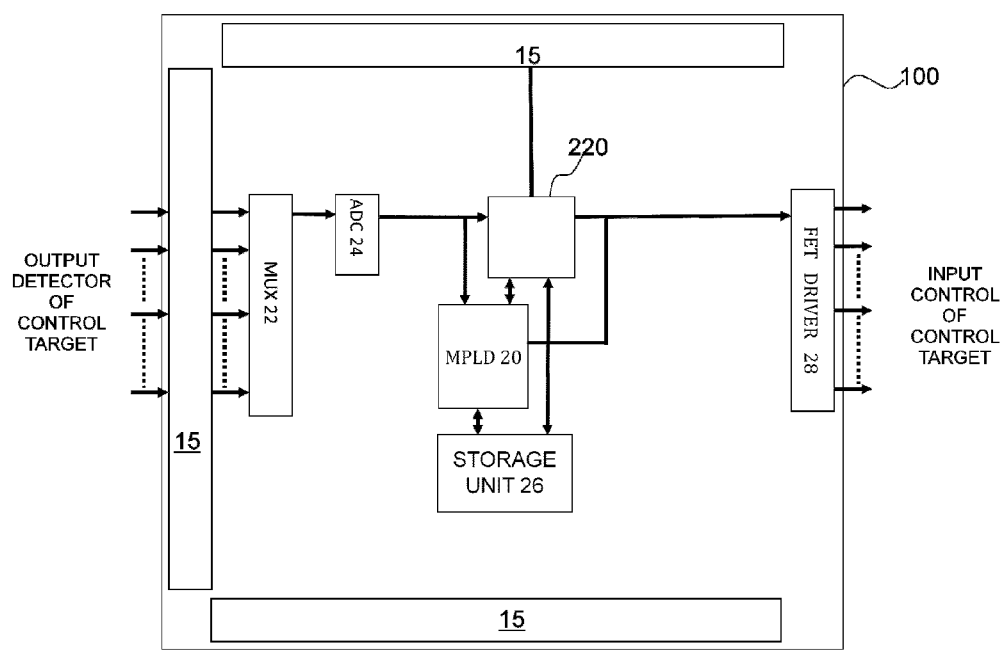
FIG. 52 is a view showing one example of an arrangement configuration of the semiconductor device in which the MPLD is mounted in the another example.

FIG. 52 is a view showing one example of an arrangement configuration of the semiconductor device in which the MPLD is mounted in another example. With reference to FIG. 52, the semiconductor device 100 in this example includes a multiplexer 22, an A/D converter 24, the arithmetic processing section 220, one MPLD 20, a storage section 26 and a metal-oxide-semiconductor field-effect transistor (MOSFET) driver 28. Further a signal is inputted from a detector output of a control target of the semiconductor device in this example to the multiplexer 22, and an output of the MOSFET driver 28 is inputted to the control input of the control target.

The multiplexer 22 is inputted with analog signals of a suitable number such as 32 or 64 from the detector of the control target. The multiplexer 22 performs time-sharing for the inputted signal, and outputs the time-shared signal to the A/D converter 24. The A/D converter 24 converts the time-shared analog signal to a digital signal, and outputs the converted signal to the arithmetic processing section 220 and the MPLD 20. The arithmetic processing section 220 inputted with the signal from the A/D converter 24 instructs the MPLD 20 to perform the processing of the inputted signal to based on the control of a software stored outside the storage device. At this time, the MPLD 20 performs arithmetic processing, routine processing and background processing of multi-inputs and multi-outputs.

Further, besides instructing the MPLD 20 in the signal processing method, the arithmetic processing section 220 also performs non-routine processing such as processing performed when error signals and alarm signals are inputted from the MPLD 20. The arithmetic processing section 220 reconfigures the logic circuit information of the MPLD 20, whereby various processing may be executed by the MPLD 20. After the predetermined processing is ended, the arithmetic processing section 220 outputs data to the control target via the MOSFET driver 28, based on the control of the software stored outside the storage device. Thus, a feed back loop from the detector of the control target to the controller of the control target via the semiconductor device 100 of this example can be formed. Accordingly, a multisystem control may be configured by a small amount of components.

An application of the semiconductor device of this example will be described. As an application, the semiconductor device 100 controls the removal of raindrops attached to door mirrors of an automobile. In this case, the detectors of the control target may be raindrop detectors, several of which being respectively arranged in a door mirror provided at the door of an automobile on the driver seat side, in a door mirror on the passenger seat side, and in a windshield; or rainfall amount detectors provided on a windshield or a hood. Further, other inputs may be signals of operation frequencies and operation speed of wipers provided on a door mirror and a windshield. The semiconductor device 100 inputted with these signals determines the operation time, operation cycles, operation intensities, and the like, according to the software stored in other storage devices. Then, the semiconductor device 100 outputs signals to a wiper driving motor connected to the output of the MOSFET driver 28, and drives the wipers of the door mirrors in a suitable time, cycle, and intensity, based on such determination. Further, when any kind of error occurs, the semiconductor device 100 inputs signals to the LED driver connected to the output of the MOSFET driver, and drives the LED to give a warning to the driver. At this time, the control of the signal outputted to the wiper driving motor is a routine processing, and is a multi-bit parallel processing, and thus is subjected to arithmetic processing by the MPLD 20. Further, the logic circuit information of the MPLD 20 may be reconfigured according to needs. On the other hand, since the control of the alarm signal outputted to the MOSFET driver 28 is non-routine processing, the control is processed by the arithmetic processing section 220.

[5.3] Operation Combination Flow of Logic Circuit Information to be Written into MPLD Here, a flow to perform an operation combination for logic circuit information to be written into MPLD mounted in a semiconductor will be described.

[5.3.1] Operation Combination

An operation combination is generally referred to as generating an RTL code of a circuit from an algorithm which is desired to be processed by the circuit of a design target, that is, an operation description.

Figure 53:
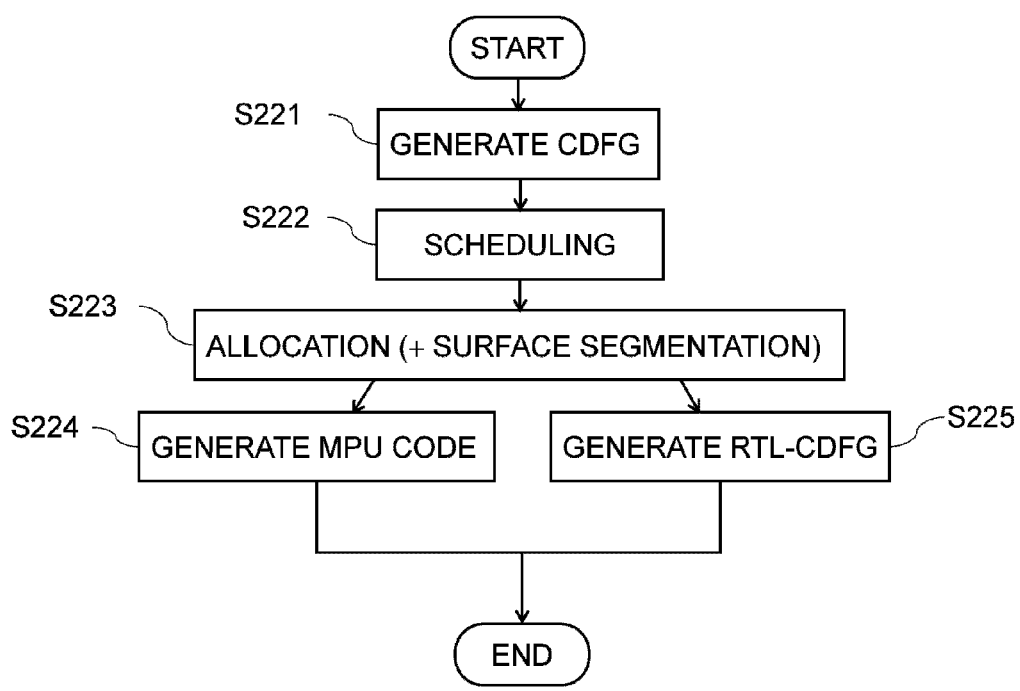
FIG. 53 is a view showing one example of combining operations.

FIG. 53 is a view showing one example of combining operations. The information processor 210 shown in FIG. 42 may execute the operation combination. With reference to FIG. 53, in the operation combination, the information processor 210 generates a control data flow graph (CDFG) from an operation description in step S221, performs scheduling of the CDFG in step S222, allocates the scheduled CDFG in step S223, generates an MPU instruction code from the allocated CDFG in step S224, and generates RTL-CDFG in step S225. Note that "the MPU instruction code" is an instruction code of the arithmetic processing section 220.

As for the operation description, VHDL (VHSIC (very high speed integrated circuits) hardware description language) which is one type of a hardware description language (HDL) for digital circuit designs may be used. Further, the description language may be a so-called advanced computer language (also referred to as a high standard computer language) with general versatility. Here, the advanced computer language is a collective term of languages which are similar to natural languages and have syntax and concepts more understandable for humans, among programming languages. As types of a representative advanced computer language, there are mentioned BASIC, FORTRAN, COBOL, C language, C++, Java (registered trademark), Pascal, Lisp, Prolog, Smalltalk, and the like.

The MPU instruction code is configured by a low-level language (also referred to as a low standard computer language) such as an assembly language or machine language, and may be designed in a language which is directly read by the arithmetic processing section. The MPU instruction code is stored in the storage device in the form of software and the like, and defines the content of the processing executed by the arithmetic processing section. The MPU instruction code includes a part of the control circuit unit described in the operation description.

The RTL-CDFG may be designed as a description of C language added with register description, or a hardware description language (HDL) such as verilog HDL. The RTL-CDFG corresponds to the circuit description shown in FIG. 43. The information processor 210 shown in FIG. 42 may generate bit stream data from the RTL-CDFG by the arrangement/wiring flow described with reference to FIGS. 42 and 43.

Hereinbelow, each step shown in FIG. 53 will be described in order.

[5.3.2] Step of Generating CDFG

The step S221 of generating CDFG shown in FIG. 53 includes a step of analyzing the flow of execution control of the operation description and the data flow, and a step of conversion to CDFG which is similar to the flowchart of programs. The CDFG (control data flow graph) represents the data flow shown in the operation description, and the control flow of the execution order of each arithmetic operation, and includes numbers showing the types of nodes, input branches, output branches, various arithmetic operations such as four arithmetic operations, and the like. When the operation description is converted to CDFG, processing similar to that performed at the time of optimizing compilers such as constant propagation, and removing common arithmetic is performed. Further, processing of converting the flow graph structure may also be performed so as to obtain parallelism in the operation description.

Figure 54:
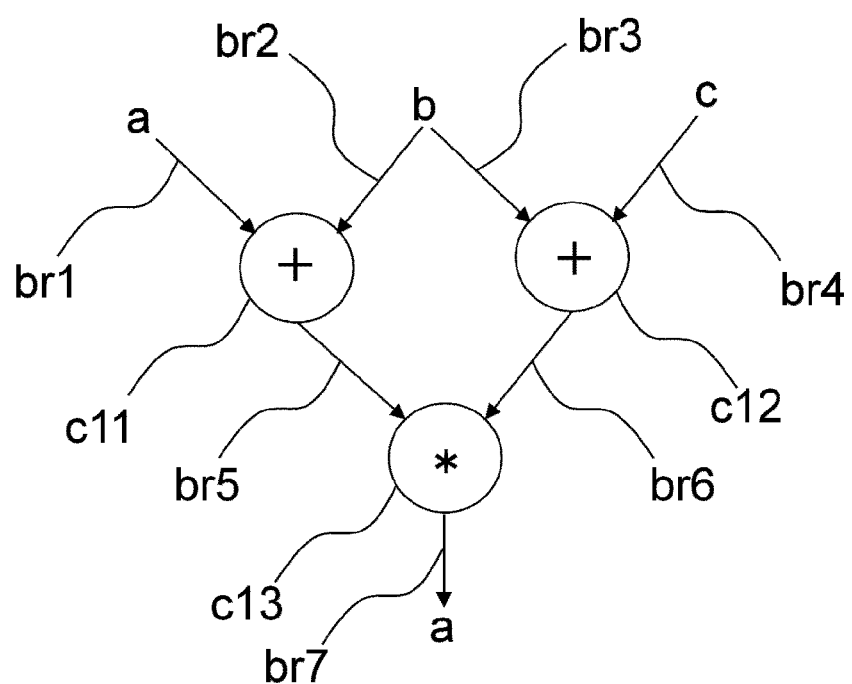
FIG. 54 is a view showing an example of CDFG which configures a logic circuit of x=(a+b)*(b+c)

FIG. 54 is a view showing an example of CDFG which configures a logic circuit of x=(a+b)*(b+c). This formula is the one to obtain logical multiplication "x" of the logical add of "a" and "b" and the logical add of "b" and "c". With reference to FIG. 54, br1-br7 show data signals or control signals. Nodes e11-13 represent arithmetic operations. The nodes c11 and c12 respectively represent logical add of "a" and "b", and logical add of "b" and "c". The node c13 represents logical multiplication of the output branch of the node c11 and the output branch of the node c12.

[5.3.3] Step of Scheduling

Step S222 of scheduling shown in FIG. 53 is a step of concretely determining control steps to execute each arithmetic operation in the operation description, in consideration of the entire hardware amount and time restriction of total control steps and the like. That is to say, the scheduling determines when to execute arithmetic operations corresponding to nodes of CDFG. In other words, the scheduling determines in which clock step arithmetic operations corresponding to the nodes of CDFG are to be executed. In this case, the scheduling is performed so that the entire nodes are settled within the clock cycle, in consideration of the delay period of each arithmetic operation. The scheduling is sorted into speed prioritized scheduling and hardware amount prioritized scheduling. In the speed prioritized scheduling, the number of the entire control steps is given as the restriction, and the scheduling is performed so that the hardware amount is to be small under such condition. On the other hand, in the hardware amount prioritized scheduling, the hardware amount capable of being used is given as the restriction, and the scheduling is performed so that the number of control steps is to be the minimum under such condition.

Figure 55:
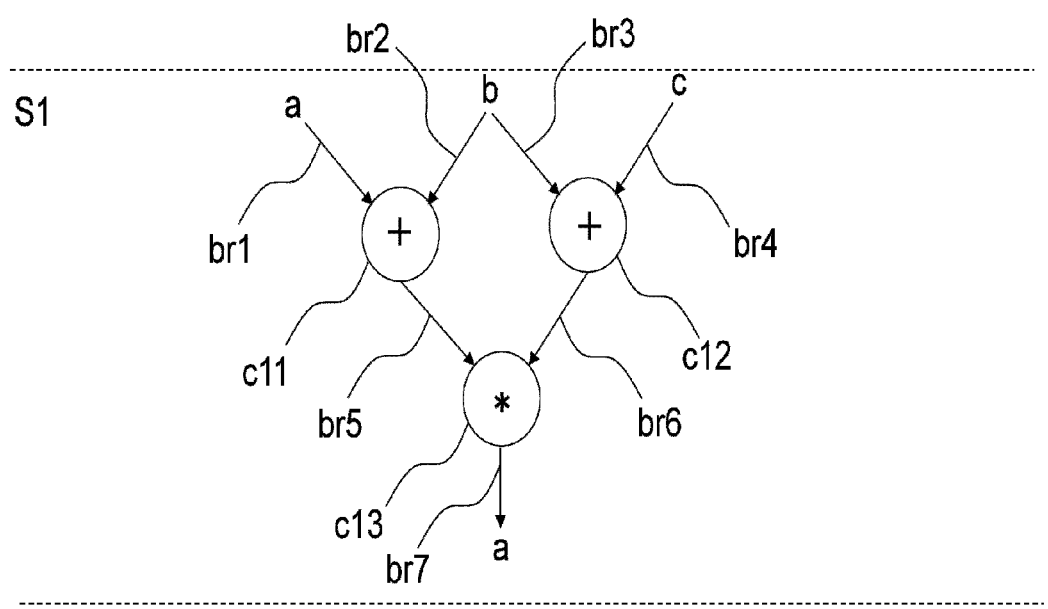
FIG. 55 is a view showing a result of scheduling the CDFG shown in FIG. 54 by a speed prioritized scheduling.

FIG. 55 is a view showing a result of scheduling the CDFG shown in FIG. 54 by a speed prioritized scheduling. With reference to FIG. 55, in step S1, the logical multiplication of the logical add of "a" and "b" shown by the node c11 of CDFG shown in FIG. 54, the logical add of "b" and "c" shown by the node c12, the output branch of the node c11 shown by the node c13, and the output branch of the node c12 is executed. In this manner, in the speed prioritized scheduling shown in FIG. 55, a given logic circuit may be executed in one step. However, since the logical add of "a" and "b" shown by the node c11, and the logical add of "b" and "c" shown by the node c12 are executed in the same step, two logical adder circuits are required.

Figure 56:
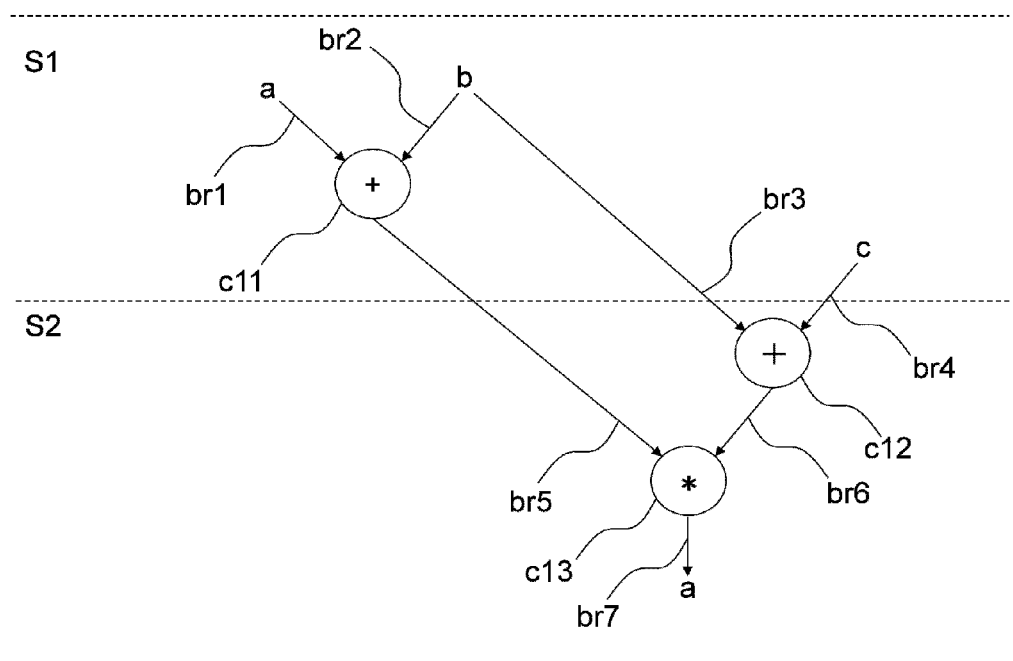
FIG. 56 is a view showing a result of scheduling the CDFG shown in FIG. 54 by a hardware amount prioritized scheduling.

FIG. 56 is a view showing a result of scheduling the CDFG shown in FIG. 54 by a hardware amount prioritized scheduling. With reference to FIG. 56, in step S1, the logical add of "a" and "b" shown by the node c11 among the CDFG shown in FIG. 54 is executed. Then, in step S2, the logical multiplication of the logical add of "b" and "c" shown by the node c12, the output branch of the node c11 shown by the node c13, and the output branch of the node c12 is executed. In this manner, in the hardware amount prioritized scheduling, a given logic circuit is executed in two steps, whereas a given logic circuit is executed in one step in the speed prioritized scheduling shown in FIG. 55. Accordingly, the processing time is increased in the hardware amount prioritized scheduling compared to that in the speed prioritized scheduling.

However, since the logical add of "a" and "b" shown by the node c11 and the logical add of "b" and "c" shown by the node c12 are executed in different steps, the two logical add arithmetic operations may be executed only by one logical adder circuit in the hardware amount prioritized scheduling, whereas two logical adder circuits are required in the speed prioritized scheduling shown in FIG. 55.

[5.3.4] Step of Allocation

An allocation is to allot an arithmetic operator to arithmetic operation nodes of CDFG based on the result of scheduling, whereby a multiplexer for data selection and a resister to store the data are generated, in addition to generating a controller to control the arithmetic operator, the resister and the multiplexer, whereby these are connected to each other to combine circuits. That is to say, in the allocation step (S223), a control step is allotted for each node representing the arithmetic operation of CDFG based on the dependent relation of data and given restrictions. At this time, estimation of the number of MLUTs to be used in generating logic circuits may also be performed.

The allocation may be executed by separating the arithmetic operator unit and the control unit. Hereinbelow, the arithmetic operator unit and the control unit are described in order.

There are three types of circuits which are included in the arithmetic operator unit. The first type is the one which may be configured by a full adder. Such circuit includes an adder/subtracter, a multiplier, a counter, and a comparison operator. The second type is the one which may be configured by a multicomplexer. Such circuit includes a multi-bit multicomplexer, and a barrel shifter. The third type is the one which may be configured by a memory circuit. Such circuit includes a look up table, and a resister file. In either of the types of arithmetic operators, a resister circuit is inserted in each step, that is to say, at each state of the state machine, when the allocation is performed. Here, a state machine is a digital device which transforms a plurality of predetermined states according to a given condition in a given order. The state of the state machine is one control step defined in the scheduling, such as "step S1" and "step S2" shown in FIG. 56.

The allocation of the arithmetic operator unit is executed based on the type of the arithmetic operator and the number of bits. The number of bits may be defined by the number of bits in a type of an advanced computer language, such as C language. Accordingly, CDFG compatible with the advanced computer language such as C language may be configured. Further, when the bit width is regarded as large in types such as int, short, and long, the number of bits may be defined in the variable declaration portions of C language by expanded directive. The number of MLUTs required in each arithmetic operator is determined based on the bit number defined in this manner.

In the first type of arithmetic operator capable of being configured by the multiplexer may perform the allocation by selecting either one of the allocation in which the hardware amount is prioritized, and the allocation in which the speed is prioritized. For example, in the allocation in which the hardware amount is prioritized, a multi-bit adder may be configured by combining full adders in multi-stages. Further, in the allocation in which the speed is prioritized, a multi-bit adder may be configured by full adders which can be combined in multi-stages and a carry look ahead logic circuit.

In the MPLD configured by MLUTs including five AD pairs or more, the number of MLUTs configuring the arithmetic operator of the first type may be estimated based on the fact that a 2-bit adder is configured by one MLUT. For example, it is estimated that a 4-bit adder is configured by two bit adders. Further, it is estimated that an 8-bit adder is configured by four bit adders. In this case, the estimation of the number of MLUTs to be used in various adders will be easy.

The second type of arithmetic operator capable of being configured by the multiplexer may perform allocation based on the number of bits. For example, in a multi-bit multiplexer, data describing the number of MLUTs according to the number of bits may be stored in the storage section 214, whereby the estimation of the number of MLUTs to be used will be simplified.

The third type of arithmetic operator capable of being configured by the memory circuit may perform the allocation by regarding each MLUT as a memory circuit of N bits×N words. In the MPLD which operates as a logic circuit, when a part of the MLUTs are capable of operating as the memory circuit, it is possible for only the MLUTs operating as the arithmetic operators of the third type in the MPLD to operate as the memory circuit. Accordingly, the logic circuits and the memory circuits may be mounted in the MPLD in a combined manner.

The control circuit is, for example, an if statement, a case statement, and a call statement of functions, in a C language. The allocation for the control circuit may be performed by a circuit configured by a 2-intput NAND circuit and an NOT circuit.

As described above, by performing allocation in which the arithmetic operation circuit and the control circuit are separated from each other, and the arithmetic operation circuit is sorted into the first to the third type, a suitable allocation for each circuit configuration may be executed.

The estimation of the control circuit may be performed by hypothetically logically combing circuits configured by a 2-input NAND circuit and an NOT circuit, and technology mapping such circuit. For example, an if statement may be configured by a comparison circuit including a 2-intput NAND circuit and an NOT circuit.

[5.3.5] Surface Segmentation

There are cases in which, as a result of the allocation of the logic circuits and the estimation of the number of MLUTs of the arithmetic operation circuit unit and the control circuit unit, the estimated logic circuits are judged to be incapable of being mounted in one MPLD. In such cases, the logic circuit is required to be subjected to surface segmentation into a plurality of logic blocks capable of being mounted in one MPDL.

As described above, the MPLD is a logic circuit capable of reconfiguration. Accordingly, when a logic circuit cannot be mounted in one MPLD, the logic circuit may be segmented into a plurality of logic blocks which can be mounted in one MPLD, whereby the processing may be executed in order for each segmented logic block. In this description, segmenting a logic circuit of the arithmetic operator unit, the control unit, and the like, into sizes capable of being mounted in one MPLD is referred to as "a surface segmentation". Note that the term "logic circuit" used in the explanation of the surface segmentation is a logic circuit shown by the allocated CDFG data, and the term "logic block" is the CDFG data obtained by segmenting the logic circuit configured by the allocated CDFG data into a suitable size.

Figure 57:
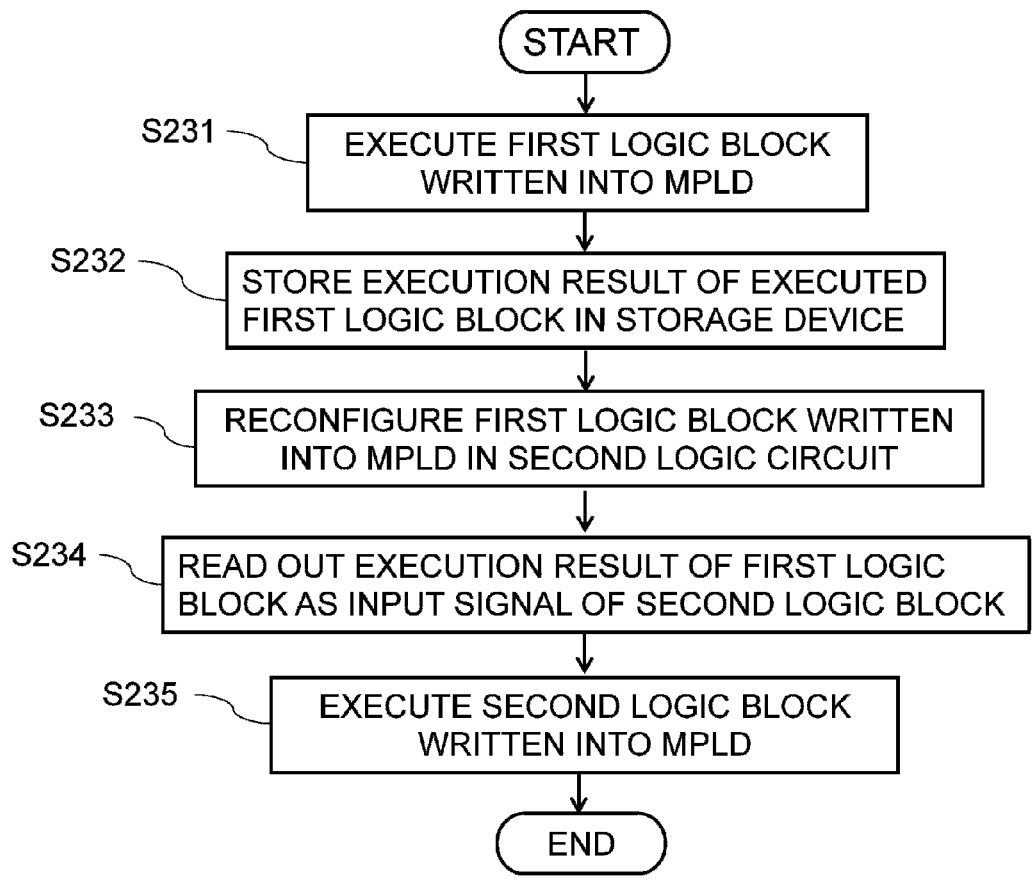
FIG. 57 is a view showing one example of executing a logic circuit which is subjected to a surface segmentation into two logic blocks of a first logic block and a second logic block.

FIG. 57 is a view showing one example of executing a logic circuit which is subjected to a surface segmentation into two logic blocks of a first logic block and a second logic block. In this example, a logic circuit may be executed by the semiconductor device 100 in which MPLD 20 and arithmetic processing section 220 are mounted, and a storage device. Further, the logic circuit may also be executed by the semiconductor device 100 in which the storage section 26, in addition to the MPLD 20 and the arithmetic processing section 220, are mounted. The storage device or the storage section is connected to the output of the MPLD 20, and stores the first logic block, the second logic block, and the execution results of the first logic block.

In step S231, the arithmetic processing section executes the first logic block written into the MPLD. The first logic block may be configured by one or a plurality of states. In step S232, the arithmetic processing section stores the execution result of the first logic block executed in step S231 in the storage device. By storing the execution result of the first logic block in the storage device, the execution result of the first logic block may be saved, whereby the same may be used as the input of the second logic block, while reconfiguring the first logic block of the MPLD to the second logic block. In step S233, the arithmetic processing section reconfigures the first logic block written into the MPLD to the second logic block. At the time of reconfiguration, the entire MLUTs in the MPLD may be rewritten, or the MLUTs used in the first and the second logic blocks may be selectively rewritten. Further, a partial reconfiguration in which a part of the MLUT is rewritten may be performed. In step S234, the arithmetic processing section reads out the execution result of first logic block stored in the storage device in step S232 as an input signal of the second logic block. In step S235, the arithmetic processing section inputs the execution result of the first logic block read out in step S234, as the input signal of the second logic block, into the input terminal of the MPLD, and executes the second logic block.

In this example, the logic circuit is subjected to surface segmentation into two logic blocks, although the logic circuit may be subjected to surface segmentation into a suitable number of logic blocks, based on the size of the MPLD and the size of the estimated logic circuits. The surface segmentation may be performed by the information processor 210 shown in FIG. 42.

Figure 58:
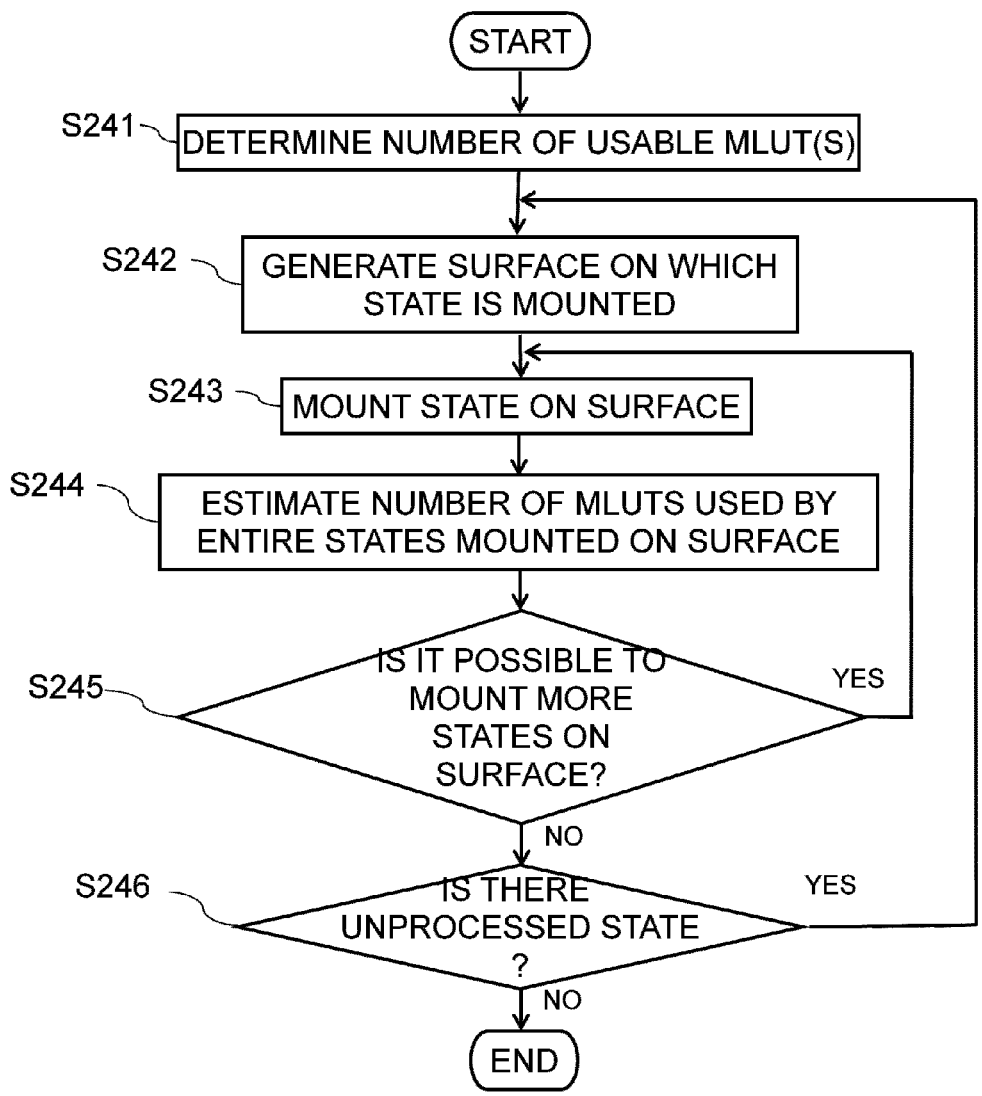
FIG. 58 is a view showing one example of surface-segmenting the logic circuit at an allocation.

FIG. 58 is a view showing one example of surface-segmenting a logic circuit at the allocation. With reference to FIG. 58, the flow of surface-segmenting the logic circuit estimated at the allocation into a plurality of logic blocks will be described.

In step S241, the information processor 210 determines the number of usable MLUTs. The information processor 210 may store data showing the relationship between the MLUTs mounted in the MPLD and the number of usable MLUTs, and the like, in a storage section. Such data may be created based on the arrangement/wiring of the MPLD. The number of the usable MLUTs may be determined based on this data. In step S242, the information processor 210 generates a surface on which a state is mounted. Here, the surface is referred to as a logic block on which one or a plurality of states of a logic circuit segmented into such state at each step are mounted. In step S243, the information processor 210 mounts the state on the surface. For example, in the initial step of the first surface, the first state after the allocation is mounted on a surface, and in the step after the first state is mounted, the second state is mounted. In step S244, the information processor 210 estimates the number of MLUTs to be used by the entire states mounted on the surfaces. The estimation may be performed by adding the number of MLUTs of each allocated state.

In step S245, the information processor 210 judges whether it is possible to mount more states on a surface. The information processor 210 judges whether it is possible to mount more states on a surface, based on the estimation of the number of MLUTs to be used by the entire states mounted on the surfaces, and the number of MLUTs which are capable of being mounted in the MPLD 20. When the information processor 210 judges that it is possible to mount more states on a surface, the processing returns to step S243, and mounts the next state on a surface. When the information processor 210 judges that it is not possible to mount more states on a surface, the processing moves on to step S246. At this time, with regard to the state of the control circuit unit, the information processor 210 is required to judge whether the same should be mounted on a surface, or the same should be generated as an MPU instruction code without mounting the same on the surface. When the state of the control circuit unit is generated as the MPU instruction code, the information processor 210 judges that it is not possible to mount more states on a surface, and the state moves on to processing of generating a new surface, without being mounted on a surface. Further, the information processor 210 stores the state of the control circuit unit in the storage section so as to generate the same as an MPU instruction code.

In step S246, the information processor 210 judges whether there are unprocessed states. If there is an unprocessed state, the processing returns to step S243, and generates a new surface on which the state is mounted. When there is no unprocessed state, the information processor 210 ends the processing.

[5.3.6] Step of Generating MPU Instruction Code

The step S224 of generating the MPU instruction code shown in FIG. 53 is a step to generate an MPU instruction code from a state of the control circuit unit which is judged to be generated as the MPU instruction code in step S241 at the time of surface segmentation shown in FIG. 58. As described above, a control circuit may include an if statement, a case statement, and a call statement of functions, for example in a C language. In step S224, the information processor 210 converts such functions to a low-level language which is capable of being read by the arithmetic processing section.

The MPU instruction code generated in step S224 may be stored in the storage section 26 which is mounted in the semiconductor device 100 together with one MPLD 20 and the arithmetic processing section 220. Further, the MPU instruction code may also be stored in a storage device (not shown) used together with the semiconductor device 100.

[5.3.7] Step of Generating RTL-CDFG

The step S225 of generating the RTL-CDFG shown in FIG. 53 is a step to generate a CDFG of an RTL level from the CDFG allocated in step S223 of allocating the CDFG. In step S223 of allocating the CDFG, when the surface segmentation is performed, CDFG of the RTL-level is generated for each logic block being subjected the surface segmentation.

The RTL-CDFG generated in step S225 may be converted into suitable bit stream data by the arrangement/wiring flow described with reference to FIGS. 42 and 43. When the surface segmentation is performed, the bit stream data is generated for each logic block being subjected the surface segmentation.

One or a plurality of pieces of bit stream data which is subjected to the arrangement/wiring may be stored in a storage section which is mounted in the semiconductor device together with an MPLD and an arithmetic processing section. Further, such bit stream data may also be stored in a storage device (not shown) used together with the semiconductor device. When the surface segmentation is performed, the arithmetic processing section may reconfigure the plurality of logic blocks on the MPLD by using such bit stream data.

[5.4] Reconfiguration in Semiconductor Device on which One MPLD and Arithmetic Processing Section are Mounted The logic circuit information may be reconfigured also in the semiconductor device 100 in which one MPLD 20 and the arithmetic processing section 220 are mounted as shown in FIG. 51, in the same manner as in the semiconductor device 100 in which one MPLD 20 is mounted as shown in FIG. 41.

Figure 59:
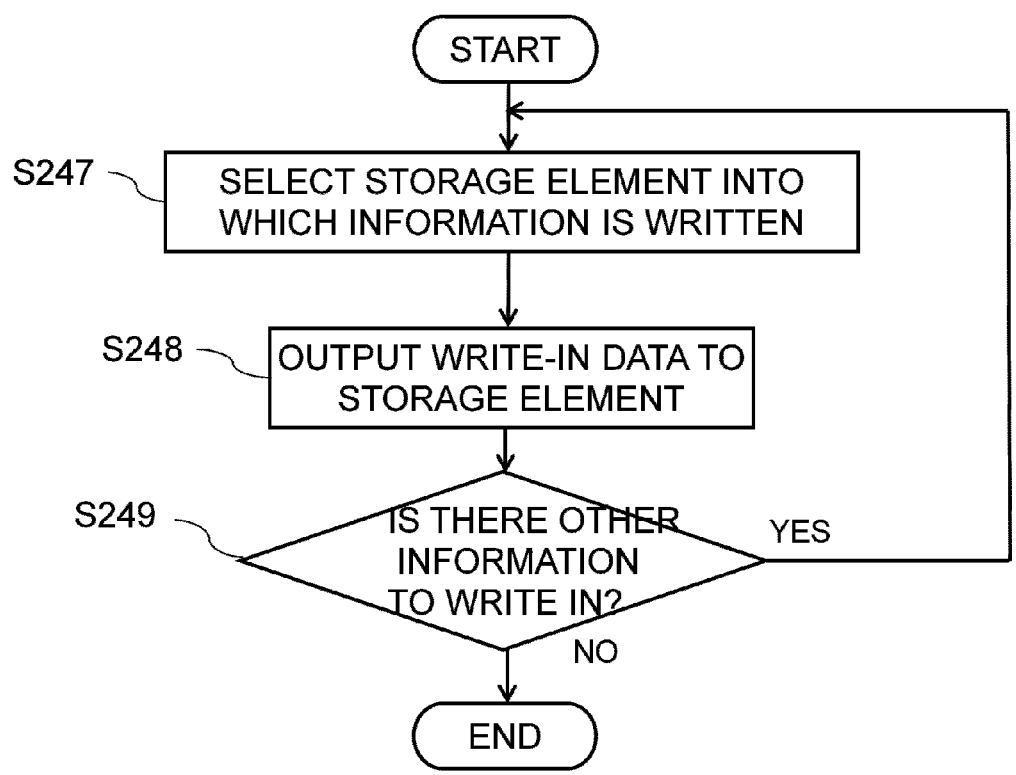
FIG. 59 is a view showing one example of a flowchart describing a procedure of writing information such as logic circuit information into the MLUT.

FIG. 59 is a view showing one example of a flowchart describing a procedure of writing information such as logic circuit information into the MLUT. In step S247, the arithmetic processing section 220 selects the storage element 4 into which information such as logic circuit information is written. Next, in step S248, the arithmetic processing section 220 outputs the writing-in data to the storage element 4. In step S249, the arithmetic processing section 220 judges whether there is other information to write in, and when there is other information to write in, the processing returns to step S247, and continues the writing in of information. When there is no more information to write in, the write-in processing is ended. The writing in of information may be performed for the entire $n \times 2^n$ number of storage elements, or may be performed for a part of the $n \times 2^n$ number of storage elements.

The logic circuit information of the MPLD 20 may be reconfigured in the above described manner. However, the semiconductor device 100 shown in FIG. 51 includes the arithmetic processing section 220 therein, whereby the instruction regarding the reconfiguration may be executed by the arithmetic processing section 220. In this case, the arithmetic processing section 220 mounted in the semiconductor device 100 can execute the reconfiguration without using the information processor 210 or the microprocessor on a substrate on which the semiconductor device 100 is mounted. Accordingly, the semiconductor device 100 is not required to be connected to the input sections of the information processor 210 or the microprocessor on the substrate for reconfiguration. Further, the arithmetic processing section 220 mounted on the semiconductor device 100 writes the logic circuit information into the MPLD 20, whereby the operation can be performed in high speed. Accordingly, in the semiconductor device 100 shown in FIG. 51, a reconfiguration which is high speed and simple is made possible.

[5.5] Partial Reconfiguration in Semiconductor Device in which One MPLD and Arithmetic Processing Section are Mounted Also in the semiconductor device 100 in which one MPLD 20 and the arithmetic processing section are mounted as shown in FIG. 51, the logic circuit information of MPLD 20 may be partially reconfigured in the same manner as in the semiconductor device 100 in which one MPLD 20 is mounted as shown in FIG. 41. That is to say, the logic circuit information of the MPLD 20 may be partially reconfigured by the same flow as the flow described with reference to FIG. 44. However, since the semiconductor device 100 shown in FIG. 51 includes the arithmetic processing section 220 therein, the partial reconfiguration may be executed by the arithmetic processing section 220 mounted in the semiconductor device 100 without using the information processor 210 or the microprocessor on a substrate on which the semiconductor device 100 is mounted, in the same manner as in the case of the above described reconfiguration.

[6] Semiconductor Device in which Two MPLDs and Arithmetic Processing Section are Mounted Here, an example of a semiconductor device in which two MPLDs and arithmetic processing section are mounted will be described.

Figure 60:
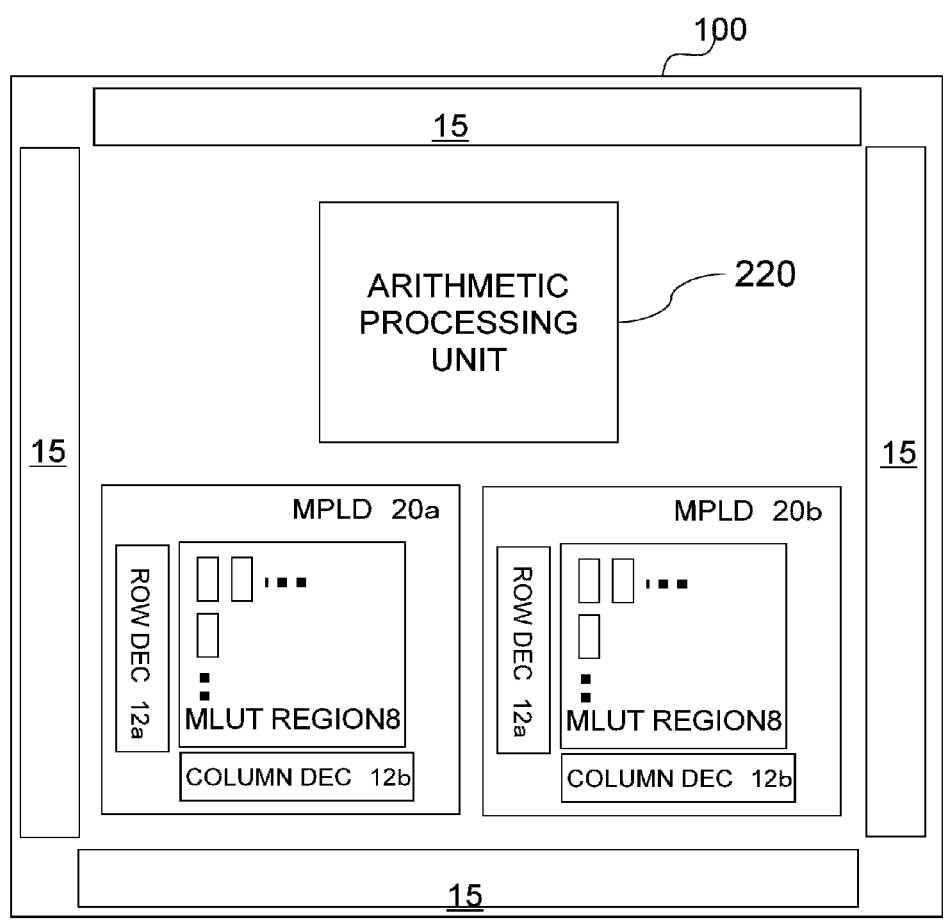
FIG. 60 is a view showing an example of an arrangement structure of the semiconductor device in which the MPLD is mounted in another example.

[6.1] Semiconductor Device in which Two MPLDs and Arithmetic Processing Section are Mounted FIG. 60 is a view showing a first example of an arrangement structure of the semiconductor device in which the MPLD is mounted. The semiconductor device 100 includes a first MPLD 20a, a second MPLD 20b, the arithmetic processing section 220, and the input/output circuit section 15. Since the input/output circuit section 15 and the arithmetic processing section 220 are the same as those in the example described with reference to FIG. 41, the description thereof will be omitted here. The first MPLD 20a and the second MPLD 20b are capable of operating separately.

The wirings between the first MPLD 20a and the second MPLD 20b and the arithmetic processing section 220, and the wirings between the first MPLD 20a and the second MPLD 20b and the input/output circuit section 15 have already been described with reference to FIGS. 51, 52 and the like, and the description thereof will be omitted here.

The first MPLD 20a and the second MPLD 20b may be connected directly by the AD pair included in the MLUT configuring each MPLD. By connecting the first MPLD 20a and the second MPLD 20b directly without placing a bus circuit and the like in between, the signal processing between the two MPLDs may be performed with higher speed.

Figure 61:
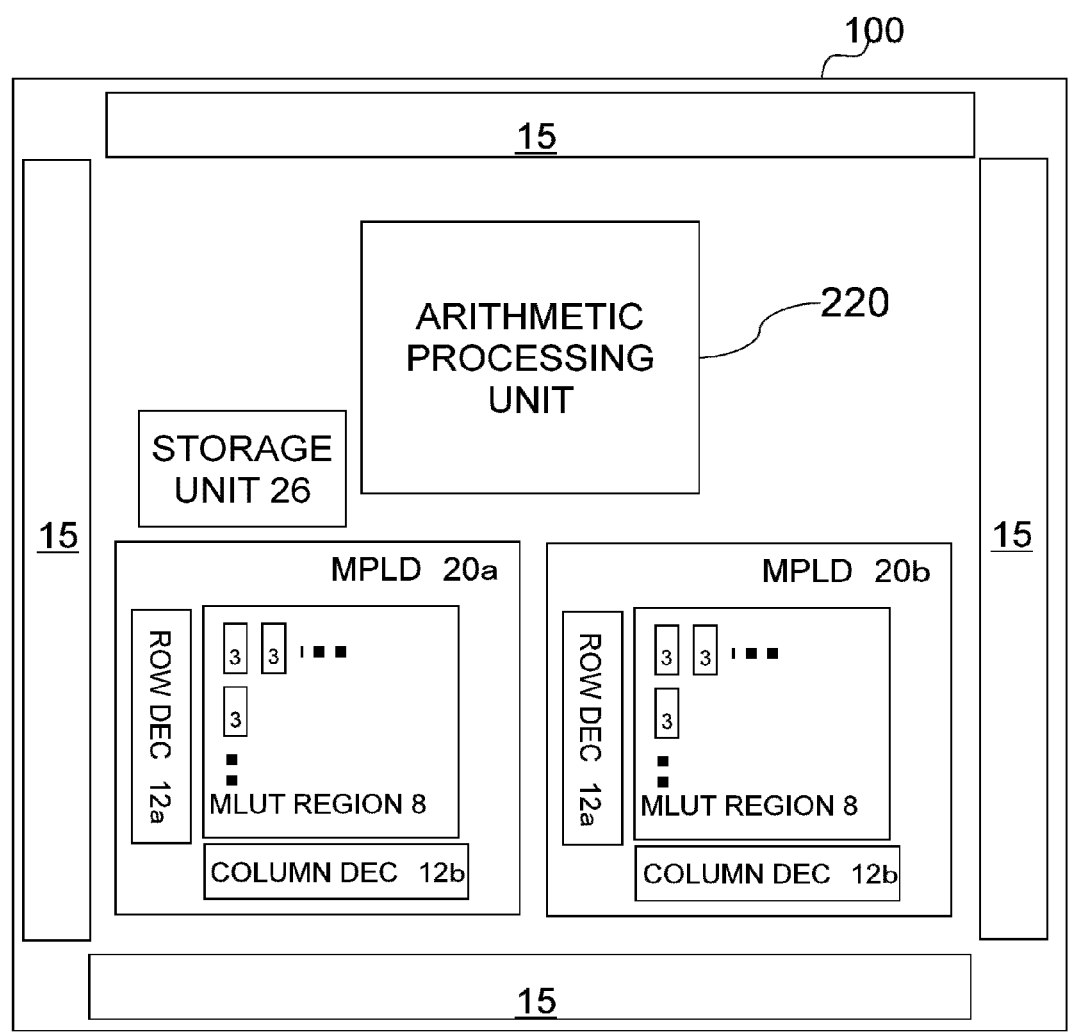
FIG. 61 is a view showing an example of an arrangement structure of the semiconductor device in which the MPLD is mounted in still another example.

FIG. 61 is a view showing a second example of an arrangement structure of the semiconductor device in which the MPLD is mounted. With reference to FIG. 61, the semiconductor device 100 of this example includes a first MPLD 20a, a second MPLD 20b, the arithmetic processing section 220, the input/output circuit section 15, and the storage section 26.

The storage section 26 stores the execution results of the logic circuit executed respectively in the first MPLD 20a and the second MPLD 20b, and also stores programs including the MPU instruction codes executed by the arithmetic processing section 220. The semiconductor device 100 mounts the storage section 26, whereby the following described dynamic reconfiguration processing may be made easier. The storage section 26 are connected to the first MPLD 20a, the second MPLD 20b and arithmetic processing section 220, so that the execution results of the logic circuit in the MPLD may be stored.

Figure 62:
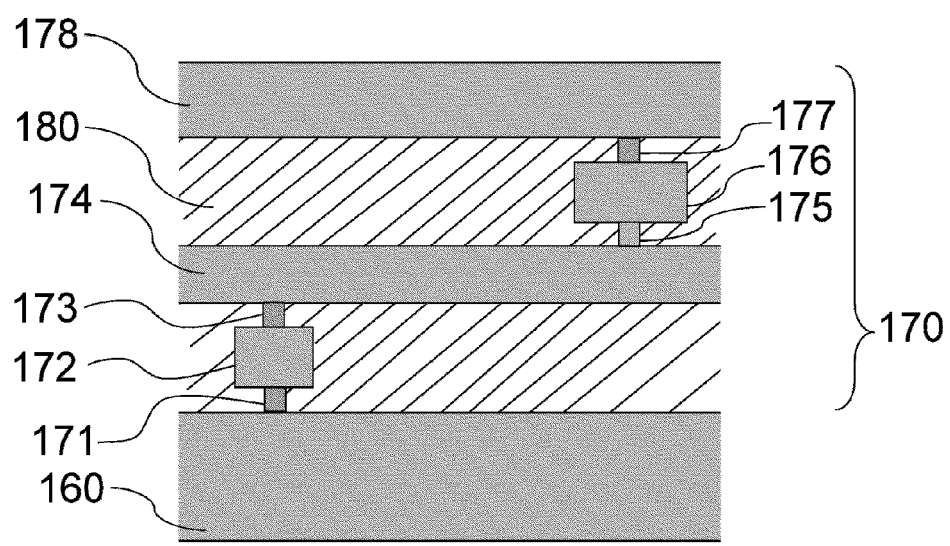
FIG. 62 is a cross-section view showing one example of wiring layers in the semiconductor device.

FIG. 62 is a cross-section view showing one example of wiring layers in the semiconductor device. The semiconductor device 100 includes a wiring layer 170 above a semiconductor substrate 160 on which circuit devices (not shown) such as MOS transistors are formed. The wiring layer 170 suitably connects plurality of wirings arranged on each wiring layer, whereby each terminal of circuit devices formed on the circuit substrate may be connected. By suitably connecting each terminal of the circuit devices included in the semiconductor device 100, the semiconductor device 100 may realize a desired operation.

The wiring layer 170 includes four wiring layers of the first wiring layer 172, a second wiring layer 174, a third wiring layer 176, and a fourth wiring layer 178. The semiconductor substrate 160 and the first to the fourth wiring layers 172, 174, 176 and 178 are connected via a first to a fourth via connection sections 171, 173, 175 and 177, respectively. Insulation layers 180 shown in shaded areas are filled in between the layers of the first to the fourth wiring layers 172, 174, 176 and 178, and the first to the fourth via connection sections 171, 173, 175 and 177.

As shown in the figure, the first wiring layer 172 is formed in a linear fashion in a cross-section surface. A part of the first wiring layer 172 is connected in between two terminals of the circuit element formed on the circuit substrate via the first via connection section 171. Another part of the first wiring layer 172 is connected to the terminal of the circuit element formed on the circuit substrate via the first via connection section 171, and is connected t the second wiring layer 174 via the second via connection section 173. Further, the other part of the first wiring layer 172 is connected to two different layers of the second wiring layers 174 via the second via connection section 173.

The second wiring layer 174 is formed with a plurality of layers so as to be substantially a linear shape in the direction perpendicular to the first wiring layer 172 when the surface of the semiconductor substrate in which the circuit element is formed is observed from above. A part of the second wiring layer 174 is connected in between two different layers of the first wiring layer 172 via the second via connection section 173. Another part of the second wiring layer 174 is connected to the first wiring layer 172 via the second via connection section 173, and is connected to the third wiring layer 176 via the third via connection section 175. Further, the other part of the second wiring layer 174 is connected to two different layers of the third wiring layers 176 via the third via connection section 175.

The third wiring layer 176 is formed with a plurality of layers so as to be substantially a linear shape in the direction parallel to the first wiring layer 172 when the surface of the semiconductor substrate in which the circuit element is formed is observed from above. A part of the third wiring layer 176 is connected in between two different layers of the second wiring layer 174 via the third via connection section 175. Another part of the third wiring layer 176 is connected to the second wiring layer 174 via the third via connection section 175, and is connected to the fourth wiring layer 178 via the fourth via connection section 177. Further, the other part of the third wiring layer 176 is connected to two different layers of the fourth wiring layers 178 via the fourth via connection section 177. Generally, the third wiring layer 176 is formed to have a larger cross-section area compared to the first wiring layer 172 and the second wiring layer 174.

The fourth wiring layer 178 is formed with a plurality of layers so as to be substantially a linear shape in the direction parallel to the second wiring layer 174 when the surface of the semiconductor substrate in which the circuit element is formed is observed from above. The fourth wiring layer 178 is connected to two different layers of the third wiring layers 176 via the fourth via connection section 177. Generally, the fourth wiring layer 178 is formed to have an even larger cross-section area compared to the third wiring layer 176.

The first to the fourth wiring layers 172, 174, 176 and 178 may be formed by conductive materials, such as aluminum, or copper which is used as barrier metal. The first to the fourth via connection sections 171, 173, 175 and 177 may also be formed by conductive materials such as aluminum. The insulation layers 180 may be formed by insulation materials such as silicon dioxide.

In this manner, the wiring layers in the semiconductor device are formed to connect each terminal of circuit elements respectively formed on the semiconductor substrate. In semiconductor devices referred to as a system-on-chip (herein below referred to as SOCs), an arithmetic processing section, a storage section, an analog-digital conversion section, an input/output circuit section, and the like, are mounted on the semiconductor substrate. When the arithmetic processing section is not requested of processing with high function, for example when performing arithmetic operation processing of 8 bits or 16 bits, the arithmetic processing section may be formed generally by a wiring layer of approximately four layers. Further, other configuration elements such as the storage section to be mounted in the SOCs may also be formed by a wiring layer of generally four layers or less.

As described above, the MPLD includes a SRAM having the CMOS transistors and a logic circuit which may be configured by CMOS transistors. Accordingly, the MPLD may be manufactured by using a memory circuit technique for SRAM and CMOS circuit technique. Such technique may be formed generally by wiring layers of approximately three or four layers, even with consideration of the integration degree of the semiconductor device. Further, the MPLD may be used for the switching function, whereby a connection channel region is not required to be provided, as in the FPGA. Accordingly, the MPLD can be expected with approximately the same integration degree as other elements manufactured by general CMOS circuit techniques. Thus, the MPLD may also be formed by wiring layers of approximately three or four layers.

As described above, the wiring layers of the MPLD may be formed by wiring layers of four layers or less, in the same manner as other configuration elements mounted in SOCs. This means that the MPLD has affinity to the SOC with respect to the manufacturing of semiconductor devices. That is to say, the MPLD may be easily mounted in SOC semiconductor devices. Other reconfigurable logic circuits such as FPGA generally have wiring layers of multi layers of approximately eight to ten layers in consideration of integration degree. Accordingly, even when the SOC circuit section does not require multi layer wirings, the reconfigurable logic circuits such as FPGA require multi layer wirings, whereby the semiconductor device will have multi layer wiring structure. On the other hand, the MPLD may have wiring layer structure of approximately three or four layers, as described above. Thus, the wiring layer structure of the semiconductor device can be determined based on the wiring layer structure of the SOC circuit section. For example, the semiconductor device 100 has physical wiring layer number of four layers or less.

[6.2] Dynamic Reconfiguration in Semiconductor Device in which Two MPLDs and Arithmetic Processing Section are Mounted

[6.2.1] Dynamic Reconfiguration Flow of MPLD

Here, one example of a flow to dynamically reconfigure an MPLD to be mounted in a semiconductor device will be described.

Figure 63:
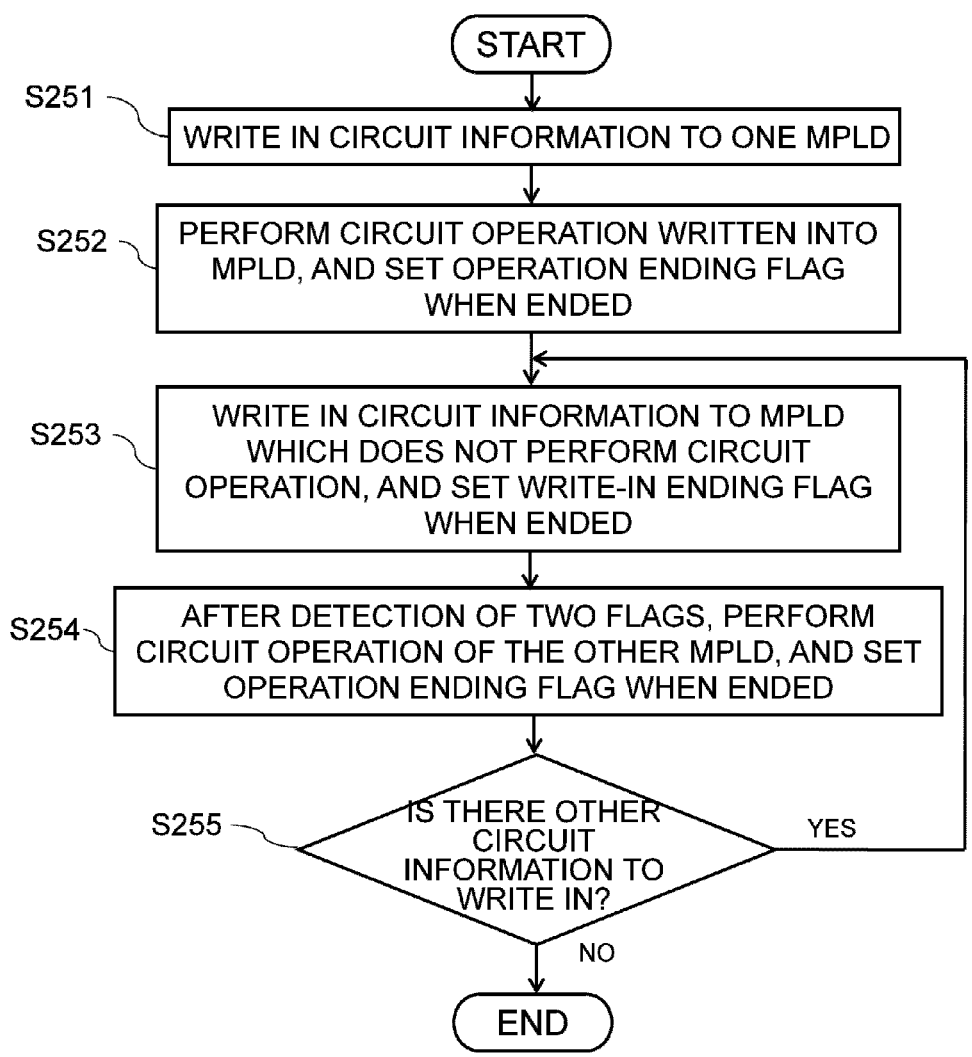
FIG. 63 is a view showing one example of a flow of partially reconfiguring the MPLD to be mounted on the semiconductor device.

FIG. 63 is a view showing one example of a flow of partially reconfiguring the MPLD to be mounted on the semiconductor device. In step S251, the arithmetic processing section 220 writes logic circuit information into either one of the first MPLD 20a or the second MPLD 20b, or both of the MPLDs. The logic circuit information to be written in here is generally the bit stream data described with reference to FIGS. 42 and 39. The bit stream data may be stored in the storage section mounted in the semiconductor device or may be stored in a storage device connected to the semiconductor device. When the logic circuit information is written into both of the first and the second MPLDs, step S253 will be omitted in the first cycle.

In step S252, the arithmetic processing section operates the logic circuit information written into either one of the MPLDs in step S251. The arithmetic processing section 220 stores the operation results of the logic circuit information written into either one of the MPLDs in the storage section mounted in the semiconductor device, and the like. Accordingly, the stored operation results can be used for the input to the other MPLD. Further, when the AD pairs of the two MPLDs are connected, either one of the MPLD may retain the operation results even after the operation is ended, whereby the operation results may be provided to the other MPLD as input signals by an instruction from the arithmetic processing section. When the logic operation is ended, the arithmetic processing section receives a flag showing that the logic operation has ended from the MPLD.

In step S253, the arithmetic processing section writes the logic circuit information to the other MPLD which is not subjected to the logic operation. When the writing in is ended, the arithmetic processing section receives a flag showing that the writing in has ended from the MPLD. As described above, in the first cycle, the logic circuit information may be written into both of the MPLDs at the same time before the MPLD is subjected to the logic operation. Also in this case, the arithmetic processing section receives a flag showing that the writing in has ended when the writing in is ended.

In step S254, when the arithmetic processing section receives the flag showing that the logic operation has ended in one MPLD and the flag showing that the writing in of the other MPLD has ended, the arithmetic processing section starts the logic operation of the other MPLD in which the writing in has ended. After step S254 in which the logic operation of the other MPLD has been started, in step S255, the arithmetic processing section judges whether there is other logic circuit information to write in. When there is other logic circuit information to write in, the processing returns to step S253. Then, the writing in of the logic circuit information to the MPLD in which the logic operation is not performed is started. When there is no other logic circuit information to write in, the arithmetic processing section receives a flag that the logic operation is ended from the MPLD, and thereafter ends the processing.

The dynamic reconfiguration described here may be realized by using the MPU instruction code described with reference to FIG. 53 and a plurality of pieces of bit stream data generated by the RTL-CDFG subjected to surface segmentation. The arithmetic processing section executes the reconfiguration of the MPLD, the logic operation starting instruction, or the control circuit not being mounted in the MPLD in accordance with the arithmetic processing section instruction code. Further, the bit stream data which is the logic circuit information of the MPLD may be the bit stream data generated from the RTL-CDFG subjected to the surface segmentation. Accordingly, the data processing operation described in the operation description may be realized by the arithmetic processing section and the MPLD mounted in the semiconductor device which is a hardware. Thus, an operation with higher speed is made possible compared to operating the arithmetic processing section by an operation description which is a software.

[6.2.2] Example of Dynamic Reconfiguration

Here, the advantage of the dynamic reconfiguration will be described based on examples. The example pertains to encryption of a data encryption standard (DES) which is one of the common key encryption systems. Here, a general description for the encryption calculation of DES, followed by a description of the execution method of DES calculation in the semiconductor device of this example will be given.

[6.2.2.1] DES Algorithm

Figure 64:
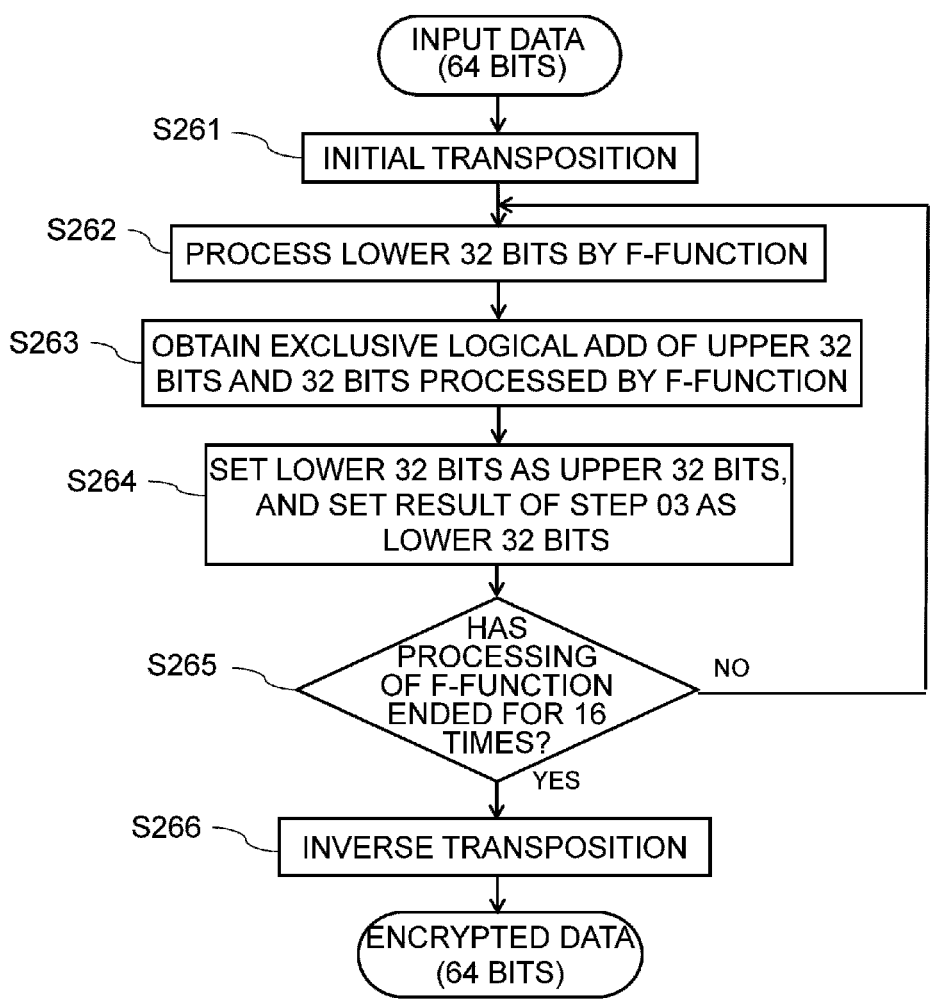
FIG. 64 is a view showing one example of a flow of DES calculation algorithm.

FIG. 64 is a view showing one example of a flow of DES calculation algorithm. DES receives a plain text of a fixed bit length (for example, 64 bits) as inputs. DES is a block encryption which encrypts the plain text by each plain text block of 64 bits by using an encryption key of 56-bit length. The encryption key has 64 bits, although 8 bits among the 64 bits are used for parity check, and thus the actual key length on the algorithm is 56 bits. The encryption key of DES is of a common key encryption system, whereby the same key is used for encryption and decryption. Further, DES is an encryption method in which a Feistel function (F-function) which is a round function to perform replacement and transposition is used, whereby encryptions and decryptions are repeatedly performed by using the F-function. In step S261, an initial transposition is performed. A predetermined transposition between bits is performed in the initial transposition. For example, the data of the first bit after the initial transposition is the data of the 58-bit of the input data, and the second bit after the initial transposition is the data of the 50-bit of the input data. By the initial transposition, each piece of data of 64 bits is performed with rearrangement in this manner.

In step S262, the lower 32 bits after the initial transposition are processed by the F-function. The processing of the F-function will be described by the flow shown in FIG. 65.

Figure 65:
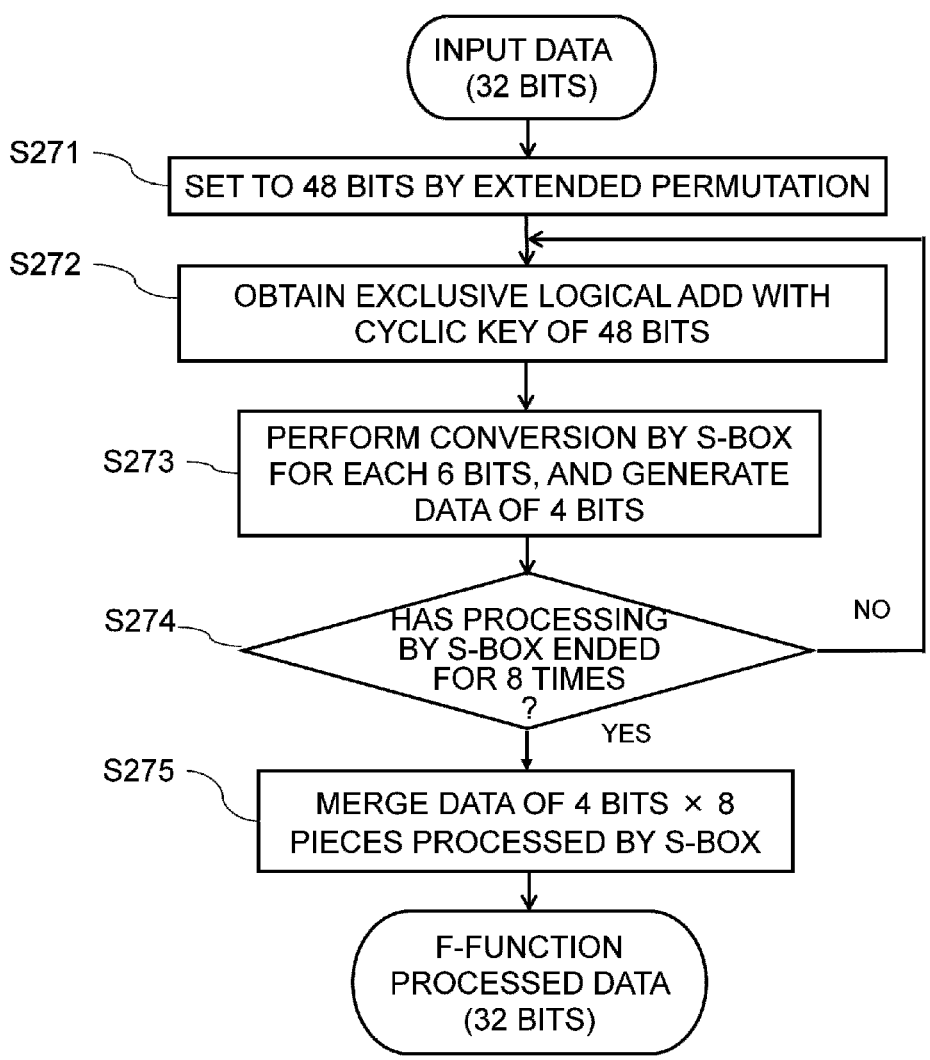
FIG. 65 is a view showing a flow of F-function algorithm.

FIG. 65 is a view showing a flow of F-function algorithm. The lower 32 bits of data which has been subjected to the initial transposition are inputted to the F-function. In step S271, the data of the inputted 32 bits are subjected to expansion permutation, whereby data of 48 bits is generated. Next in step S272, the processing of an exclusive logical add between the data of the 48 bits having being subjected to the expansion permutation and a cyclic key of 48 bits is performed.

Here, the cyclic key is described. The cyclic key is obtained by converting the common key by a certain algorithm, and is made to be a different key for every F-function processing which is performed for 16 times in one DES encryption. The conversion algorithm for the cyclic key includes transposition processing and cyclic shift processing.

A substitution box (S box) is a function to convert input of m bit(s) to output of n bit(s), and is $2^m$ number of look-up-tables. In step S273, the data of 48 bits subjected to the processing of the exclusive logical add with the cyclic key in step S272 is further subjected to processing to convert data of 6 bits to data of 4 bits by conversion performed by eight S boxes. As a result, the data which has been 48 bits before the processing of S boxes are converted to data of 32 bits by the processing of S boxes.

The S box is configured by a truth table including certain values of S1-S8. S1 is an S box which converts data of lower 6 bits, and S2 is an S box which converts data of lower 7-bit to the 12-bit. In the same manner, S7 is an S box which converts data of 36-bit to the 42-bit, and S8 is an S box which converts data of 43-bit to the 48-bit. Each S box is allotted with data of 4 bits for a matrix of 2 rows×4 columns. The row of 2-bit is configured by data of the most significant bit (MSB) of input data of 6 bits (which is the 6-bit), and the data of the least significant bit (LSB, which is the 1-bit). The column of 4-bit of the S box is configured by data of intermediate 4 bits without the MSB and LSB of 6-bit input (which is the 2-bit to the 5-bit). The input data of 6 bits is inputted to the S box having such configuration, and values of 4 bits in the corresponding truth table are outputted, whereby input data of 6 bits is converted to output data of 4 bits. As an example of the S box, an S box for S1 is shown in Table 1.

TABLE 1

| S box (S1) | | | | | | | | | | | | | | | | | |
|---|---|---|---|---|---|---|---|---|---|---|---|---|---|---|---|---|---|
| | 0000 | 0001 | 0010 | 0011 | 0100 | 0101 | 0110 | 0111 | 1000 | 1001 | 1010 | 1011 | 1100 | 1101 | 1110 | 1111 |
| 00 | 1110 | 0100 | 1101 | 0001 | 0010 | 1111 | 1011 | 1000 | 0011 | 1010 | 0110 | 1011 | 0101 | 1001 | 0000 | 0111 |
| 01 | 0000 | 1111 | 0111 | 0100 | 1110 | 0010 | 1101 | 0001 | 1010 | 0110 | 1100 | 1100 | 1001 | 0101 | 0011 | 1000 |

TABLE 1-continued

| S box (S1) | | | | | | | | | | | | | | | | |
|---|---|---|---|---|---|---|---|---|---|---|---|---|---|---|---|---|
| | 0000 | 0001 | 0010 | 0011 | 0100 | 0101 | 0110 | 0111 | 1000 | 1001 | 1010 | 1011 | 1100 | 1101 | 1110 | 1111 |
| 10 | 0100 | 0001 | 1110 | 1000 | 1101 | 0110 | 0010 | 1011 | 1111 | 1100 | 1001 | 0111 | 0011 | 1010 | 0101 | 0000 |
| 11 | 1111 | 1100 | 1000 | 0010 | 0100 | 1001 | 0001 | 0111 | 0101 | 1011 | 0011 | 1110 | 1010 | 0000 | 0110 | 1101 |

In S1, for example, when an input of 6 bits (100110) is given, the row is (10) by the MSB and the LSB, whereas the column is (0011) by the 4 bits in which MSB and LSB are excluded therefrom. Accordingly, the output data of 4 bits is (1000).

In step S274, whether the conversions by the S box are ended eight times is judged. When the processing by the S box is not entirely ended, the processing of the next S box is performed. Further, when the entire processing of the S box is ended, the processing proceeds to step S275. In step S275, the data of 4 bits subjected to processing by the eight S boxes of S1-S8 are all aligned, whereby data of 32 bits is generated.

The data of 32 bits generated by the processing of S boxes in step S263 shown in FIG. 64 is subjected to the processing of the exclusive logical add with the data of the higher 32 bits. In step S264, the data of the lower 32 bits of the input data of 64 bits are regarded as data of the higher 32 bits. Then, the data of 32 bits generated in step S263 is regarded as data of lower 32 bits.

In step S265, whether the series of processing including the processing of F-function is performed for 16 times is judged. When the processing is not performed for 16 times, series of processing from the processing of F-function is further performed. At this time, the cyclic keys are different in each processing. When the processing is performed for 16 times, in step S266, the data of 64 bits is subjected to inverse transposition, whereby the encryption processing is ended.

[6.2.2.2] DES Calculation Example in the Semiconductor Device in this Example

Here, a calculation example of DES algorithm in the semiconductor device in which two MPLDs and the arithmetic processing section are mounted, with reference to FIG. 64. It is assumed that the MLUT configuring the MPLD includes seven AD pairs.

The initial transposition of step S261 and the inverse transposition of step S266 shown in FIG. 64 may store the bits of the transposition destination by operating one MLUT as a memory circuit. This processing may be realized when it is possible to operate only a part of the MLUTs in the MPLD as the memory circuit. When it is not possible to operate only a part of the MLUTs in the MPLD as the memory circuit, it is also possible to make an external storage device or a storage section mounted in the semiconductor device store the bits of the transposition destination.

The calculation of the exclusive logical add of 32 bits and 48 bits in step S263 shown in FIG. 64 and in step S272 shown in FIG. 65 may be performed by the MPLD. The MPLD is suitable for arithmetic operations of multi inputs and multi outputs.

The processing performed by the S box eight times in step S273 may be realized by a dynamically reconfiguring the two MPLDs. For example, one MLUT is used as the truth table. Since the processing of the S box outputs 4 bits for a 6-bit input, when an MLUT including seven AD pairs, logic control address lines of six AD pairs are set as 6-bit inputs, and logic control data lines of four AD pairs are set as 4-bit output lines, whereby the truth table of S box may be realized. Further, while performing arithmetic operation processing of S box of S1 in one MPLD, arithmetic operation information of S box of S2 is written into the other MPLD. Further, while performing arithmetic operation processing of S box of S2 in one MPLD, arithmetic operation information of S box of S3 is written into the other MPLD, whereby arithmetic operation processing of S boxes may proceed while performing dynamic reconfiguration. In this manner, a circuit scale for realizing the same arithmetic operation processing may be diminished in a considerable degree compared to the case where the dynamic reconfiguration is not performed.

Also when generating the cyclic key to be used in step S272, the MPLD may be dynamically reconfigured to be used. As described above, the cyclic key is generated by adding the common key with the transposition processing and the shift processing, and different cyclic keys are used for each operation of the F function. Thus, by using two MPLDs with being dynamically reconfigured, while the arithmetic operation processing in which the cyclic key is used is performed in one MPLD, another cyclic key to be used in the next cycle may be generated and the write-in processing may be performed in the other MPLD.

Here, the dynamic reconfiguration realized in the semiconductor device in which two MPLDs and the arithmetic processing section are mounted has been described, however, the dynamic reconfiguration may also be realized in the semiconductor device in which one MPLD and the arithmetic processing section are mounted.

The dynamic reconfiguration may be possible when the MPLD is configured by using the MLUT described with reference to FIG. 19. The MLUT of this type includes two storage element groups selected by the selection signals. While performing the arithmetic operation processing in one storage element group, the logic circuit information of the other storage element group may be reconfigured, whereby the dynamic reconfiguration may be realized.

Further, the dynamic reconfiguration may also be possible when an MPLD which has physically one configuration is handled as two MPLDs in the logic operation. For example, by handling half region of one MPLD as the first MPLD section, and handling the other half of the region as the second MPLD section, the MPLD which has physically one configuration can be handled as two MPLDs in the logic operation.

[7] Semiconductor Device Suitable for Dynamic Reconfiguration

The dynamic reconfiguration of a programmable logic device (PLD) has been known. The dynamic reconfiguration is a technique to switch the circuit configuration of the PLD while the PLD is operating. The dynamic reconfiguration may realize functions of a large-scale circuit by a small-scale circuit by reconnecting a plurality of small-scale circuits frequently in a short amount of time according to a program.

The PLD is a circuit which realizes a wired logic executing instructions by physical connection of hardware by an arithmetic logical unit (ALU) and a look-up-table (LUT). The wired logic may realize a plurality of steps of processing by a microcode which is the arithmetic operation target of the CISC processor by expanding the same in one combination logic circuit. The CISC processor requires a plurality of clocks to execute one processing, whereas the wired logic can realize the same by one clock, and is capable of performing the processing in a high speed without stopping the data flow. Thus, the processing capability per one clock is higher compared to the CISC processor. Accordingly, the circuit configuration of the wired logic realizes a series of data flow with the plurality of circuit functions, and is referred to as "a data path".

The dynamically reconfigurable PLD does not switch dedicated circuits fixed for each function, but configures the dedicated circuits by performing rearrangement of small-scale circuits, whereby the plurality of small-scale circuits perform pipeline processing in cooperation with each other. Note that the "pipeline" is referred to as an operation processing performed in series.

Generally, the dynamically reconfigurable PLD is ALU-based or LUT-based. The ALU is an arithmetic operator set including an adder, a shifter, a multiplier, and the like, which realizes a plurality of functions by one ALU. The ALU-based dynamically reconfigurable PLD selects the function of ALU, whereby the dynamic reconfiguration is performed. Since an LUT is a memory cell unit including a plurality of memory cells, an LUT-based dynamically reconfigurable PLD requires the rewriting of memory cell unit when performing reconfiguration. Further, since the LUT-based dynamically reconfigurable PLD includes dedicated switching circuit for connections between the memory cell unit, the resetting of the switching circuit is also required when performing reconfiguration.

The following described semiconductor device including MPLD as the programmable logic sections includes at least two MPLDs; a cache section which retains configuration information of the MPLDs; and a configuration control section which outputs the configuration information retained in the cache section to the MPLDs. When one of the MPLDs is reconfigured by the configuration information configuring the branch logic, the configuration control section speculatively reconfigures the second programmable logic section among the plurality of programmable sections by the second configuration information configuring the branch destination circuit of the branch logic, before the execution of the branch logic. By speculatively reconfiguring the MPLD in this manner, the reconfiguration of MPLD is not required after the branch is determined, whereby the reconfiguration time may be reduced.

Hereinbelow, detailed examples of [7.1] semiconductor device, [7.2] configuration example of MPLD, [7.3] operation flow of semiconductor device will be described in order. Note that the ones described in [1] and [2] may be applicable to the MPLD and the MLUT.

[7.1] Semiconductor Device

Figure 66:
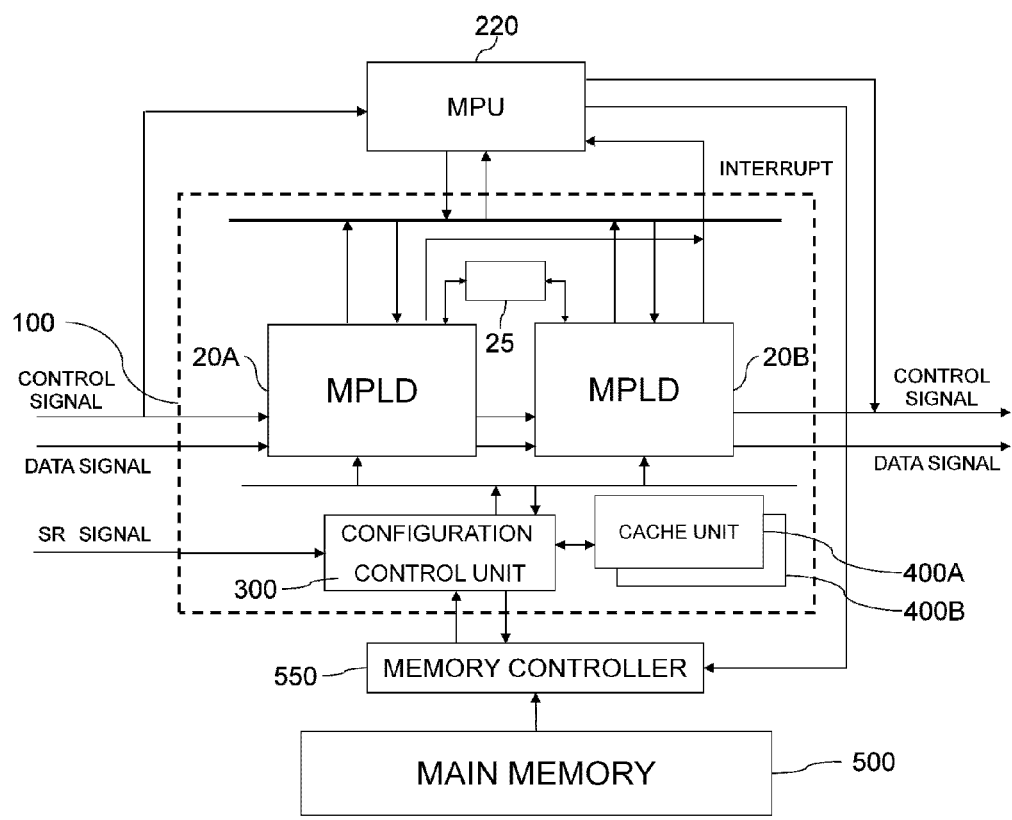
FIG. 66 is a block diagram of one example of a semiconductor device.

FIG. 66 is a block diagram of one example of a semiconductor device.

The semiconductor device 100 shown in FIG. 66 includes MPLDs 20A and 20B as the configuration available sections, variable retaining section 25, configuration control section 300, and cache sections 400A and 400b. The semiconductor device 100 is connected to the micro processing unit (MPU) 200 as the arithmetic processing section, and is connected to the main memory 500 as the storage section via the memory controller 550. The semiconductor device 100 may be an integrated circuit (IC) which is integrated with the MPU 220 and/or the memory controller 550 and the main memory 500.

[7.1.1] MPLD

The MPLDs 20A and 20B as the programmable logic section respectively include multi look-up-tables (MLUTs) which are a plurality of memory cell units. The memory cell unit of MLUT may be configured by static random access memory (SRAM). The MLUT functions as the logic element or the connection element which connects a plurality of logic elements.

The MPLDs 20A and 20B are reconfigured by writing in configuration information. The reconfiguration information is generated per reconfiguration unit in which a plurality of MLUTs are the configuration units, so that the MPLDs 20A and 20B may be partially reconfigured. The plurality of MLUTs reconfigured by the configuration information per reconfiguration unit is hereinbelow referred to as "a bank", and the reconfiguration unit is hereinbelow referred to as "a bank unit". When the data signals are received from outside, the MPLDs 20A and 20B performs arithmetic operations by the circuits reconfigured by the configuration information, and outputs the data signals which is the arithmetic operation result outside. Note that the configuration information is configured by arithmetic operator data configured by truth tables of various arithmetic operators, a plurality of states, events which trigger the state changes, and control data representing the changes of states occurred thereby.

The arithmetic operator data is a plurality of pieces of truth table data respectively corresponding to arithmetic operation names such as an inverter, an AND arithmetic operation, an OR arithmetic operation, and the like.

The control data is the truth table data in which the type of the arithmetic operators and the data path between the plurality of MLUTs allotted with the arithmetic operators are defined together with the state changes. The control data includes state identification information, an arithmetic operator, arrangement/wiring information of arithmetic operators, truth table data configuring the state machine (which will be described with reference to FIG. 67), identification information of MLUT in which the truth table data of arithmetic operators is written in, and arrangement/wiring information of arithmetic operator resources.

[7.1.2] Configuration Control Section

The configuration control section 300 reads out the configuration information (arithmetic operator data and control data) from the cache section 400A, and writes the read out information in the MPLD 20A or 20B. Further, when there is no configuration information to be the writing-in target (here, the control data) in the cache section 400A, the configuration control section 300 supplies memory access instruction to the memory controller, so as to read out the configuration information (control data) stored in the main memory 500.

When one of the MPLD 20A or 20B is performing arithmetic operation by a reconfigured circuit, the other MPLD which is not performing the arithmetic operation is reconfigured by the configuration control section 300. Note that which arithmetic operator data and control data is to be written into MPL is scheduled by schedule information which will be described later. Accordingly, the configuration control section 300 refers to the schedule information, whereby the scheduled configuration information per bank unit is written into MPLD.

As described above, the configuration control section 300 reconfigures the MPLD 20A and 20B by the configuration information, and suitably switches the MPLD which executes the arithmetic operation between the MPLD which is reconfigured according to the schedule information, which enables series of arithmetic operations.

[7.3.1] Cache Section

As shown in FIG. 66, the cache sections 400A and 400B are configured by different cache memories. The cache section 400A and 400B are cache memories which are capable of reading out or writing in data independently, and are for example a SRAM. Accordingly, though not shown in FIG. 66, the cache sections 400A and 400B respectively include a memory cell array which retains data, a row address decoder and a column address decoder which read out data from the memory cell array or write in data, and surrounding circuits such as an amplifier, and the like.

The cache section 400A retains the arithmetic operator data among the configuration information, and the cache section 400B retains the control data among the configuration information. The arithmetic operator data is read out from the main memory 500 and is written into the cache section 400A at the time of initial operation of the semiconductor device 100. The arithmetic operator data is not read out from the main memory 500, but is read out from the cache section 400A at the time of reconfiguration of the MPLD 20A or 20B. The main memory 500 is configured by dynamic random access memory (DRAM), whereby the speed of reading out data is slow. Further, the control data specifies the output memory cell of MLUT regarding the data change, whereas the arithmetic operator data configures a large portion of the truth table data which is to be written into MLUT, and thus has larger data amount than the control data. Accordingly, at the time of reconfiguration of the MPLD 20A and 20B, the arithmetic operator data which has larger data amount than the control data 910 may be read out from the cache section 400A without the main memory access, whereby the reconfiguration time of the MPLD 20A or 20B may be reduced by retaining the arithmetic operator data in the cache section 400A.

The arithmetic operator data and the control data are separately stored in the cache section 400A or 400B, not as the same data but as the different data for the reconfiguration of the MPLD 20A and 20B, whereby operations of writing in the control data to the cache sections and of writing in the arithmetic operator data from the main memory 500 are not required, and the reconfiguration time of the MPLD 30A or 30B may be reduced.

Further, the cache section 400A is written in with the arithmetic operator data 905 at the time of initial operation of the semiconductor device 100, and thereafter, performs reading out operation. Accordingly, the writing in and reading out are not required to be executed at the same time, and the memory configuring the cache section 400A retaining the arithmetic operator data 905 may be SRAM not of a double-port but of a single-port.

[7.1.4] Details of Configuration Information

As described above, the cache sections 400A and 400B respectively are cache memories configured by the arithmetic operator data and the control data. Hereinbelow, the detailed examples of the arithmetic operator data and the control data will be described.

The arithmetic operator data has the following data structure.

A. Data structure of the arithmetic operator data
Header section
Arithmetic operator ID
The number of arithmetic operator MLUTs
Data section
Arithmetic operator MLUT information (compression data)

As described above, the arithmetic operator data is defined by the "arithmetic operator ID" which identifies the arithmetic operator and "the number of arithmetic operator MLUTs" which is the number of MLUTs required to implement the arithmetic operator, both structured in the header section. Further, the arithmetic operator MLUT information which is necessary for the arithmetic operator is defined by compression data in the data section.

The control data has the following data structure.

B. Data structure of the control data
Bank number:
Arithmetic operator arrangement information
Arithmetic operator ID
Row-column information
First row, column
Second row, column
. . .
Control circuit information
Header information
The number of control circuit MLUTs
Row, column at the start of control circuit
Data section
Control circuit MLUT information (compression data)

As described above, the control data includes "a bank number" which identifies "banks" being an MLUT to be reconfigured, the arithmetic operator ID to be arranged in the bank, and row-column information for each arithmetic operator ID so as to arrange the arithmetic operators to the "bank". Further, the control data defines the number of MLUTs configuring the control circuit and the matrix at which the control circuit in the "bank" is started as "row, column at the start of control circuit". Still further, the MLUT information required in the control circuit is defined as compression data.

The configuration control section 300 refers to the arithmetic operator ID included in the control data, reads out the corresponding arithmetic operator data, and writes the arithmetic operator MLUT information of the corresponding arithmetic operator data in the matrix of "row-column information" of the control data. Further, the configuration control section 300 refers to the control circuit information included in the control data, and writes the control circuit MLUT information in the "row, column at the start of control circuit". In this manner, the configuration control section 300 writes in the "arithmetic operator MLUT information" and the "control circuit MLUT information" for each bank, whereby the MPLDs 20A and 20B are reconfigured.

[7.1.5] Main Memory

The main memory 500 stores the arithmetic operator data 905 as configuration information, pieces of control data 910-1 to 910-N (N is an integer), profile information 970, static schedule information 975, a program 980, and a compile program 990. The main memory 500 is a DRAM. The memory controller 550 reads out data in the main memory 500, writes the same and performs the refreshment of DRAM.

Figure 67:
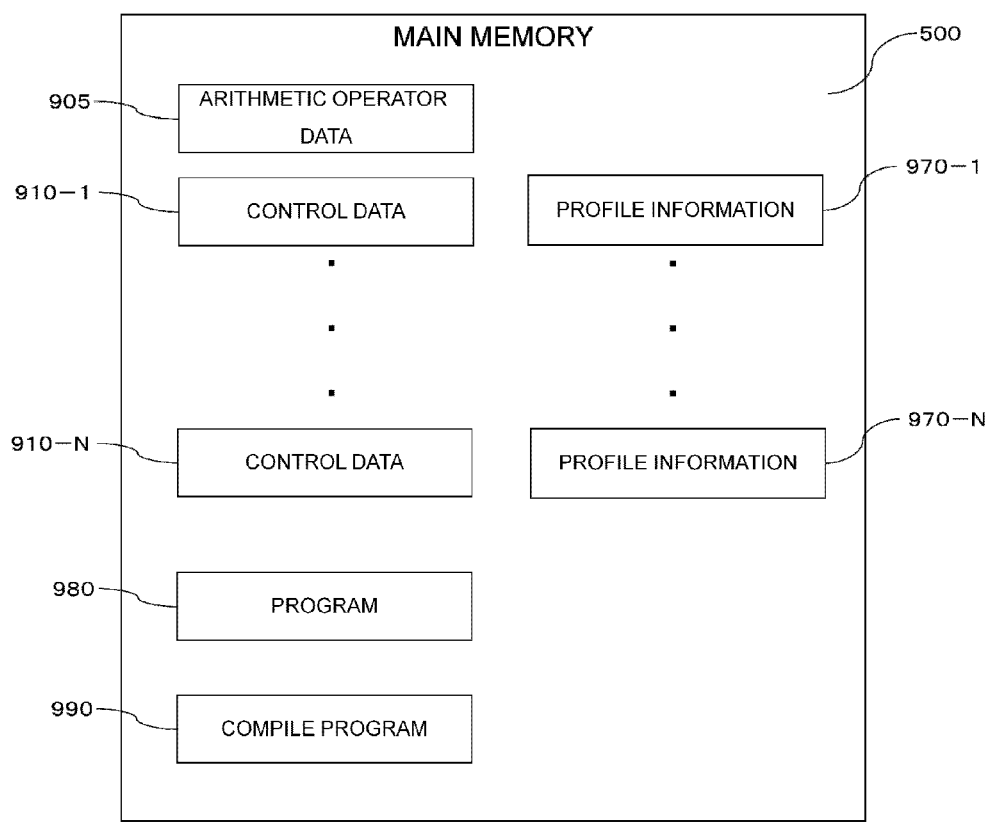
FIG. 67 is a view showing one example of a memory map of a main memory.

FIG. 67 is a view showing one example of a memory map of a main memory.

The program 980 is a program which makes the MPLDs 20A and 20B or the MPU 220 execute predetermined processing, and is a program coded to a program language such as C language. The MPU 220 executes the compile program 990, and the program 980 performs segmentation into circuit data having the size of MPLDs 20A and 20B, and generates the arithmetic operator data 905 and control data 910-1 to 910-N from each of the plurality of segmented pieces of circuit data.

[1.6] Profile Data

The pieces of profile information 970-1 to 970-N (N is an integer) is data obtained by analyzing a profile (or a history) such as dependency between the arithmetic operators, dependency data updates, data flow, lifetime of data, and is judged with the order of "priority of speculative execution" for each "bank" and is generated by the compile processing.

The profile information schedules the load of configuration information to the cache sections 400A and 400B from the main memory 500, and the load between the cache sections 400A, 400B and the MPLD 20A, 20B, whereby such loads are scheduled to be executed in parallel.

For example, the profile information defines the reconfiguration order between pieces of control data, such that the MPLD 20A is reconfigured by the control data 910-1, and then the MPLD 20B is reconfigured by the control data 910-2. Further, when the control data 910 defines the branch circuit, the profile information schedules which control data should be executed by the execution of the branch circuit.

The profile information 970-1 to 970-N is used by the configuration control section 300 (the later described scheduler in more detail). The data structure of the profile information will be described below.

C. Data structure of profile information
Header section
Type: static or dynamic
Number: the number of dynamic branches (0 is set when the type is static)
Data section
Value: checked by scheduler (encoded value)
Priority: priority of speculative execution
Bank number: execution bank number When the "type" of the header section is "static", the profile information is also referred to as static schedule information 975. The static schedule information 975 is information generated by operation combination with the profile information at the time of system reset. At the time of system reset, when the profile information as the static schedule information is read, the configuration control section (scheduler) 300 retains the information and performs speculative reconfiguration of the MPLD.

The "number of dynamic branches" of the header section shows the number of "banks" of the branch target at the time of dynamic branch. The "value" of the data section is the value of the condition branch. The "priority" of the data section means the surface in which the speculation execution is performed with priority. The bank number is the number of banks corresponding to the profile information. The configuration control section (scheduler) 300 judges whether the "value" of the condition branch estimated by the configuration control section (scheduler) 300 and the "value" of the condition branch actually executed by the MPL in the state machine configured in the part of the MPLD to be described later with reference to FIG. 69. The state machine outputs the judgment result to the configuration control section (scheduler) 300, whereby the configuration control section (scheduler) 300 may check the branch failure of the speculation execution.

When speculatively loading the next surface, the configuration control section (scheduler) 300 checks the value of the data section when the "type" of the read profile information is "static", and loads the bank. When the "type" of the read profile information is dynamic, the configuration control section (scheduler) 300 loads the "bank" having high "priority" in the data section. When the "bank" of the speculation load is the bank which is being reconfigured, the bank is checked whether the dynamic branch is generated therein based on the "priority" value in the data section, whether the bank is suitable or another bank should be loaded is judged, and loads the suitable bank from the main memory 500 or the cache sections 400A and 400B, to executed the same. In this manner, the configuration control section (scheduler) 300 operates speculative reconfiguration of the MPLD by the "priority" of the profile information.

The variable retaining section 25 is a storage section which retains variables having a long lifetime straddling between the MPLDs 20A and 20B. The variable retaining section 25 retains the variables having long lifetime (for example, global variables, and the like), whereby the MPLDs 20A and 20B are not required to reconfigure the MLUT retaining the variables, whereby the MLUT may be effectively used.

Figure 68:
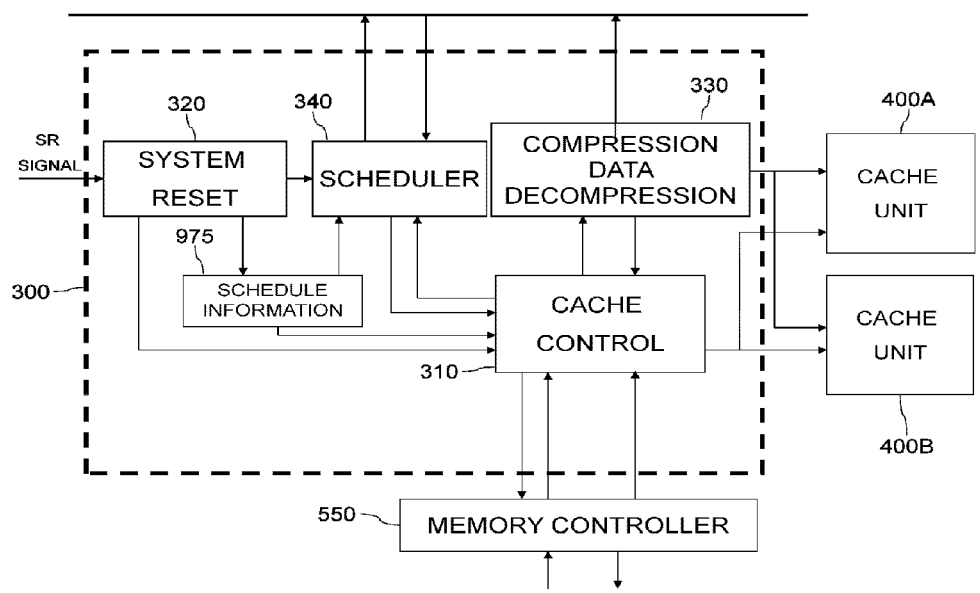
FIG. 68 is a detailed block diagram of a configuration control section.

FIG. 68 is a detailed block diagram of a configuration control section. The configuration control section 300 has functions shown by the cache control 310, the system reset 320, the compression data decompression 330, and the scheduler 340. These functions are realized by the circuit inside the configuration control section 300 or the configuration control section 300 executing a program. Herein below, each function will be described.

The cache control 310 is a function to input and output data to and from the cache sections 400A, 400B, the main memory 500, and the MPLDs 20A, 20B by the configuration control section 300.

The system reset 320 is a function of, when the configuration control section 300 receives system reset (SR) signal from outside, instructing the cache control 310 to execute an initial operation. The initial operation is an operation to read out the arithmetic operator data 905 and the control data 910 from the main memory 500 and write the same into the MPLDs 20A, 20B and to read out the arithmetic operator data 905 and the control data 910 according to the static schedule information 975.

Te compression data decompression 330 is a function of decompressing the MLUT information of the compressed arithmetic operator data 905 and control data 910 and outputting the decompressed data to the MPLDs 20A and 20B, since the MLUT information of the arithmetic operator data 905 and the control data 910 is compressed.

The MLUT information of the arithmetic operator data 905 and control data 910 may be stored in the main memory 500 in a form compressed by the compile program 990. This is for reducing the data amount of the main memory 50 and the cache sections 400A, 400B, and for reducing the storage region to retain the arithmetic operator data 905 and control data 910 in the cache sections 400A, 400B.

Data amount to reconfigure is larger in the MPLDs 20A and 20B compared to the PLD of the ALM matrix type. When the main memory 500 is configured by DRAM, the data transmission speed between the main memory 500 and the cache sections 400A, 400B may be a restriction for reconfiguration time. Accordingly, the MLUT information of the arithmetic operator data 905 and control data 910 which is the configuration information may be compressed and stored in the main memory, and may be transmitted to the cache sections 400A, 400B, whereby the reconfiguration time by the MPLD may be reduced. Further, a large part of the configuration information of the MPLDs 20A, 20B is the arithmetic operator data 905. Although retaining the arithmetic operator data 905 in the cache section 400A to reduce reconfiguration time of MPLD has already been described, the arithmetic operator data 905 may be compressed and retained in the cache section 400A, whereby the arithmetic operator data 905 can be retained in the cache section 400A having a smaller storage capacity than the main memory 500.

Further, the data compression has not conventionally been used for compressing instructions in the technical field of processors. The MLUT information may entirely be configured by the truth table data, whereby when the instructions on programs are converted to the arithmetic operator data, the data compression is made possible.

Various techniques may be applicable for compression and decompression. As the applicable techniques for compression and decompression, LZS may be cited, for example.

The scheduler 340 reads out the profile information in order, judges the priority order of banks to reconfigure the MPLD, and judges the order of configuration information to write into the MPLD. The scheduler 340 reads out the configuration information (control data) from the main memory, or reads out the configuration information (arithmetic operator information or control data) from the cache sections 400A, 400B according to the priority order defined by the profile information, and reconfigures the MPLD. When a failure output of speculation execution is received from the state machine as a result of the MPLD reconfiguration according to the profile information, the scheduler 340 reads out the control data which is to be the correct branch destination from the cache sections 400A, 400B or the main memory 500. Note that even when the speculation execution failed as in this case, the truth table data of the control data to be read is compressed, and the arithmetic operator data is retained in the cache section 400A. Accordingly, the time to read out control data of the branch destination may be reduced, whereby the delay by the reconfiguration time at the time of speculation execution failure may be shortened.

Note that the state machine may be realized by the configuration information on MPLD. The state machine has at least two functions. One is a state machine to operate as a control circuit for controlling buses such as the bus of MPU 220 and for controlling communication packet processing transmitted from a communication section (which is not shown in FIG. 68. The other is a state machine to operate a control circuit for controlling the data flow order in the arithmetic operation procedure. Note that the state machine is configured in the MPLD at the time of system restart by the static schedule information 975.

[7.2] Configuration Example of MPLD

Figure 69:
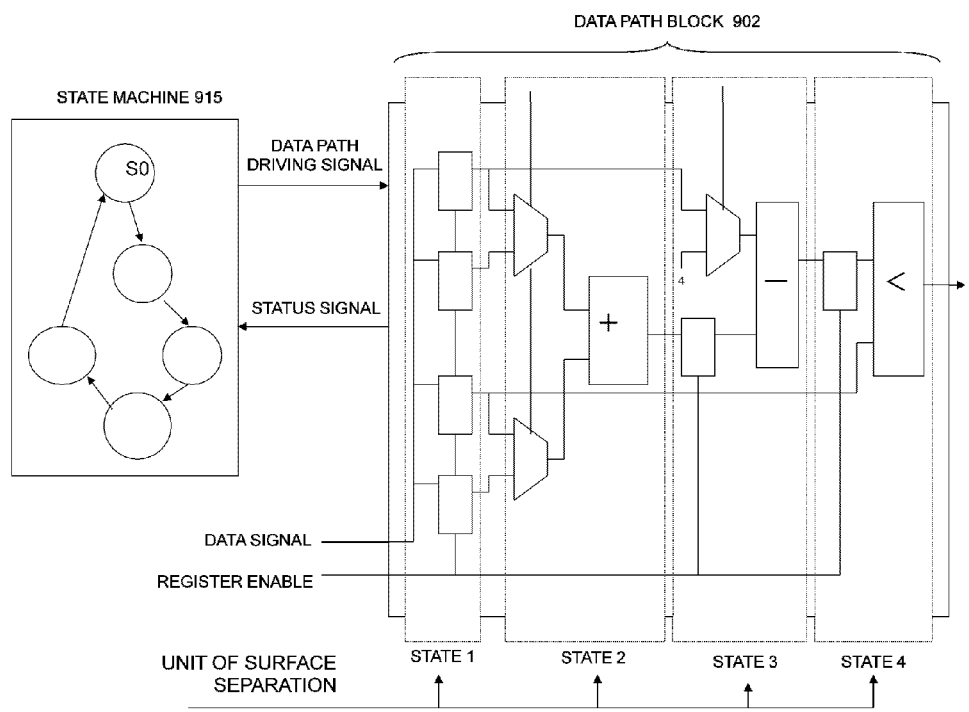
FIG. 69 is a view showing one example of a data path block and a state machine, configured by the MPLD.

FIG. 69 is a view showing one example of a data path block and a state machine, configured by the MPLD. The data path block 902 shows the circuit block realized by the arithmetic operator shown in the arithmetic operator data 905 being allotted to the MLUT in the MPLDs 20A, 20B, and the data path thereof. The state identifies the circuit configuration configurable in each MPLD per each bank. The state is generated in compliance with the granularity of the MPLDs 20A and 20B when the MPU 220 executes the compile program 990. Each state is allotted with an order by the state schedule information 975. Further, the states 1-4 specifies each of the storage regions per bank unit of the MPLD 20A. Alternatively, a plurality of MPLDs may be specified in a time line in such a manner that the state 1 configures the MPLD 20A, the state 2 configures the MPLD 20B, the state 3 configures the MPLD 20A, and the state 4 configures the MPLD 20B. The reconfiguration of MPLDs is repeated for states 1 to 4 in this manner, whereby a pipeline having a number of stages may be processed by a small scaled MPLD.

The state machine 915 administrates the starting time of state activation and the status of the states. The state machine 915 outputs data path driving signals to the data path block, whereby the state is activated, and receives status signals, whereby the states are administrated.

S0 state returns to the present state finally after the supervision of execution trigger from outside and the present processing, and sets the control data to be executed next. Thus, the scheduler 940 can check the branch failure of the speculation execution.

[7.3] Operation Processing Flow of Semiconductor Device

Next, the operation processing flow of the semiconductor device will be described.

Figure 70:
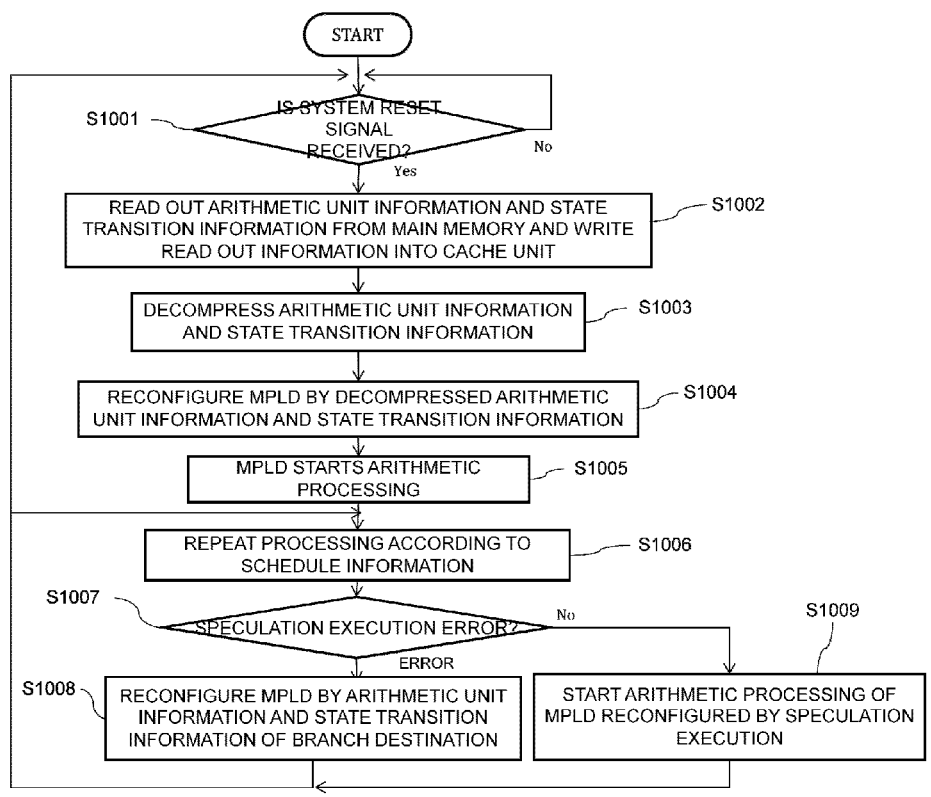
FIG. 70 is a view showing one example of a process flow on a speculation execution of the semiconductor device.

FIG. 70 is a view showing one example of a process flow on a speculation execution of the semiconductor device. First, the configuration control section 300 judges whether the system reset signal is received or not (S1001). When the system reset signal is received (S1001: YES), the configuration control section 300 reads out the arithmetic operator data 905 and the control data 910 from the main memory 500, and writes the same in the cache sections 400A and 400B (S1002). The configuration control section 300 reads out the arithmetic operator data 905 and the control data 910 retained in the cache sections 400A and 400B, and decompresses the same (S1003). The configuration control section 300 reconfigures the MPLDs 20A and 20B by the decompressed arithmetic operator data 905 and the control data 910 (S1004). The MPLDs 20A and 20B start arithmetic operations according to the data path driving signal of the state machine (S1005). The configuration control section 300 repeats the processing of S1003-S1005 according to the static schedule information 975, and judges whether the speculation execution has failed (S1006). When the speculation execution failed, the failure is notified from the state machine. When the speculation is failed (S1007 ERROR), the MPLD in which the state machine notifying the failure of the speculation execution operates is reconfigured by the arithmetic operator data 905 including the branch destination circuit and the control data 910 (S1008).

When the speculation execution succeeded (S1007 NO), the arithmetic operation of the MPLD reconfigured by the speculation execution is started (S1009).

Figure 71:
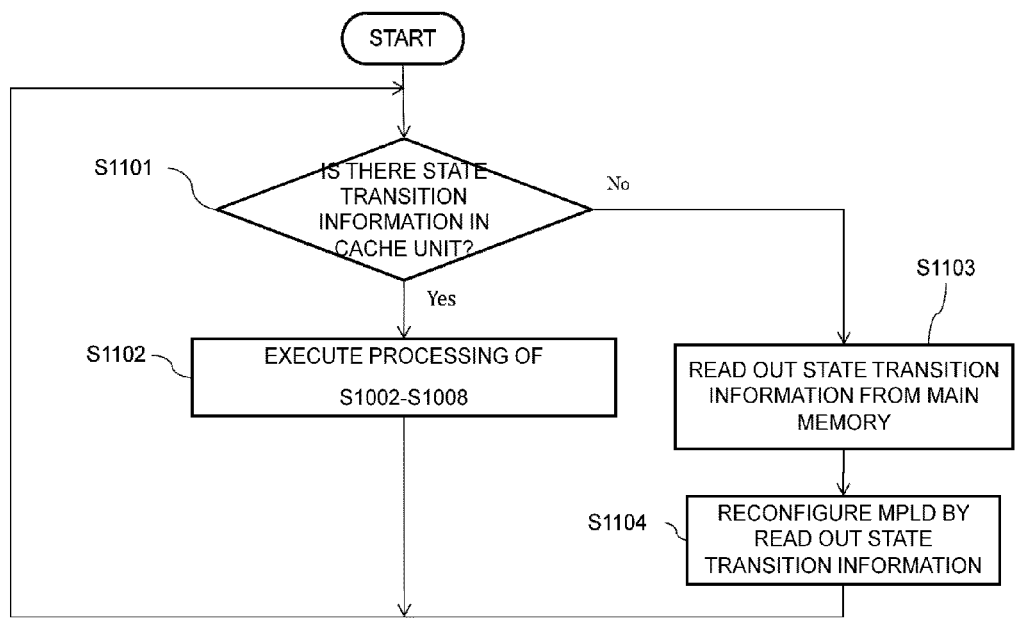
FIG. 71 is a process flow on a cache control of the semiconductor device.

FIG. 71 is a process flow on a cache control of the semiconductor device. The configuration control section 300 judges whether there is control data 910 in the cache section 400B according to the static schedule information 975 (S1101). When the control data 910 specified by the static schedule information 975 is retained in the cache section 400B (S1101 YES), the processing of S1002-S1008 is performed (S1102). When the control data 910 specified by the static schedule information 975 is not retained in the cache section 400B (S1101 NO), the configuration control section 300 reads out the control data 910 from the main memory 500 (S1103), and reconfigures the MPLD by the read out control data 910 (S1104).

What is claimed is:

1. A semiconductor device, comprising:
    a first logic section and a second logic section each including a plurality of storage sections, each storage section including (i) an address decoder which decodes a memory operation address inputted from a first address line or a logic operation address inputted from a second address line and outputs a word selection signal to a word line, and (ii) a plurality of storage elements being connected to the word line and a data line, which store data configuring a truth table defining a logic operation or connection relation, and are connected to the data line inputting and outputting the data by the word selection signal inputted from the word line; and
    an arithmetic processing section which includes (i) a first input/output section connecting the first address line of the storage sections included in the first logic section and the data line, (ii) a second input/output section connecting the second address line of the storage sections included in the second logic section, and (iii) a control section which performs control to output the memory operation address and data to the first input/output section and performs control to output the logic operation address and receive the data to and from the second input/output section.

2. The semiconductor device according to claim 1, wherein the logic operation address line of the storage sections included in the first logic section and the second logic section is respectively connected to the data line of the other storage sections, and the data line of the storage sections is respectively connected to the logic operation address line of the other storage sections.

3. The semiconductor device according to claim 1, wherein the plurality of storage sections included in the first logic section and the second logic section are reconfigurable.

4. The semiconductor device according to claim 1, wherein the first logic section and the second logic section respectively include a storage section decoder which selects the plurality of storage sections.

5. The semiconductor device according to claim 1, further comprising an input/output section which is connected to a storage device storing data that configures the truth table.

6. The semiconductor device according to claim 1, further comprising the storage device storing the data that configures the truth table.

7. The semiconductor device according to claim 1, wherein a physical number of wiring layers is four or less.

8. The semiconductor device according to claim 1, wherein the number of the storage sections included in the first logic section and the number of the storage sections included in the second logic section are the same.

9. The semiconductor device according to claim 1, wherein the address decoder includes a row decoder and a column decoder,
wherein the row decoder decodes an address inputted from the M (N is an integer equal to five or less) number of address lines, and outputs the word selection signal to the word line,
and wherein the column decoder decodes an address inputted from the L (L is an integer of N−5) number of address lines and outputs a data selection signal which selects the N number of data lines outputted from the plurality of storage elements.

10. A semiconductor device, comprising:
a plurality of programmable logic sections, each including a plurality of memory cell units, and operating as a logic element or a connection element when truth table data is written into the memory cell unit;
a cache section which retains plurality of pieces of configuration information, each piece being the pieces of the truth table data; and
a configuration control section which reconfigures a second programmable logic section among the plurality of programmable sections by second configuration information configuring a branch destination circuit of a branch logic, when a first programmable logic section among the plurality of programmable sections is reconfigured by first configuration information configuring the branch logic.

11. The semiconductor device according to claim 10, wherein the cache section separately retains arithmetic operator data which is the truth table data showing an arithmetic operator and control data which is the truth table data showing a state change,
wherein the configuration control section reads out the control data and the arithmetic operator data including the arithmetic operator shown by the state change of the control data respectively from the cache section, and reconfigures the programmable logic section.

12. The semiconductor device according to claim 10, further comprising a storage section which stores the control data retained by the cache section,
wherein the configuration control section reads out the control data to reconfigure the programmable logic section from the storage section and stores the read out control data in the cache section, after the control data retained by the cache section is read out.

13. The semiconductor device according to claim 10, wherein the truth table data of the control data stored in the storage section is compressed,
wherein the cache section retains the compressed truth table data,
and wherein the configuration control section decompresses the compressed truth table data, and reconfigures the programmable logic section by the decompressed truth table data.

14. The semiconductor device according to claim 10, wherein when a first programmable logic section among the plurality of programmable logic sections is reconfigured by third configuration information configuring a branch logic, and when fourth configuration information does not configure a branch destination circuit of the branch logic of the third configuration information based on an arithmetic operation result of a second programmable logic section configured by the fourth configuration information which is estimated as the branch destination circuit of the branch logic of the third configuration information, the configuration control section reconfigures the programmable logic sections other than the second programmable logic section by fifth configuration information including a branch destination of the branch logic.

* * * * *